United States Patent [19]

Williamson et al.

[11] Patent Number: 5,396,194
[45] Date of Patent: Mar. 7, 1995

[54] AUDIO FREQUENCY POWER AMPLIFIERS

[75] Inventors: Robert C. Williamson, Everett; James J. Croft, III, Seattle, both of Wash.

[73] Assignee: Carver Corporation, Lynnwood, Wash.

[21] Appl. No.: 154,739

[22] Filed: Nov. 19, 1993

[51] Int. Cl.⁶ ............................................. H03F 3/20
[52] U.S. Cl. .................................... 330/297; 330/202
[58] Field of Search ............. 330/10, 202, 203, 207 A, 330/251, 297

[56] References Cited

U.S. PATENT DOCUMENTS

| | | |
|---|---|---|
| 2,776,382 | 1/1957 | Jensen . |
| 3,142,807 | 7/1964 | Sharma . |
| 3,319,175 | 5/1967 | Dryden . |
| 3,426,290 | 2/1969 | Jensen . |
| 3,483,425 | 12/1969 | Yanishevsky . |
| 3,542,953 | 11/1970 | Munch, Jr. . |
| 3,585,517 | 6/1971 | Herbert . |
| 3,832,643 | 8/1974 | Van Heyningen et al. . |
| 3,961,280 | 6/1976 | Sampei . |
| 4,015,213 | 3/1977 | Hamada . |
| 4,054,843 | 10/1977 | Hamada . |
| 4,087,759 | 5/1978 | Iwamatsu . |
| 4,115,739 | 9/1978 | Sano et al. . |
| 4,217,632 | 8/1980 | Bardos et al. . |
| 4,218,660 | 8/1980 | Carver . |
| 4,409,559 | 10/1983 | Amada et al. . |
| 4,472,687 | 9/1984 | Kashiwagi et al. . |
| 4,484,150 | 11/1984 | Carver . |
| 4,507,619 | 3/1985 | Dijkstra et al. . |
| 4,808,946 | 2/1989 | Carver et al. . |
| 5,075,634 | 12/1991 | French . |
| 5,200,711 | 4/1993 | Andersson et al. . |

FOREIGN PATENT DOCUMENTS

| | | | |
|---|---|---|---|
| 2552600 | 3/1985 | France . | |
| 1918618 | 4/1969 | Germany . | |
| 2407629A1 | 8/1975 | Germany . | |
| 2542171 | 9/1975 | Germany . | |
| 49-118261 | 4/1976 | Japan . | |
| 52-4757 | 1/1977 | Japan . | |
| 51-35530 | 10/1977 | Japan . | |
| 51-35531 | 10/1977 | Japan . | |
| 53-94162 | 8/1978 | Japan . | |
| 56-58303 | 5/1981 | Japan . | |
| 89105 | 7/1981 | Japan | 330/297 |
| 57-23309 | 2/1982 | Japan . | |
| 57-23310 | 2/1982 | Japan . | |
| 57-140008 | 8/1982 | Japan . | |
| 58-14606 | 1/1983 | Japan . | |
| 58-105606 | 6/1983 | Japan . | |
| 58-119209 | 7/1983 | Japan . | |
| 59-17710 | 1/1984 | Japan . | |
| 1-147907 | 6/1989 | Japan . | |
| 559362 | 7/1977 | U.S.S.R. . | |

OTHER PUBLICATIONS

For the Engineer, "An Amplifier With A Tracking Power Supply" by V. M. Kibakin, Nov. 5, 1988.
A High-Efficiency Audio Power Amplifier, Audio Engineering Society Preprint, Oct. 30–Nov. 2, 1981.
The Class BD High-Efficiency RF Power Amplifier, by Frederick H. Raab, Journal of Solid-State Circuits, vol. SC–12, Jun. 1977.

*Primary Examiner*—James B. Mullins
*Attorney, Agent, or Firm*—Hughes, Multer & Schacht

[57] ABSTRACT

An audio frequency amplifier having a switching converter comprising source and sink rectifiers configured for sourcing and sinking current, in which the source and sink supply voltages of the rectifiers track the audio frequency signal being amplified. The amplifier has a circuit or element for discharging the output capacitors of the source and sink rectifier as necessary to prevent floating of the source and sink supply voltages. The discharging element can be a locking capacitor or one or more Zener diodes connected across the source and sink supply voltages. The discharge circuit can be one or more switching transistors connected across the freewheeling diodes of the source and sink rectifiers to actively pull the source and sink voltages down to discharge the output capacitors and thereby prevent floating. Low voltage rated parts can be used in the output stage amplifier, and in certain configurations a high voltage low current preamplifier stage can be eliminated.

50 Claims, 30 Drawing Sheets

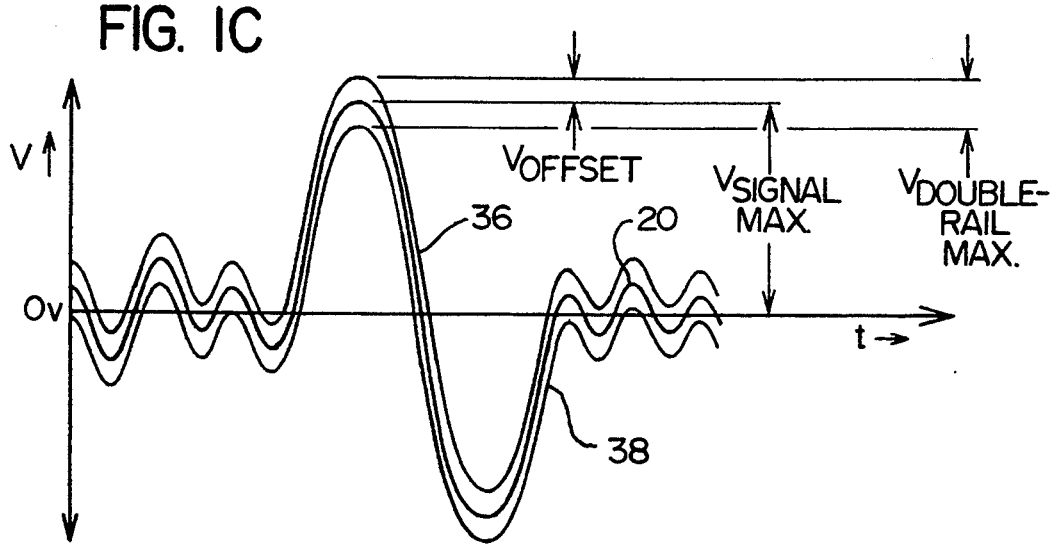
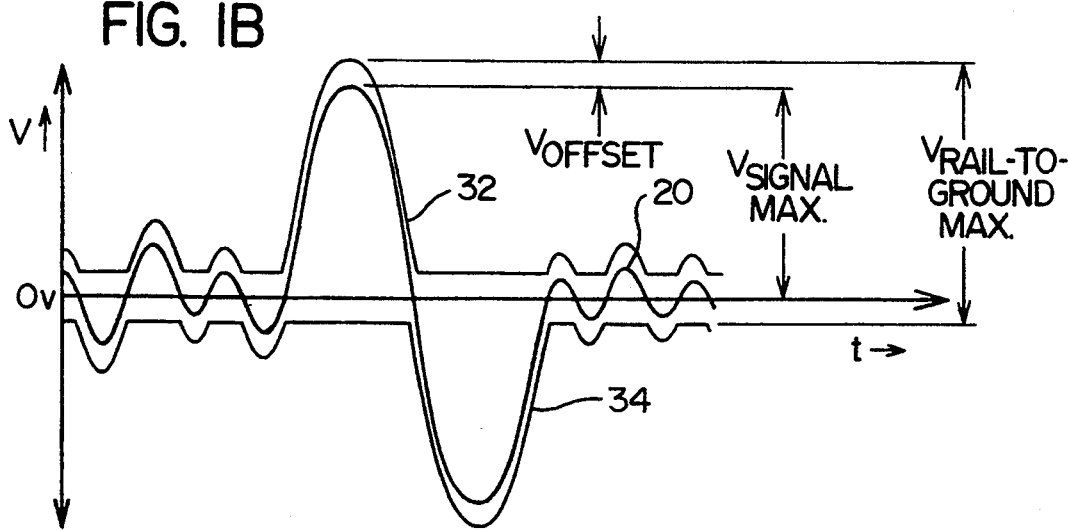
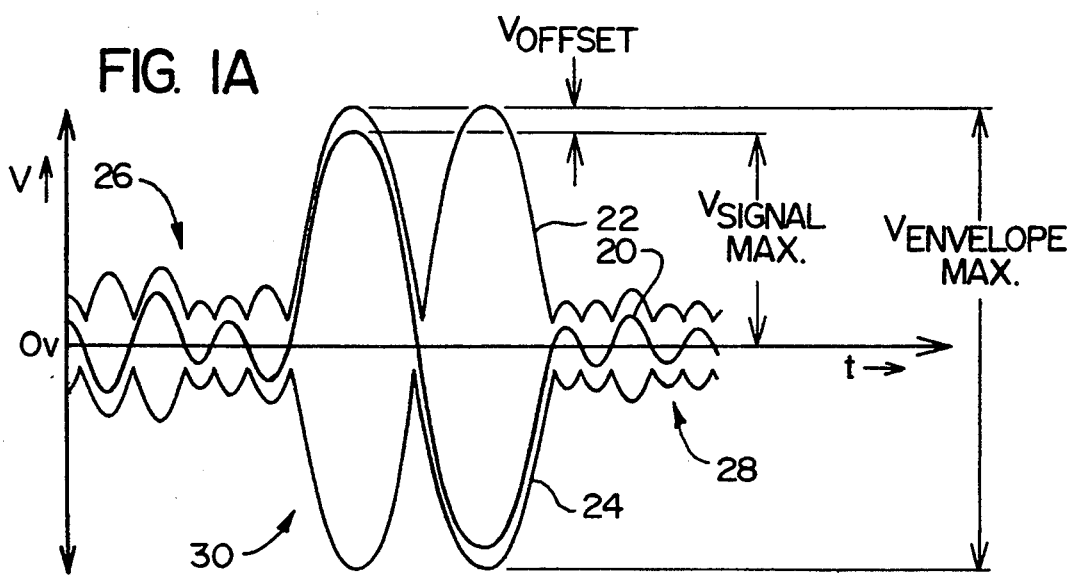

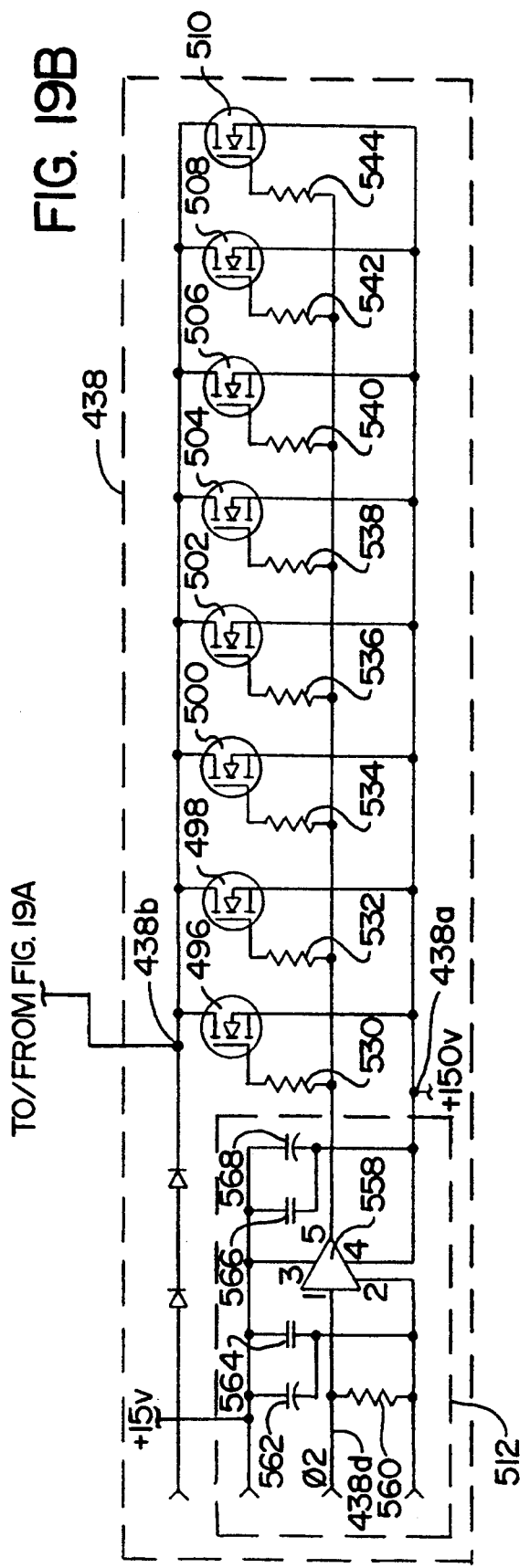

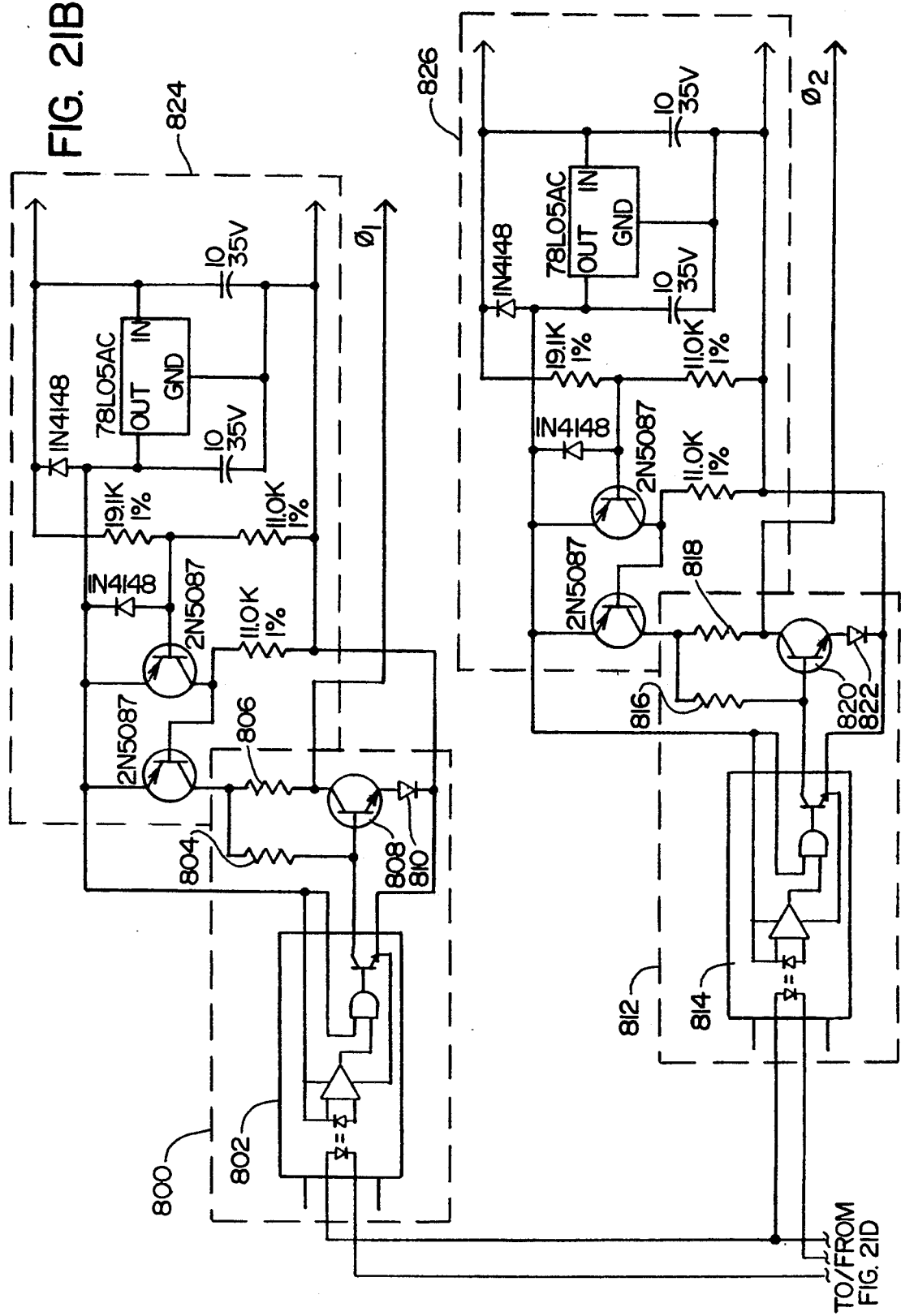

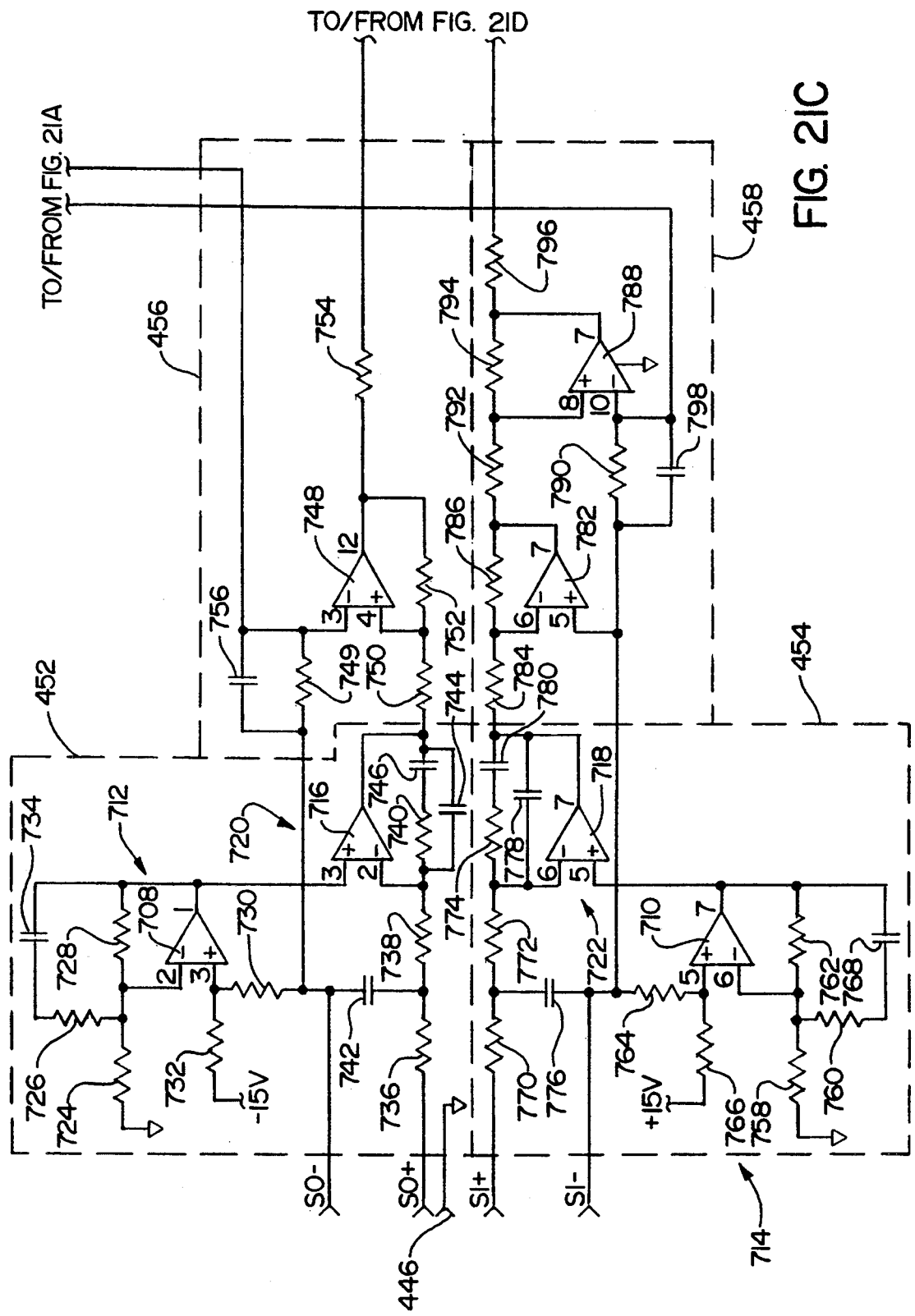

AUDIO FREQUENCY POWER AMPLIFIERS

TECHNICAL FIELD

The present invention relates to the amplification of audio frequency signals and, more particularly, to high efficiency audio frequency power amplifiers that employ adaptive power supplies to source and sink current to a push-pull amplifier output stage.

BACKGROUND OF THE INVENTION

To reduce dissipation losses in the output stage, most audio frequency amplifiers comprise a class B or AB amplifier. A conventional class B or AB amplifier comprises a pair of emitter-coupled output transistors configured in a push-pull arrangement. The audio frequency signal is applied to the bases of these output transistors and the amplified audio frequency signal is present at the emitters thereof. In a conventional push-pull amplifier, the collector of one of the output transistors is connected to a fixed positive DC voltage to provide a current source and the collector of the other of the output transistors is connected to a fixed negative DC voltage to provide a current sink. The positive and negative DC voltages are commonly referred to as the source and sink voltages, respectively.

With a reactive load, the entire fixed voltage is present across the amplifying transistor of a class B or AB amplifier when current flows to the load, yielding high dissipation losses. These losses are particularly high with high dynamic range signals such as music signals. Accordingly, while more efficient than a pure class A amplifier, class B and AB amplifiers still exhibit significant dissipation losses with resistive loads and exhibit considerably greater losses with reactive loads. At the high power levels of modern audio amplifiers, these dissipation losses require the use of numerous expensive high power semiconductors in parallel and also that extensive steps be taken to cool the output transistors.

To obtain higher efficiencies, class D amplifiers have also been proposed as audio amplifiers. Class D amplifiers comprise a power transistor, a low pass filter, and a freewheeling diode or rectifier in parallel with the low pass filter. The power transistor is switched on and off according to a high frequency square wave signal the pulse width of which is modulated according to the audio frequency signal to be amplified. The filter then recovers the audio frequency signal by filtering off the high frequency square wave signal. The class D amplifier achieves high efficiencies by delivering current only when substantially zero volts are present across the power transistors.

While significantly more efficient than a class B or AB amplifier, a class D amplifier has high distortion that cannot be easily be corrected with negative feedback because of the phase shift introduced by the low pass filter. Further, the low pass filter tends to interact with the load in an undesirable fashion. Also, because of the relatively high frequencies involved, class D amplifiers are subject to radiation problems. Finally, class D amplifiers exhibit poor power supply rejection and thus are highly susceptible to power supply disturbances. For these and other reasons, class D amplifiers have not been used in commercial audio amplifiers.

Two other classes of high efficiency audio frequency amplifiers have been proposed to increase the efficiency of output transistors arranged in a push-pull configuration. These amplifiers are referred to as class G and class BD amplifiers and employ adaptive power supplies for generating source and sink voltages for a push-pull amplifier. These adaptive power supplies generate source and sink voltages that increase and decrease as the audio frequency signal increases and decreases. The basic idea with these amplifiers is to provide high voltage to the push-pull amplifier only when the audio frequency signal is high. As an audio frequency signal developed from a musical source is normally relatively low with infrequent high bursts, class G and BD amplifiers used as audio amplifiers normally maintain the voltage across the power transistors at a low level, thereby greatly reducing the average power dissipation of the output transistors.

A class G amplifier normally comprises a push-pull amplifier and a stepped power supply that generates source and sink voltages that are increased and decreased in two or three discrete steps as the power requirement of the signal being amplified increases and decreases. Such an amplifier is disclosed, for example, in U.S. Pat. No. 4,484,150 to Carver and U.S. Pat. No. 3,961,280 to Sampei.

A class BD amplifier conventionally comprises a pair of highly efficient class D amplifiers to provide signal tracking source and sink voltages to a push-pull amplifier. Class BD amplifiers are generally discussed in the following articles: (a) *The Class BD High-Efficiency RF Power Amplifier* dated June 1977 and written by Frederick H. Raab; and (b) *An Amplifier With A Tracking Power Supply* dated Nov. 5, 1973, and written by V.M. Kibakin.

The present invention is particularly useful when implemented in the context of amplifiers containing tracking power supplies. Tracking power supplies can be classified as envelope trackers, rail-to-ground trackers, and rail-to-rail trackers. The present invention may be used to advantage in each of these configurations, but is of particular importance when used with rail-to-rail trackers, as will be discussed in detail below.

Exemplary envelope trackers are disclosed in U.S. Pat. No. 3,426,290 issued Feb. 4, 1969 to Jensen, U.S. Pat. No. 4,218,660 issued Aug. 19, 1980 to Carver, and, more recently, U.S. Pat. No. 5,075,634 issued Dec. 24, 1991 to French.

Rail-to-ground tracking power supplies are disclosed in U.S. Pat. No. 4,054,843 issued Oct. 18, 1977 to Hamada, U.S. Pat. No. 4,409,559 issued Oct. 11, 1983 to Amada, an article published by the Audio Engineering Society in 1981 entitled A HIGH EFFICIENCY AUDIO POWER AMPLIFIER (Nakagaki and Amada), and U.S. Pat. No. 4,507,619 issued Mar. 26, 1985 to Dijkstra.

Rail-to-rail tracking power supplies are disclosed in U.S. Pat. No. 4,087,759 issued May 2, 1978 to Iwamatsu, U.S. Pat. No. 4,472,687 issued Sep. 18, 1984 to Kashiwagi et al., and U.S. Pat. No. 5,200,711 issued Apr. 6, 1993 to Andersson et al.

In an amplifier having any one of these three types of tracking power supplies, the collector-emitter voltage across the amplifying transistor will ideally remain substantially constant at a low value. The basic advantage of all types of tracking power supplies is thus that dissipation losses in the amplifying transistor are reduced. Additionally, in tracking power supplies, dissipation losses of the amplifying device are ideally kept low for both resistive and reactive loads.

A tracking power supply in a class BD amplifier will thus in general reduce by varying degrees the dissipation of the output transistors relative to the dissipation of the output transistors in a pure class B or AB amplifier. Rail-to-rail tracking power supplies are theoretically the most efficient, while envelope tracking power supplies are the lease efficient of the three types of tracking power supplies. Rail-to-ground and rail-to-rail tracking power supplies will also have the additional advantage of reducing the voltage rating requirements of the output transistors.

As mentioned, in theory the most efficient of the various amplifier configurations having tracking power supplies is the rail-to-rail tracking power supply. However, despite the potential advantages theoretically obtainable by using a rail-to-rail tracking power supply, no commercially available amplifier exists that uses a rail-to-rail tracking power supply as described above.

OBJECTS OF THE INVENTION

From the foregoing, it should be apparent that a primary object of the present invention is to obtain a design for a highly efficient audio frequency power amplifier having a tracking power supply.

Another more specific object of the present invention is to obtain an audio frequency amplifier having a favorable mix of the following characteristics:
a. low distortion;
b. low thermal dissipation;
c. light weight;
d. high power
e. allows a rail-to-rail tracking amplifier to be commercially viable
f. allows elimination of a high voltage preamplifier; and
g. low manufacturing costs through the use of low voltage components having a relatively small safe operation area throughout the output stage.

Other objects of the present invention will become apparent from the following detailed description of the invention.

SUMMARY OF THE INVENTION

The Applicants have recognized that the prior art amplifiers having signal tracking powers supplies do not precisely track the signal being amplified; instead, the source and sink supply voltages deviate from their theoretical levels under the following conditions: (a) high frequency audio signals; (b) open circuit or light loads; (c) certain reactive loads; (d) assymetric signals; and/or (e) high offset voltages. This deviation of the actual source and sink supply voltages from the ideal source and sink voltages of a tracking power supply will be referred to herein as floating.

The Applicants have further recognized that this floating occurs because, under the conditions described above, insufficient current flows through the amplifying transistor to pull the supply voltage towards the reference when the audio frequency signal being tracked moves towards the reference. In particular, a class BD amplifier comprises a class B or AB output stage and a power supply containing source and sink output filters, each output filter comprising an inductor and an output capacitor. When little or no current is being drawn by the output stage, no current flows back through the inductors of the output filters to discharge the output capacitors. The source and sink voltages thus tend to hang or float until the output devices begin to draw current to discharge the output capacitors.

For example, with an inductive load, the current through the conducting transistor lags the voltage. If the audio frequency signal goes very high and then drops quickly, the source signal voltage will go high following the audio frequency signal but will not be able to drop until the current flows a short time later. In the meantime, if the audio frequency signal crosses zero and goes far negative, the separately controlled sink supply voltage will track the audio frequency signal far below zero. The difference between the floating source supply voltage and the plunging sink supply voltage can become very large, and this large voltage difference can last from one cycle of the audio frequency signal to the next cycle thereof.

The large voltage across the output stage caused by floating can result in high dissipative losses in the output devices and thus requires high power transistors with a large safe operation area. The large voltages that can momentarily develop across the amplifier output stage also require that the transistors have a high breakdown voltage. Without high dissipative capacity and high breakdown voltage, the likelihood that the output devices will fail under the conditions during which floating occurs is greatly increased.

The prior art has failed to recognize the problems caused by floating because the overall efficiencies of an amplifier having a tracking power supply are significantly greater than an amplifier in which the amplifier generates fixed source and sink voltages. Accordingly, floating has not been perceived as a problem.

However, as will be described in detail below, the Applicants have recognized that significant, unexpected advantages could be obtained by eliminating the floating described above. The present invention is accordingly an audio frequency amplifier comprising a signal tracking power supply having at least one output filter and further comprising discharge means for discharging an output capacitor of the power supply output filter, thereby ensuring that the source supply voltage follows the audio frequency signal back down and/or that the sink supply voltage follows the audio frequency signal back up after the slope of the audio frequency signal changes signs.

For any tracking power supply, these discharge means can comprise a discharge transistor in parallel with a freewheeling diode of a class D amplifier forming at least part of the tracking power supply. In relatively low power applications, these transistors can be MOSFETs having integral rectifiers that can be entirely substituted for the freewheeling diodes. Such discharge transistors are driven by a signal related to the signal that drives the switching transistors of the tracking power supply. For a rail-to-rail tracking power supply, the discharge transistors are driven by a signal that is the inverse of the signal driving the switching transistors. Accordingly, the discharge transistors provide a path for discharging the output capacitors and thereby drive the source and sink supply voltages in the appropriate direction to eliminate floating.

For a rail-to-rail tracking power supply, the discharge means preferably comprises a locking capacitor connected between the source and sink supply voltages. The locking capacitor causes current to flow through the filter inductor to discharge the output capacitors as necessary to maintain a fixed voltage difference between the source and sink supply voltages. Thus, in the case where the audio frequency signal goes high and drops quickly, the source supply voltage will drop with the audio frequency signal because the sink supply voltage is being driven down and the source supply voltage is tied to the sink supply voltage. A Zener diode connected between the source and sink supply voltages will similarly lock these voltages together and can be used in combination with a locking capacitor to provide extra protection for the output devices. Tying the source and sink supply voltages together in this manner will eliminate the floating described above.

The discharge means can alternatively comprise a pair of Zener diodes, one connected between the source supply voltage and the output voltage and the other connected between the sink supply voltage and the output voltage. The source and sink voltages will be tied together and floating will be eliminated.

In relatively low power applications, the discharge means can comprise Zener diodes or locking capacitors that prevent the difference between the source and sink supply voltages from exceeding a predetermined value that equals approximately one full rail plus once or twice the offset voltage. If the sum of one full rail plus once or twice the offset voltage is less than, for example, 50 volts, output devices rated for use at 50 volts may be used without the possibility that floating will cause excessive voltages across the output devices. This 50 volt output device rating allows the use of relatively inexpensive MOSFETs with high current sourcing capabilities to be used as output devices.

The discharge means can also comprise an adaptive bias circuit for increasing the bias current whenever floating occurs or is likely to occur to ensure that sufficient current flows through the non-conducting transistor to discharge the output capacitors and thus force the source and sink supply voltages in the appropriate direction as the slope of the audio frequency signal changes. Such an adaptive bias circuit will minimize the dissipation caused by the bias current and is thus much more efficient than an amplifier having a continuous high bias current.

Two or more of the above-discussed discharge means can be utilized in a single amplifier. For example, a Zener diode can be placed in parallel across a locking capacitor to provide an additional guarantee that the source and supply voltages will not float.

Once the discharge means are provided to guarantee that the source and sink supply voltages will not float, the Applicant recognized that truly low voltage devices can be used in the output stage of a rail-to-rail tracking power supply and, to a lesser extent, of a rail-to-ground tracking power supply.

Another aspect of the invention present invention is the provision of a high power audio frequency amplifier comprising a tracking power supply and an output stage comprising only two high current, low voltage output devices arranged in a push-pull configuration. The use of two output devices substantially reduces the circuit complexity of the output stage because without the use of parallel output devices there is no need to match output devices. Problems due to notch discontinuities (transconductance variance) and uneven sharing of load current are therefore eliminated.

The Applicants have further recognized that the elimination of floating renders practical the substitution of low voltage power MOSFETs for bipolar devices in the amplifier output stage. Although they have long been available, high voltage high current MOSFETs are exceedingly expensive and have not heretofore been used in commercial audio frequency amplifiers. While low voltage MOSFETs are generally superior to bipolar devices having similar voltage ratings because of their higher current supplying capabilities, such MOSFETs have not heretofore been widely used as output devices in high power audio frequency amplifiers because they are low voltage devices. For high power amplifiers, another aspect of the present invention is the use of low voltage, high current MOSFETs. The smaller die size of low voltage MOSFETs results in less capacitive load on the driving circuitry and thus reduced cost of that drive circuitry.

Even when bipolar transistors are used as output devices, however, the present invention still provides many advantages. Low voltage bipolar devices are faster than high voltage bipolar devices and produce a cleaner high frequency response. Such low voltage devices can be used without the concerns of second-breakdown limitations. Also, low voltage devices generally have higher current gain, reducing drive power requirements.

In addition to allowing the use of low voltage output devices, the present invention allows the use of low or very low voltage driver circuitry, with local ground and power supplies referred to the output audio frequency signal. This reduces manufacturing costs as, in general, the lower the voltage rating the lower the cost of the device. Further, as with low voltage output devices, low voltage drive circuit devices are faster, producing cleaner high frequency response and have higher current gain, reducing drive power requirements and increasing linearity. When low voltage components are used, the drive circuitry is not the limiting factor in amplifier bandwidth or slew rate. Further, because the present invention eliminates floating, with fast signals Drain-Source Capacitance does not load the source, resulting in a reduction in drive current for a given slew rate.

Accordingly, an audio frequency amplifier constructed in accordance with the present invention as described herein eliminates floating of the tracking power supplies and thus allows the use of low voltage output devices and drive and control circuitry in the output stage. In certain configurations, the present invention also eliminates the need for a high voltage low current preamplifier as an input stage. The result is an audio frequency amplifier that can be constructed at reduced costs, has less distortion, has lower thermal dissipation requirements, and utilizes a simplified design that increases both reliability and the reproducibility of the amplifier.

BRIEF DESCRIPTION OF THE DRAWING

FIGS. 1A–1C depict ideal waveforms of source and sink supply signals generated by envelope tracking, rail-to-ground tracking, and rail-to-rail tracking power supplies for an arbitrary audio frequency input signal;

FIGS. 19A, 19B, 20 and 21A–21D and 22 depict a detailed circuit diagram showing the details of construction of the amplifier depicted in FIG. 18;

DETAILED DESCRIPTION OF THE INVENTION

Figure 2C:
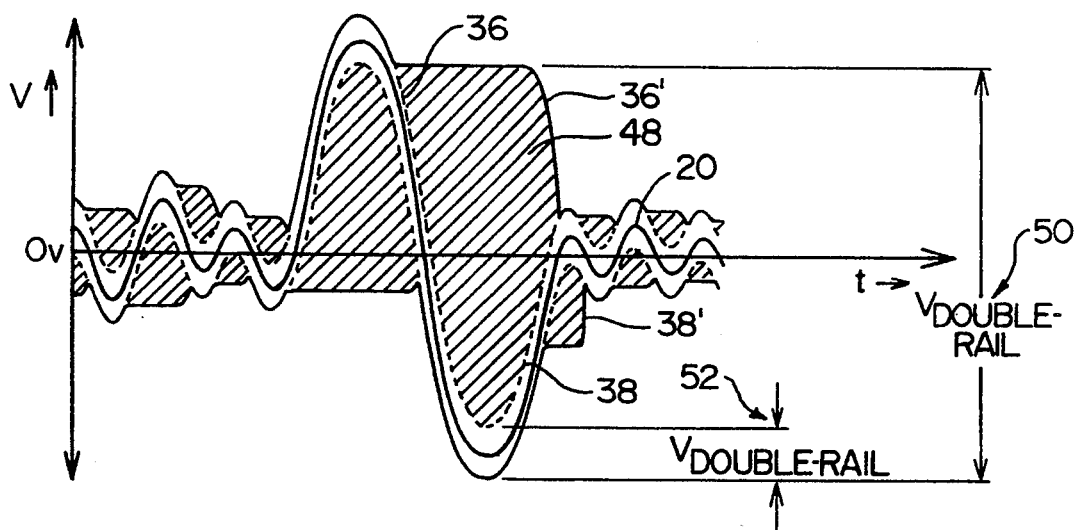
FIGS. 2A–2C depict waveforms representative of the actual, as opposed to ideal, waveforms generated by prior art source and sink supply signals generated by prior art envelope tracking, rail-to-ground tracking, and rail-to-rail tracking power supplies for the arbitrary audio frequency signal depicted in FIG. 1 above.

Referring now to the drawing, the present invention will be described in further detail. For the reader to understand completely the following detailed description, it should be kept in mind that the present invention can be used to good effect in an enormous number of amplifier configurations. Twelve of these configurations will be discussed in detail below to provide a complete understanding of the present invention.

The following detailed discussion is organized as follows:

(a) FIGS. 1–3 will initially be discussed to provide a overview of the waveforms generated by the present invention;

(b) FIGS. 4–7 will then be discussed to provide a broad overview of three audio frequency amplifier configurations made possible by the principles of the present invention; and (c) FIGS. 7–23 will next be discussed to provide a detailed description of twelve different amplifier circuits that employ the teachings of the present invention, with these circuits and elements variously embodied in rail-to-rail, rail-to-ground, and envelope tracking power supplies.

I. SUPPLY SIGNAL WAVEFORMS

As mentioned above, there are three types of tracking power supplies: envelope, rail-to-ground, and rail-to-rail. The source and sink supply waveforms generated by the present invention when applied to each of these three types of power supplies will now be described in detail with reference to FIG. 1A–C.

FIG. 1A depicts samples of the waveforms of the source and sink supply signals generated by an envelope tracker implementing the teachings of the present invention. More particularly, in FIG. 1A the audio frequency signal being amplified is depicted at 20, while the source and sink supply voltages present at the collectors of the output transistors are depicted at 22 and 24, respectively. The source and sink voltages both track the audio frequency signal such that a voltage $V_{envelope}$ developed across the push-pull amplifier is equal to twice the level $V_{signal}$ of the audio frequency signal at any given time plus two times an offset voltage $V_{offset}$. The maximum of the voltage $V_{envelope}$ without clipping is twice the maximum of $V_{signal}$ plus twice the offset voltage $V_{offset}$.

As briefly discussed above, audio frequency signals are normally relatively low with intermittent short bursts at higher levels. The exemplary signal 20 is relatively low at 26 and 28 with a peak or burst shown at 30. For ease of comparison of the three types of tracking power supplies, the exemplary signal is used throughout FIGS. 1A–C and 2A–C.

With the envelope tracking power supply, the voltage $V_{envelope}$ is relatively small during the low level portions 26 and 28 of the audio frequency signal 20. The voltage $V_{envelope}$ becomes large only during the relatively short and infrequent peak periods such as shown at 30 in FIG. 1A. Therefore, overall dissipation by the output transistors is significantly reduced in comparison to the situation in which fixed DC source and sink supply voltages are employed to power the push-pull amplifier.

Sample source and sink voltage waveforms developed by rail-to-ground tracking power supplies implementing the principles of the present invention are depicted in FIG. 1B. The source and sink voltages present at the collectors of the output transistors are depicted at 32 and 34, respectively. A voltage across the push-pull amplifier is identified by reference character $V_{rail-to-ground}$ in FIG. 1B. This voltage $V_{rail-to-ground}$ is the voltage difference between the source and sink supply voltages and is equal to the voltage $V_{signal}$ plus twice an offset voltage $V_{offset}$. The maximum of the voltage $V_{rail-to-ground}$ without clipping is the maximum of the voltage $V_{signal}$ plus twice the offset voltage $V_{offset}$.

By comparing the voltage $V_{rail-to-ground}$ with the voltage $V_{envelope}$ described above, it can be seen that the magnitude of the voltage $V_{rail-to-ground}$ is ideally always less than that of the voltage $V_{envelope}$ by the voltage $V_{signal}$. A rail-to-ground tracking power supply developes a lower voltage across the output transistors and thus ideally achieves significant reductions in dissipation beyond those obtained using an envelope tracking power supply as described above, particularly with reactive loads.

The source and sink signal waveforms developed by a rail-to-rail tracking power supply constructed in accordance with the teachings of the present invention is depicted in FIG. 1C. In FIG. 1C, the source and sink supply voltages generated by a rail-to-rail amplifier are depicted at 36 and 38, respectively. A voltage $V_{rail-to-rail}$ is developed across the output transistors and is equal to two times an offset voltage $V_{offset}$. This voltage $V_{rail-to-rail}$ is thus less than the voltage $V_{rail-to-ground}$ described above by the value of the voltage $V_{signal}$ and less than the voltage $V_{envelope}$ by twice the value of the voltage $V_{signal}$. The maximum of the voltage $V_{rail-to-rail}$ without clipping is twice the offset voltage $V_{offset}$.

The present invention eliminates floating of the source and sink supply signals. For comparison purposes, FIGS. 2 and 3 depict the floating source and sink supply signals developed by prior art tracking power supplies.

Figure 2B:
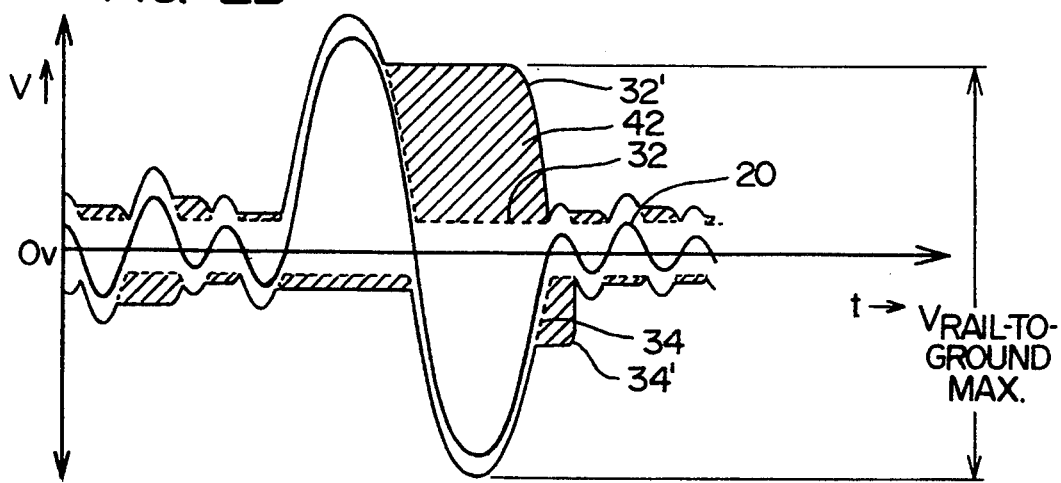
Figure 2A:
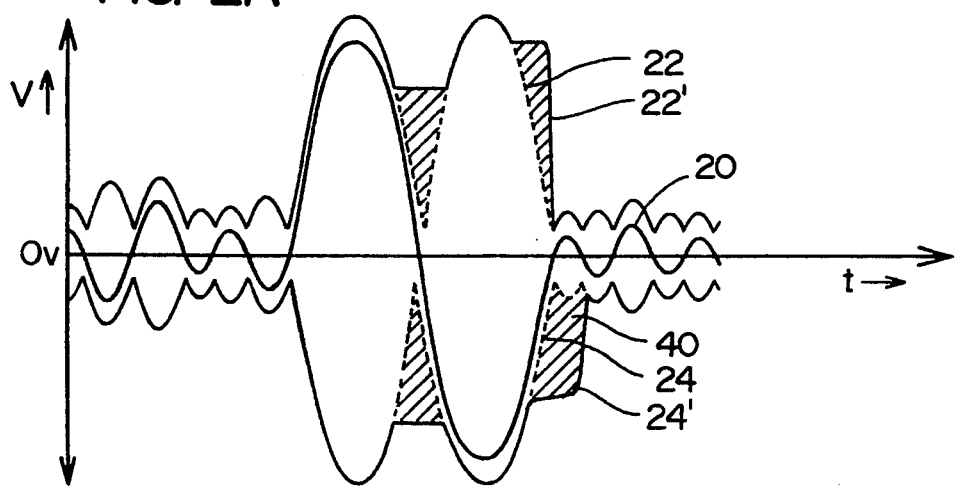

The audio frequency signal 20 described above with relation to FIG. 1A–C is again depicted in FIG. 2A–C. The source and sink voltages of an envelope tracking power supply constructed in accordance with the principles of the present invention are depicted by dotted lines at 22 and 24, while the actual source and sink voltages developed by a prior art envelope tracking power supply are depicted at 22' and 24'. The cross hatched regions such as the region identified by reference character 40 indicate that the dissipation losses will be greater in the prior art case than they would be with the present invention.

Further, the floating in envelope trackers is exacerbated by the fact that some envelope trackers employ switches on the primary side of the power transformer. Switching on the primary side requires a relatively low switching rate of 50–100 KHz because of the leakage inductance of the transformer. The floating and corresponding excess dissipation that result can be more severe at such low switching rates.

Referring now to FIG. 2B, that Figure depicts the source and sink supply voltages of a rail-to-ground tracking power supply constructed in accordance with the principles of the present invention by dotted lines at 32 and 34 for the audio frequency signal 20, while the actual source and sink supply voltages of a rail to ground power supply for that signal are shown at 32' and 34'.

Shaded regions such as the region indicated at 42 in FIG. 2A graphically illustrate that the prior art dissipation losses will exceed those obtained by the present invention.

Additionally, the voltage $V_{rail-to-ground}$ depicted at 44 in the shaded area 42 significantly exceeds the ideal maximum voltage indicated at 46. Therefore, not only do the actual source and sink supply voltages result in greater dissipation than theoretically possible, they preclude the use of output transistors having a low breakdown voltage because the collector-emitter voltage across the non-conducting transistor can be quite large as shown in FIG. 2.

Figure 3A:
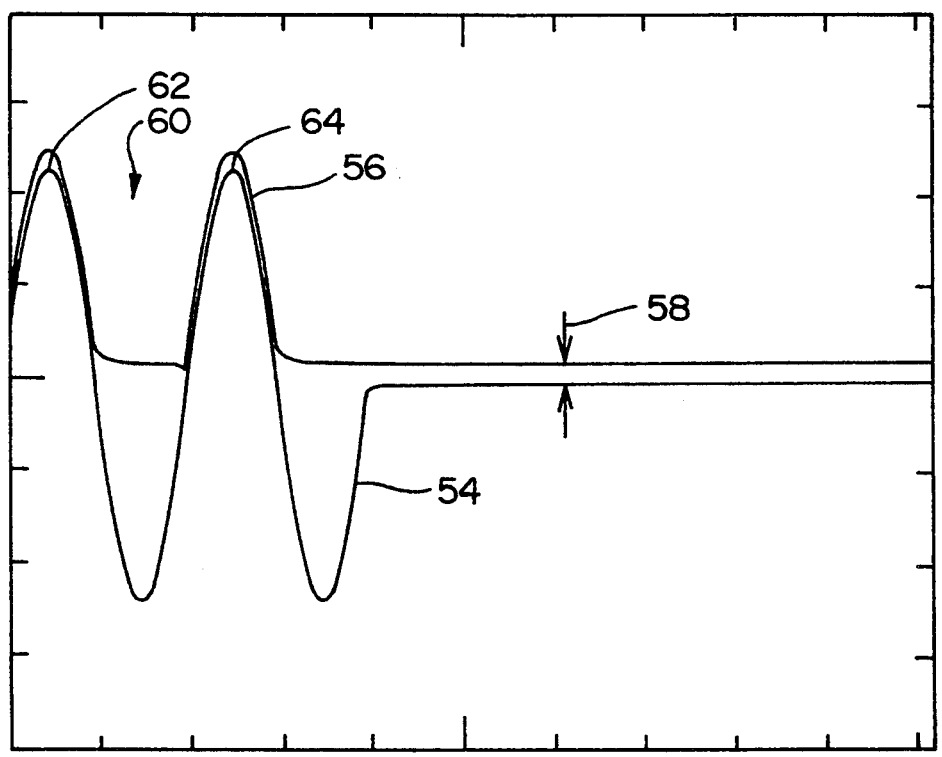
FIGS. 3A–3E are ocsilloscope traces of a source supply signal generated by commercially available audio frequency amplifier having a rail-to-ground tracking power supply under different loading conditions and for different audio frequency signals.
Figure 3B:
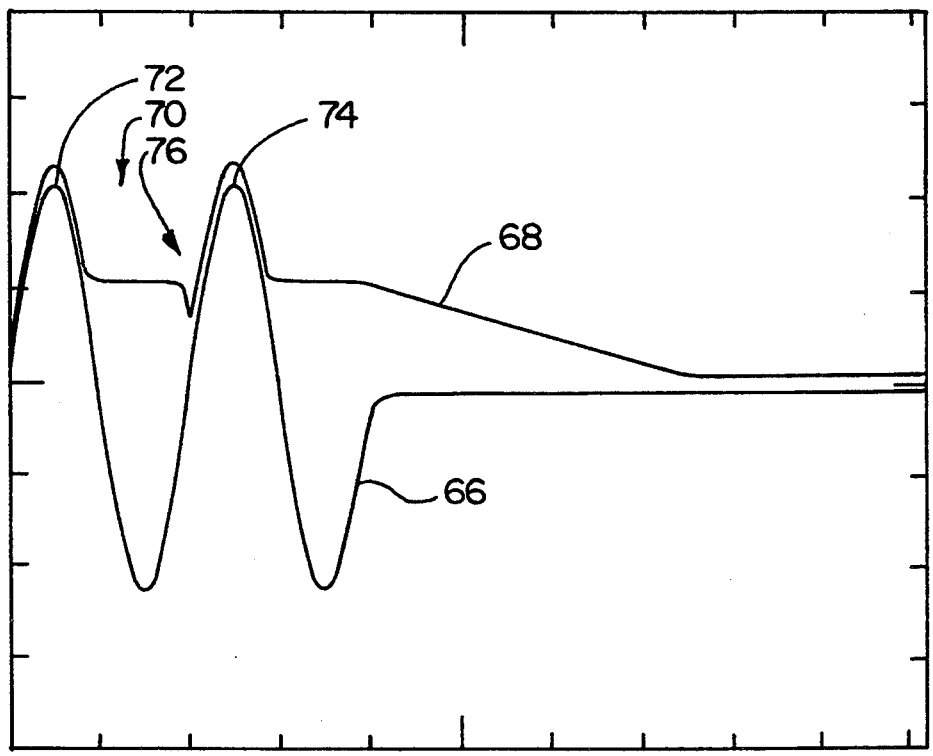
Figure 3C:
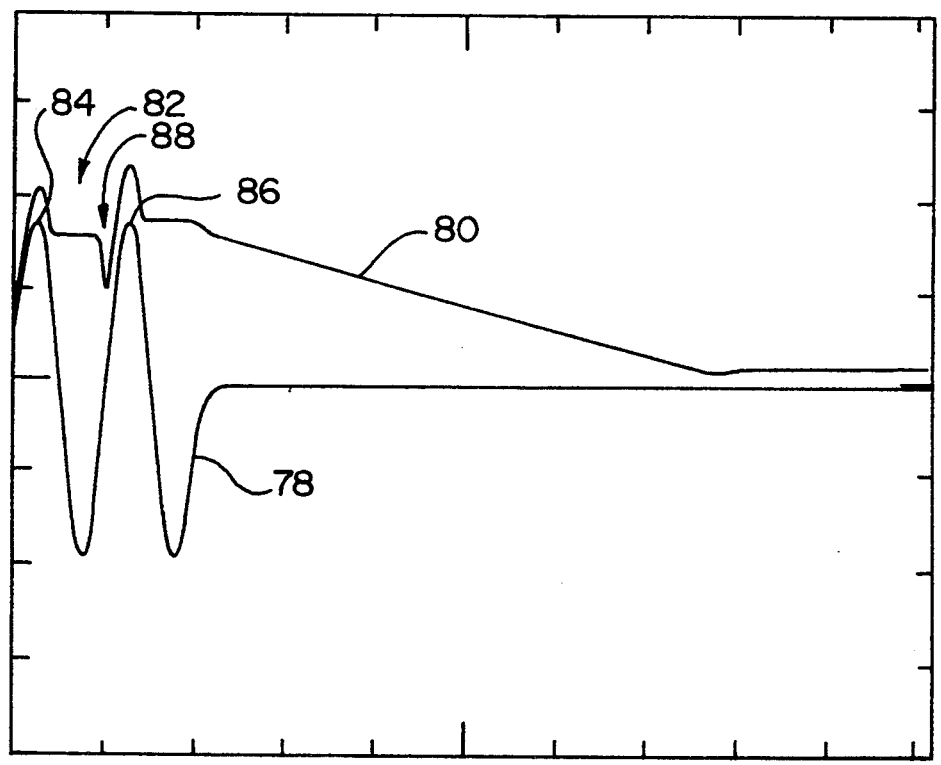

In FIG. 3C, the source and sink supply voltages generated by a prior art rail-to-rail tracker for the audio frequency signal 20 are depicted at 36' and 38'; the tracker source and sink supply voltages generated by a rail-to-rail tracking power supply of the present invention for the audio frequency signal 20 are depicted by dashed lines at 36 and Again, shaded regions such as the region identified by reference character 48 depict the situation in which dissipation losses exceed their theoretical minimum. Further, the prior art voltage $V_{rail-to-rail}$ shown at 50 in FIG. 3C greatly exceeds that obtained by the power supply of the present invention shown at 52.

Accordingly, if output transistors having a low breakdown voltage and small safe operation area are employed, the floating depicted in FIG. 3C can cause these output transistors to operate outside their safe operation area and cause the difference between the source and sink voltages to exceed the breakdown voltage of these transistors. In either case, failure of the output transistors is more likely to result.

Figure 3D:
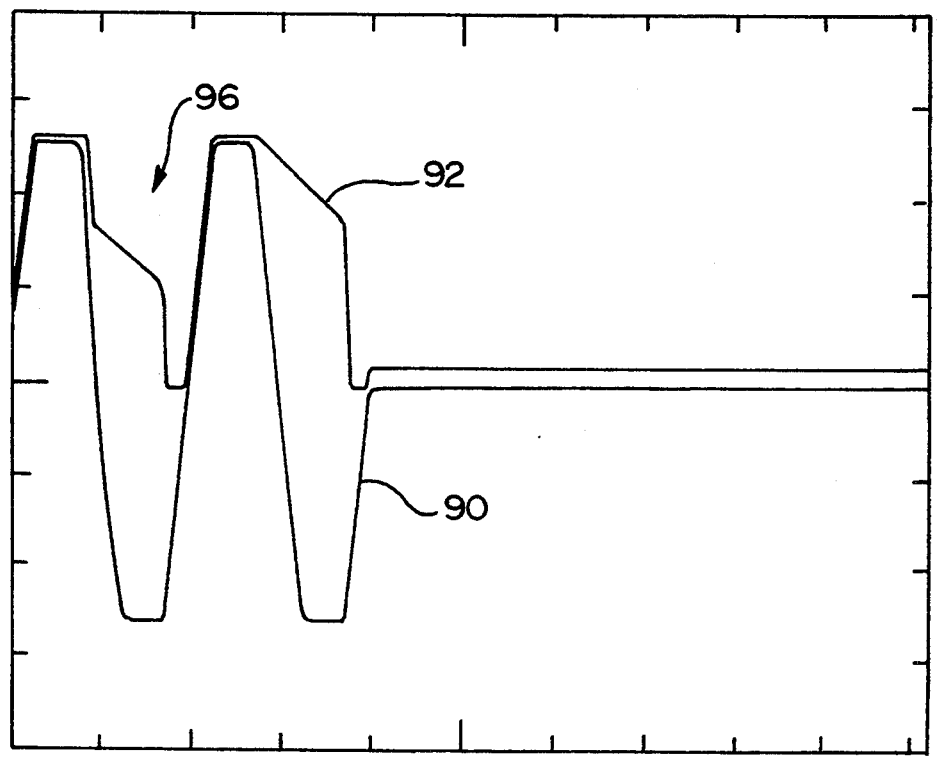
Figure 3E:
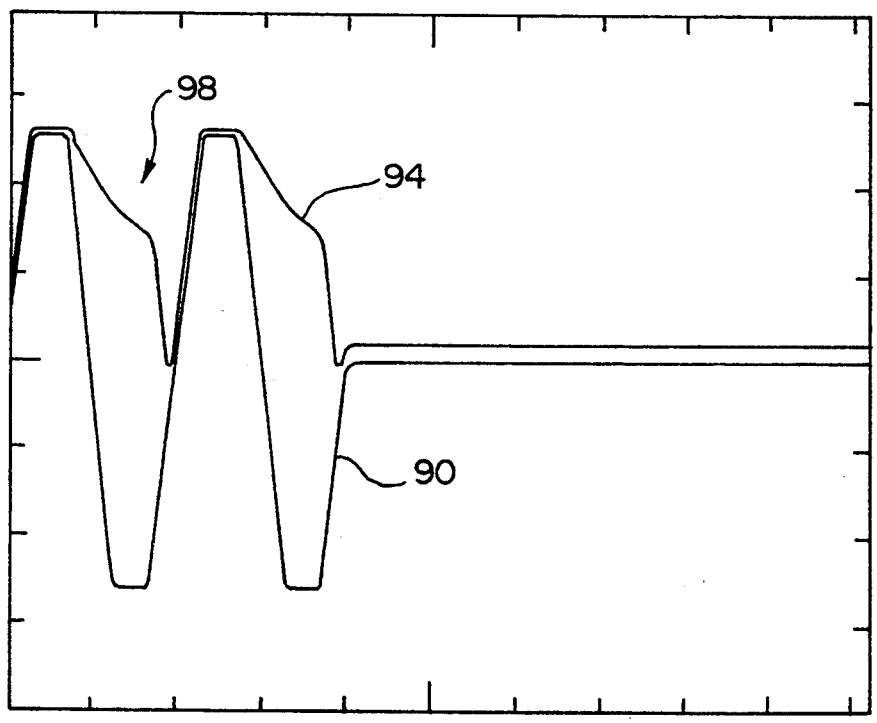

Referring now to FIG. 3A–E, depicted in these figures is an oscilloscope trace of the source voltage of a commercially available audio frequency amplifier having a tracking power supply. This amplifier is a model 2000C sold by AB Lab Gruppen of Kungsbacka, Sweden, and contains a rail-to-ground tracking power supply. FIGS. 3A–C show source voltages when the amplifier powers a resistive load, while FIG. 3D shows a source voltage under a capacitive load and FIG. 3E shows a source voltage under an inductive load.

Shown at 54 in FIG. 3A is a 1 KHz test signal that is being tracked by a source voltage indicated at 56. The source voltage 56 is designed to be offset above the test signal 54 by an 11 volt offset indicated at reference character 58. As shown in the region generally indicated at 60 between the two peaks of the test signal indicated at 62 and 64, the source voltage 56 tracks the test signal 54 fairly well in this region 60 for the 1 KHz test signal 54.

Referring now to FIG. 3B, depicted therein is a 10 KHz test signal 66. The source voltage generated for this test signal 66 is depicted at 68. In this case, the source voltage 68 within the region 70 between test signal peaks 72 and 74 floats rather severely, exceeding the 11 volt offset generally reached by the source voltage 56 in the region 60 in FIG. 3A by approximately 45 volts. The Applicants believe that the dip in the source voltage 68 shown at 76 in FIG. 3B corresponds to the point in time at which the test signal 66 crosses zero and the source output devices begin conducting current.

Referring now to FIG. 3C, a 20 KHz test signal is depicted therein at 78 and the source voltage tracking this test signal 78 is depicted at 80. Severe floating of the source voltage 80 is clearly evident in the region 82 between the test signal peaks 84 and 86. In particular, this floating causes the source voltage 80 to exceed the 11 volt offset in this region 82 by approximately 70 volts. Again, a dip 88 in the source voltage 80 in the region 82 indicates the point in time when the test signal 78 crosses zero and the source output devices begin conducting current again.

Depicted at 90 in FIGS. 3D and 3E is yet another 1 KHz test signal being tracked by source tracking voltages 92 and 94. Floating indicated at 96 and 98 in FIGS. 3D and 3E indicates that, under reactive loads, the floating can be severe even at relatively low frequencies.

As mentioned above, the Applicants have recognized that the floating problem is caused by the lack of current flowing through the non-conducting output devices. Without current flowing through the output devices, the output capacitors of the class D portion of the class BD amplifier are not discharged. This understanding explains the dips shown at 76 and 88 in FIGS. 3B and 3C: when current begins to flow through the output devices at a zero crossing point, this current discharges the output capacitor and brings down the source voltage, which then quickly rises again because the source voltage will begin tracking the test signal up after the zero crossing point.

While the floating as described above under the conditions of FIGS. 3B–3E is rather severe, it should be noted that combination of test signals and loads described in relation to those Figures would not occur often in the context of amplifying audio frequency signals. The Lab Gruppen 2000C amplifier thus operates quite efficiently given conventional audio frequency signals, exhibiting low dissipation and thus allowing a general reduction in amplifier size and heat sinking capacities over other designs; the rail-to-ground tracking Lab Gruppen 3000C would thus be considered a highly efficient high power amplifier.

II. BASIC AMPLIFIER CONFIGURATIONS IMPELEMENTING THE DISCHARGE MEANS OF THE PRESENT INVENTION

Three amplifier configurations made possible by the present invention are depicted by simplified block diagrams in FIGS. 4–6; however, the present invention can be embodied in other basic configurations as will be discussed in detail below.

Figure 4:
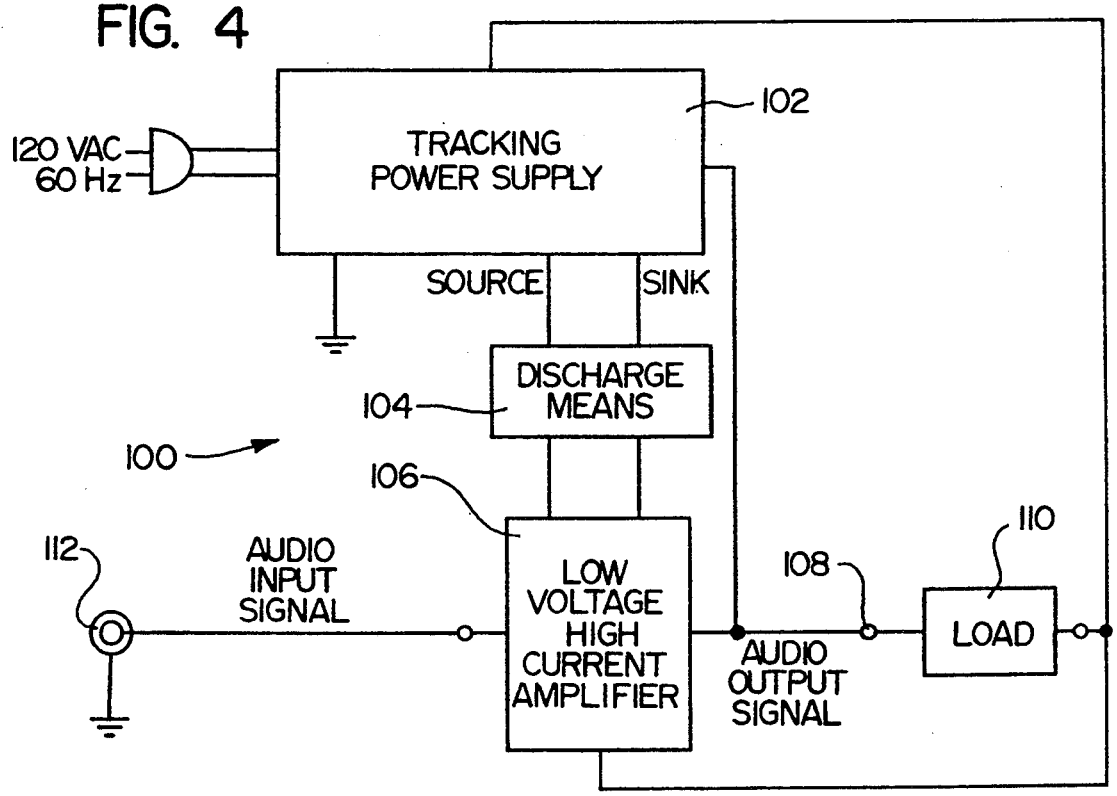
FIGS. 4–6 contain simplified block diagrams of basic configurations of exemplary audio frequency amplifiers constructed in accordance with, and embodying, the principles of the present invention.
Figure 5:
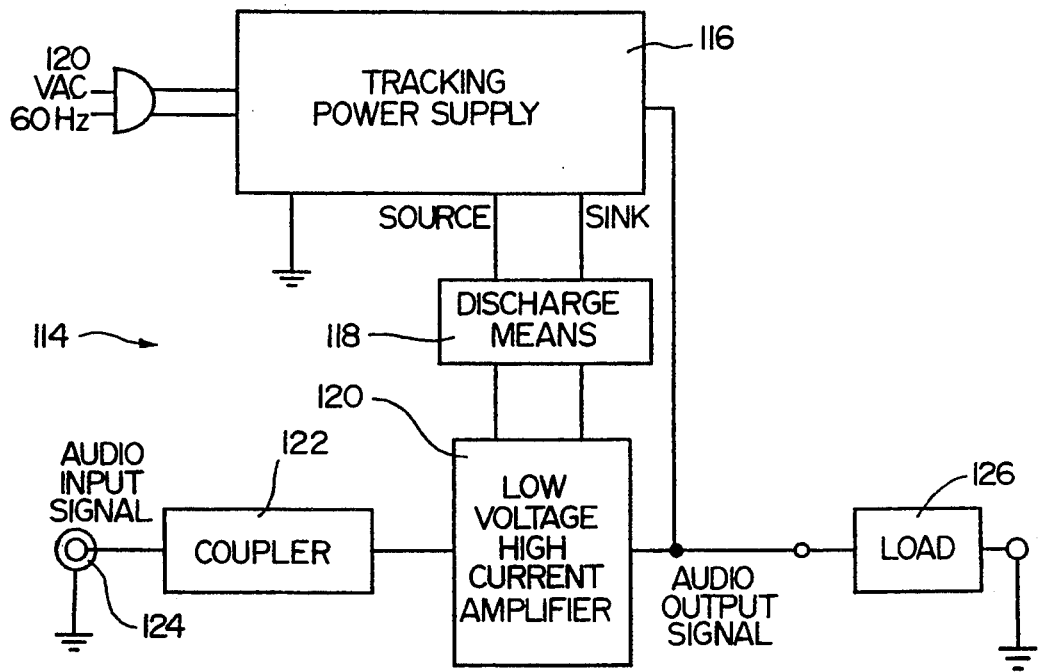

The amplifier configurations shown in FIGS. 4 and 5 illustrate that the present invention allows the construction of a practical audio frequency amplifier without a high voltage, low current preamplifier stage. The eliminaton of a high voltage preamplifier results in significant savings over prior art designs. The amplifiers in FIGS. 4–6 illustrate that, whether or not a high voltage preamplifier is provided, the present invention allows the use of a low voltage, high current output amplification stage. The use of low voltage parts in the output amplifier yields significant advantages as is discussed in detail elsewhere herein. Each of the amplifier configurations depicted in FIGS. 4–6 will now be described in further detail.

Referring now to FIG. 4, the present invention thus comprises in its simplest, and perhaps most preferred form for high power applications, an amplifier 100 comprising a tracking power supply 102, a discharge means 104 as described above, and a low voltage high current (LVHC) amplifier 106 as an output stage. The tracking power supply 102 comprises a pair of class D amplifiers configured to generate source and sink supply voltages that track the audio frequency signal. The discharge means 104 forces the supply voltages to follow the audio frequency signal such that floating does not occur. A terminal 108 between a load 110 and the LVHC amplifier 106 is connected to ground.

In this arrangement, the LVHC amplifier 106 is directly connected to an audio frequency input terminal 112, completely eliminating the need for a high voltage low current amplifier first stage and the fixed DC power supply therefor. This alone greatly reduces the cost and complexity of the amplifier 100.

Further, the amplifier stage 106 that remains in the amplifier 100 operates at low voltages, providing the benefits discussed above of having a truly low voltage output stage. For example, as will be described in further detail below, the LVHC amplifier 106 of the exemplary amplifier 100 can use low voltage MOSFETs and conventional and readily available integrated circuit operational amplifiers; with the discharge means 104 described above, such low and very voltage components can be used without fear of exceeding the breakdown voltages thereof.

Referring now to FIG. 5, it can be seen that the present invention may also be embodied in an amplifier 114 having a tracking power supply 116, a discharge means 118 as described above, a low voltage low current (LVHC) amplifier 120, and a coupling device 122. The tracking power supply 116 generates source and sink supply voltages that track the audio frequency signal. The discharge means 118 forces the supply voltages to follow the audio frequency signal such that floating does not occur. The coupling device 122 is connected between an audio input terminal 124 and the LVHC amplifier 120. A load 126 is connected on one side to ground and on another side to the LVHC amplifier 120.

This arrangement also completely eliminates the need for a high voltage low current amplifier first stage or preamplifier and the fixed DC power supply therefor. Again, this greatly reduces the cost and complexity of the amplifier 100. Only isolating means such as a coupling transformer or opto-coupler need be provided between the audio input terminal 124 and the LVHC amplifier 120 to isolate the LVHC amplifier 120 from the source of the audio frequency signal.

Also, separate main supplies or separate floating main secondary windings would entirely eliminate the need for input isolation.

The LVHC amplifier 120 operates at low voltages and thus obtains the benefits of low voltage parts as described above.

Figure 6:
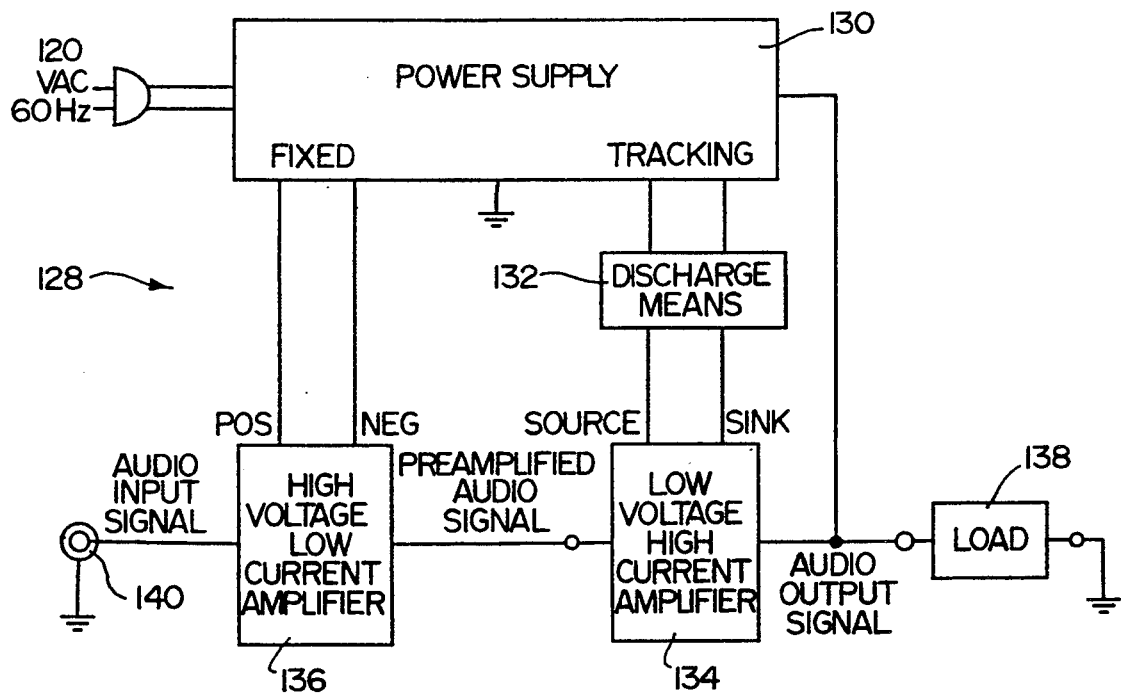

Referring now to FIG. 6, depicted therein is yet another audio frequency amplifier 128 constructed according to the principles of the present invention. This amplifier 128 comprises a power supply 130, a discharge means 132 as described above, a low voltage low current (LVHC) output stage amplifier 134, and a high voltage low current input stage amplifier (HVLC) 36. The power supply 130 generates two sets of voltages: fixed positive and negative DC voltages and source and sink supply voltages that track the audio frequency signal. The discharge means 118 forces the supply voltages to follow the audio frequency signal such that floating does not occur. The fixed DC voltages provide power to the HVLC amplifier 136. A load 138 is connected on one side to ground and on another side to the LVHC amplifier 120.

The HVLC amplifier 136 preamplifies an audio frequency input signal present at an input terminal 140. The output stage amplifier 134 generates a high power audio frequency output signal for driving the load 138.

However, the use of the discharge means 132 allows the LVHC amplifier 120 to operate at low voltages and thus obtains the benefits of low voltage parts as described above.

III. DETAILED DESCRIPTION OF THE PREFERRED EMBODIMENTS

FIGS. 7–12 and 15–25 depict twelve separate embodiments of the present invention. Each of the embodiments shown in FIGS. 7–12 and 15–25 conforms to at,least one of the three basic amplifier configurations allowed by the present invention and discussed above with reference to FIGS. 4–6.

a. First Embodiment

Figure 7:
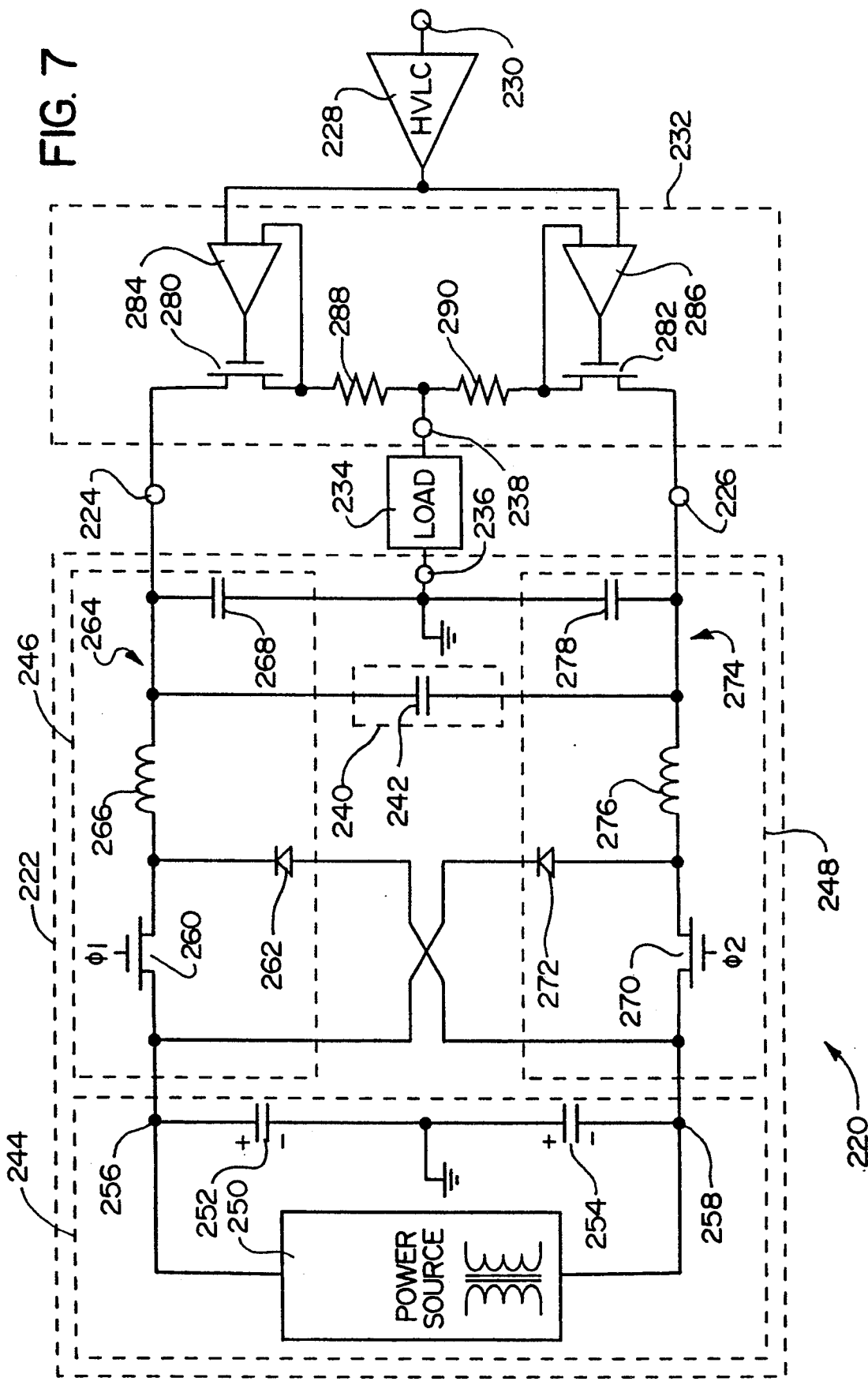
FIGS. 7–12 depict first through sixth embodiments of amplifiers constructed in accordance with, and embodying, the principles of the present invention.

Referring initially to FIG. 7, shown therein is a power amplifier circuit 220 constructed in accordance with, and embodying, a first embodiment of the present invention. The circuit 220 shown in FIG. 7 is a detailed implementation of the basic amplifier configuration depicted in FIG. 6.

The circuit 220 basically comprises: (a) a rail-to-rail tracking power supply 222 for generating source and sink voltages at source and sink terminals 224 and 226, respectively; (b) a high voltage low current (HVLC) preamplifier 228 connected to an input terminal 230; (c) a low voltage high current (LVHC) amplifier 232 connected to the HVLC preamplifier 228; (d) a load 234 connected to ground through a reference terminal 236 and to the LVHC amplifier 232 through an output terminal 238; and (e) a discharge element 240 comprising a locking capacitor 242.

The tracking power supply 222 is constructed and operates in basically the same manner in each of the power supplies depicted in FIGS. 7–12 and 15. Accordingly, the details of construction and operation of this power supply 222 will be discussed herein only with reference to the amplifier 220 depicted in FIG. 7, with the understanding that this discussion applies to the power supplies employed in the other amplifier configurations shown in FIGS. 8–12 and 15.

The tracking power supply 222 comprises a raw power supply 244 and source and sink switch converter circuits 246 and 248. The raw power supply 244 comprises a power source 250, a positive storage capacitor 252, and a negative storage capacitor 254. The negative terminal of the positive storage capacitor 252 and the positive terminal of the negative storage capacitor are connected to ground.

Present at terminals 256 and 258 respectively are a positive voltage $+V_{DC}$ and a negative voltage $-V_{DC}$ generated by the power source 250. The power source 250 comprises a power transformer and a freewheeling bridge and operates off of AC line voltage; such power sources are generally well-known, and the power source 250 will be discussed herein only to the extent necessary for a complete understanding of the present invention.

The source converter 246 comprises a source MOSFET switch 260, a source freewheeling diode 262, and a source low pass filter 264 comprising an inductor 266 and an output capacitor 268. The sink converter 248 comprises a sink MOSFET switch 270, a sink freewheeling diode 272, and a sink low pass filter 274 comprising an inductor 276 and an output capacitor 278. One terminal of the output capacitors 268 and 278 is connected the the inductors 266 and 276 associated therewith and the other terminal is connected to ground. The MOSFET switches 260 and 270, while depicted as only one switch for purposes of clarity, are often a plurality of MOSFET devices connected in parallel, as will be discussed in further detail below.

The inputs to the source and sink converters 246 and 248 are the terminals 256 and 258 described above, and the outputs thereof are the terminals 224 and 226 described above. The reference points of the switching converter circuits 246 and 248 are cross-coupled such that tracking power supply operates as rail-to-rail tracker as described above. In particular, the sink converter reference point is connected to the positive terminal 256 and the source converter reference point is connected to the negative terminal 258.

The tracking power supply 222 generates source and sink voltages that track the audio frequency output signal but are offset above and below, respectively, the audio frequency signal by a given offset voltage. This is accomplished by generating high frequency pulse width modulated square wave signals $\phi_1$ and $\phi_2$ and applying these signals $\phi_1$ and $\phi_2$ to the gates of the switching MOSFETs 260 and 270 to open and close these switching MOSFETs 260 and 270. As will be described in further detail below, the pulse widths of the signals $\phi_1$ and $\phi_2$ are modulated based on the audio frequency signal being amplified with a small offset to obtain the given offset.

The result is that the outputs of the MOSFETs 260 and 270 are signals having a low frequency portion that corresponds to the audio frequency signal being amplified and a high frequency portion at the switching frequency of the signals $\phi_1$ and $\phi_2$. The high frequency portions are then filtered off by the filters 262 and 264, leaving just the low frequency portions that track the audio frequency signal as the source and sink supply voltages at the terminals 224 and 226.

The amplifier circuit 220 operates basically as follows. An audio frequency input signal is applied to the input terminal 230. This audio frequency input signal is voltage amplified by the HVLC preamplifier 228 to obtain a high voltage, low current (low power) preamplified audio frequency signal. The preamplified audio frequency signal is next amplified by the LVHC amplifier 232 to obtain a high power audio frequency output signal for driving the load 234.

As described above, the tracking power supply 222 generates source and sink voltages that track the audio frequency output signal but are above and below, respectively, the audio frequency signal by the offset voltage. The locking capacitor 242 connected in parallel across the terminals 224 and 226 discharges the source and sink output capacitors 268 and 278 to prevent floating.

To illustrate, assume that the output signal has swung very far positive and that the source supply signal tracks the audio frequency output signal to its peak. At this point, the output capacitor 268 will be charged to the value of audio frequency output signal peak plus the offset voltage. As the audio frequency output signal begins to drop, the source supply signal also begins to drop.

In certain cases, current drawn by the source output device 280 and sourced to the load 234 will discharge the source output capacitor 268 down to zero volts. However, in other cases, the following factors will create the situation where the source output device 280 does not draw sufficient current to fully discharge the source output capacitor 268 before the audio frequency signal crosses zero and becomes negative: (a) high frequency audio signals; (b) open circuit or light loads; (c) certain reactive loads; (d) assymetric signals; (e) high offset voltages; and/or (f) tracking control system reaction time problems.

Further, if the source output capacitor 268 is not fully discharged before the the source output device 280 becomes non-conductive, the voltage across the source output capacitor 268 will hang or float until the next time that the source output device 280 becomes conductive. This would result in the voltage difference between the source and supply voltages significantly exceeding twice the offset voltage.

However, the locking capacitor 242 provides an alternative path for discharging the output capacitors 268 and 278 and thereby driving the supply voltages towards ground or reference from their extreme. Therefore, in the specific case described above, even if the source output device 280 becomes non-conductive before fully discharging the source output capacitor 268, current will flow out of the output capacitor 268, through the locking capacitor 242, through the sink inductor 276, through the sink switch 270, and to the negative terminal 258 of the power source 250. The current so flowing through the locking capacitor 242 will be sinked by the sink converter 248, providing a path for discharging the source output capacitor 268. This process works the in the same basic manner for the sink output capacitor 278 but in reverse. The voltage difference between the terminals 224 and 226 is thus securely held or locked at twice the given offset voltage under all conditions.

While the operation of the LVHC amplifier 232 will be described in further detail below, at this point it should be again noted that, by employing the locking capacitor 242 as the discharge element 240, a single pair of low voltage high current driving capacity MOSFETs can be used as the output devices 280 and 282 in the LVHC amplifier 232, even in high power applications. Further, the drive circuitry for these MOSFETs 280 and 282, schematically indicated by amplifiers 284 and 286 and resistors 288 and 290, can be low voltage devices as well. As discussed in more detail above, the use of such low and/or very low voltage devices in the output stage of the amplifier 220 yields significant benefits.

b. Second Embodiment

Figure 8:
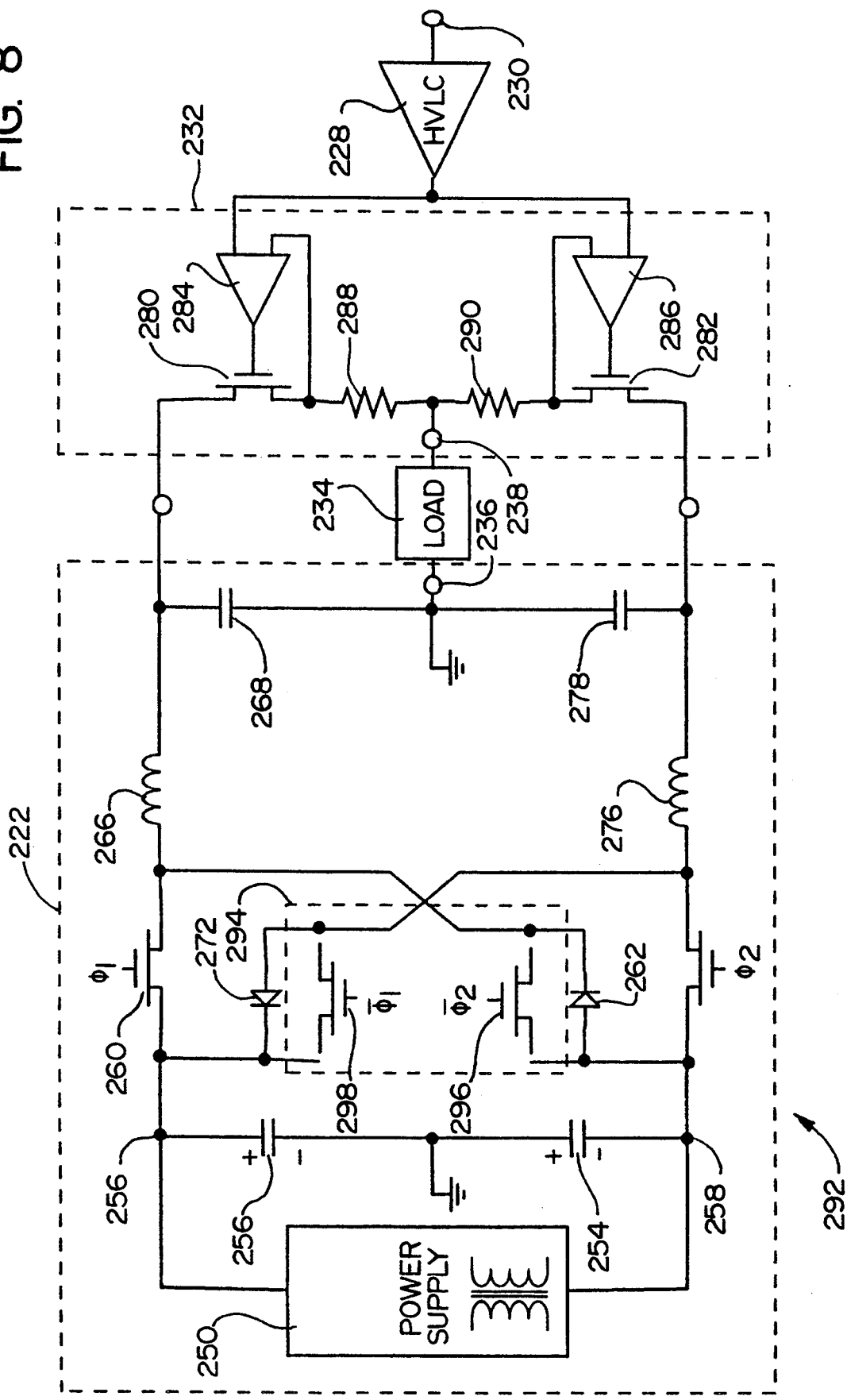

Referring now to FIG. 8, depicted therein is another exemplary amplifier 292 constructed in accordance with, and embodying, a third embodiment of the present invention. The amplifier 292 is a detailed implementation of the basic amplifier configuration depicted in FIG. 6 above. This amplifier 292 is constructed and operates in the same basic manner as the amplifier 220 described above. Circuit elements in the amplifier 292 that are the same as those employed in the amplifier 220 will be identified in FIG. 8 by the reference characters used in FIG. 7 and will not be discussed in detail again below.

The amplifier 292 employs a discharge circuit 294 that differs from the discharge element 240 employed in the amplifier 320 described above. The discharge circuit 294 comprises a source discharge MOSFET 296 and a sink discharge MOSFET 298. The source discharge MOSFET 296 is connected in parallel with the source freewheeling diode 262, while the sink discharge MOSFET 298 is connected in parallel with sink freewheeling diode 272. In certain cases, the source and sink freewheeling diodes 262 and 272 can be integrally formed with MOSFETs 296 and 298.

These MOSFETs 296 and 298 are opened and closed according to high frequency pulse width modulated signals $\bar{\phi}_1$ and $\bar{\phi}_2$, respectively. These signals $\bar{\phi}_1$ and $\bar{\phi}_2$ are the signals $\phi_1$ and $\phi_2$ inverted. The MOSFETs 296 and 298 thus actively pull the source and sink signals in the appropriate direction such that floating is substantially eliminated.

For example, if the source output device 280 becomes non-conductive before the source output capacitor 268 is fully discharged, the source discharge MOSFET 296 will be opened and closed such that current will flow out of the source output capacitor 268, through the source inductor 266, through the source discharge MOSFET 296, and to the negative terminal 258 of the power supply where the current will be sinked. This current path will thus discharge the source output capacitor 268 to prevent floating of the source supply signal.

c. Third Embodiment

Figure 9:
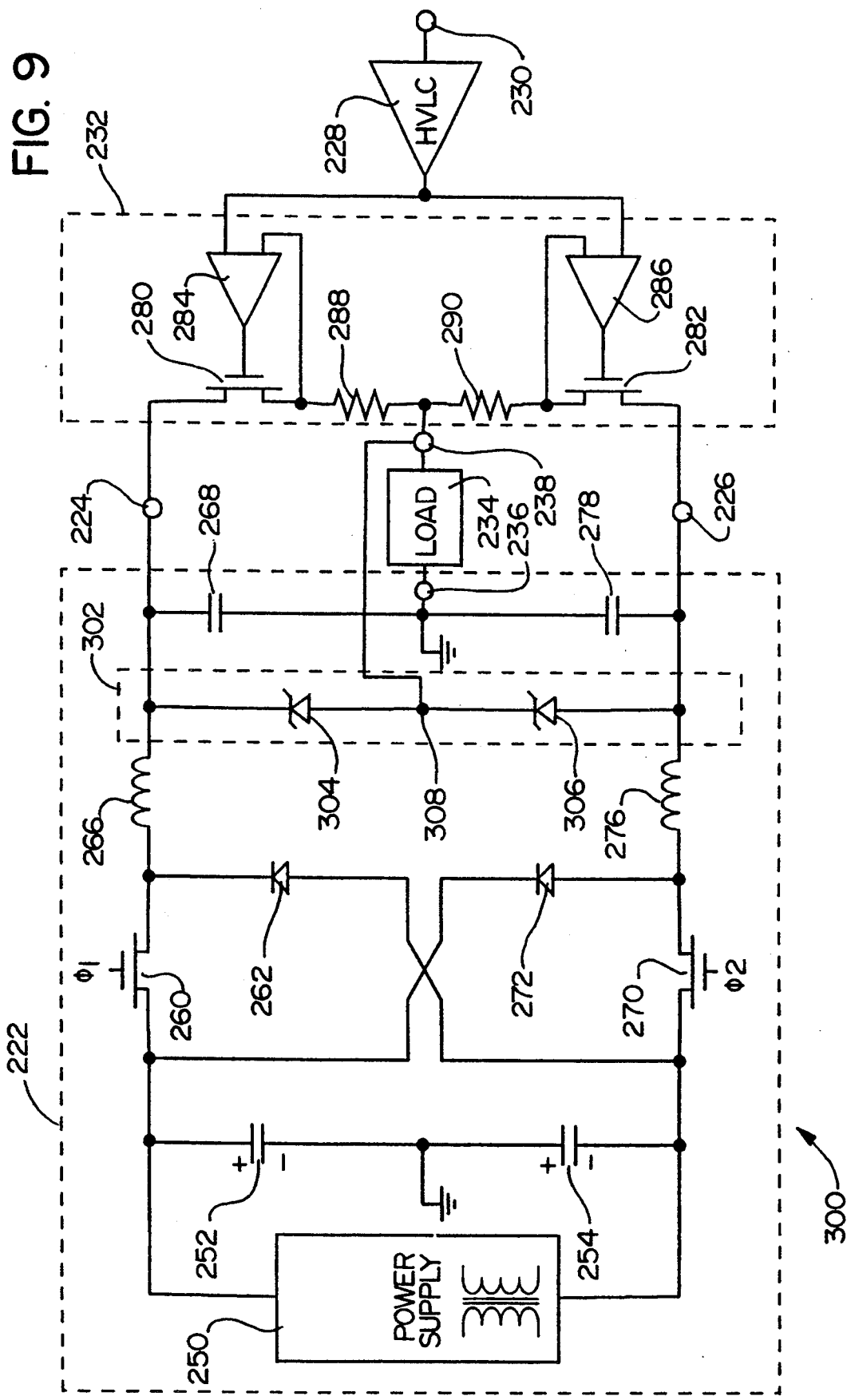

Referring now to FIG. 9, depicted therein is another exemplary amplifier 300 constructed in accordance with, and embodying, a third embodiment of the present invention. The amplifier 300 is a detailed implementation of the basic amplifier configuration depicted in FIG. 6 above.

This amplifier 300 is constructed and operates in the same basic manner as the amplifier 220 described above. Circuit elements in the amplifier 300 that are the same as those employed in the amplifier 220 will be identified in FIG. 9 by the reference characters used in FIG. 7 and will not be discussed again in detail below.

The amplifier 300 employs a discharge circuit 302 that comprises a pair of source and sink breakdown diodes 304 and 306 connected in series between the terminals 224 and 226. A juncture 308 between the diodes 304 and 306 is connected to the output terminal 238. The diodes 304 and 306 are set to maintain at least a voltage difference equal to the offset voltage across each of the source output devices 280 and 282 and the drive circuitry therefore. In practice, the diodes 304 and 306 breakdown at a voltage difference slightly greater than the offset voltage to prevent them from conducting during normal operation. The source diode 304 thus prevents the source voltage from exceeding the audio frequency output signal by more than the offset voltage, while the sink diode 306 prevents the sink voltage from falling below the audio frequency output signal by more than the offset voltage.

For example, if the source output device 280 becomes non-conductive before the source output capacitor 268 is fully discharged, current will flow through the source Zener diode 304 to the reference terminal 238 where it will be sinked by the sink output device 282. This current will discharge the source output capacitor 268 if the source output device 280 cannot.

Therefore, the source and sink output capacitors 268 and 278 are discharged such that the voltage between the terminals 224 and 226 is securely held or locked at twice the offset voltage.

d. Fourth Embodiment

Figure 10:
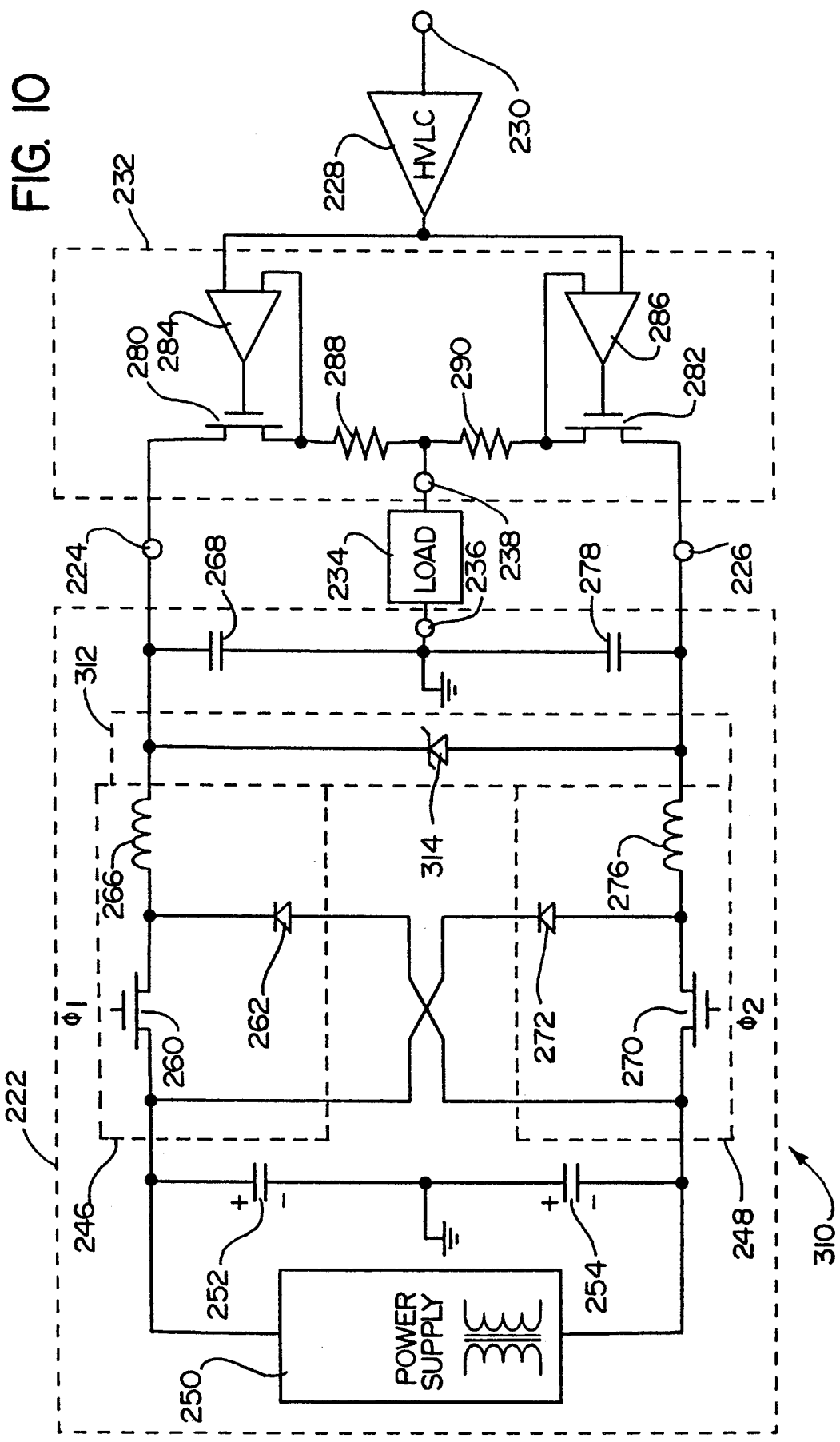

Referring now to FIG. 10, depicted therein is yet another exemplary amplifier 310 constructed in accordance with, and embodying, a fourth embodiment of the present invention. The amplifier 310 is a detailed implementation of the basic amplifier configuration depicted in FIG. 6 above.

This amplifier 310 is constructed and operates in the same basic manner as the amplifier 220 described above. Circuit elements in the amplifier 310 that are the same as those employed in the amplifier 220 will be identified in FIG. 10 by the reference characters used in FIG. 7 and will not be discussed again in detail below.

The exemplary amplifier 310 employs a discharge element 312 that comprises a locking diode 314 connected between the source and sink supply terminals 224 and 226 and configured to maintain a voltage difference of at least twice the offset value between these terminals 224 and 226. The breakdown voltage of the locking diode 314 is set slightly greater than twice the offset voltage to prevent the diode 314 from conducting during normal operation. The locking diode 314 securely holds or locks the voltage difference between the terminals 224 and 226 from exceeding twice the offset voltage.

For example, as described above, the source output device 280 will become non-conductive before the source output capacitor 268 is fully discharged under certain conditions. If this occurs and the voltage across the output stage 232 begins to exceed twice the offset value, current will flow out of the output capacitor 268, through the locking Zener diode 314, and to the sink supply terminal 226. The current so flowing through the locking capacitor 242 will be sinked by the sink converter 248, thereby providing a path for discharging the source output capacitor 268. This process works the in the same basic manner for the sink output capacitor 278 but in reverse. The voltage difference between the terminals 224 and 226 is thus securely held or locked at twice the given offset voltage under all conditions.

e. Fifth Embodiment

Figure 11:
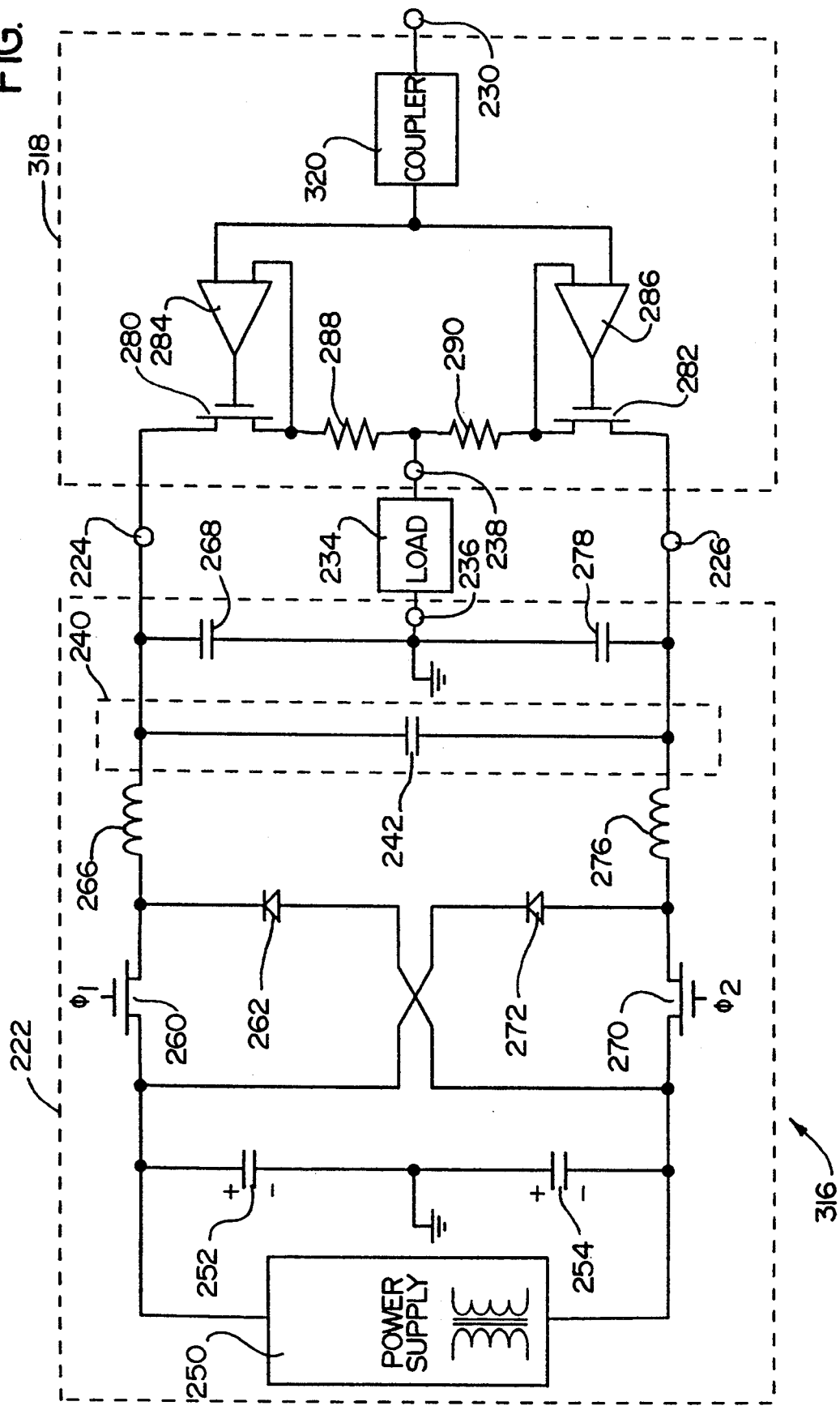

FIG. 11 depicts yet another audio frequency power amplifier 316 constructed in accordance with a fifth embodiment of the present invention. The amplifier 316 is a detailed implementation of the basic amplifier configuration depicted in FIG. 5 above.

Again, this amplifier 316 operates in the same basic manner as the amplifier 220 described above. Circuit elements in the amplifier 316 that are the same as those employed in the amplifier 220 will be identified in FIG. 11 by the reference characters used in FIG. 7 and will not be discussed again in detail below.

The amplifier 316 shown in FIG. 11 does not have a high voltage low current preamplifier or input stage. Instead, a LVHC amplifier 318 is provided having a coupling element 320. This coupling element 320 is connected between the input terminal 230 and the driving amplifiers 284 and 286 of the LVHC amplifier 318 to provide isolation between the amplifier 318 and the input terminal 230. The elimination of the preamplifier or input stage results in significant advantages as was discussed in detail above.

f. Sixth Embodiment

Figure 12:
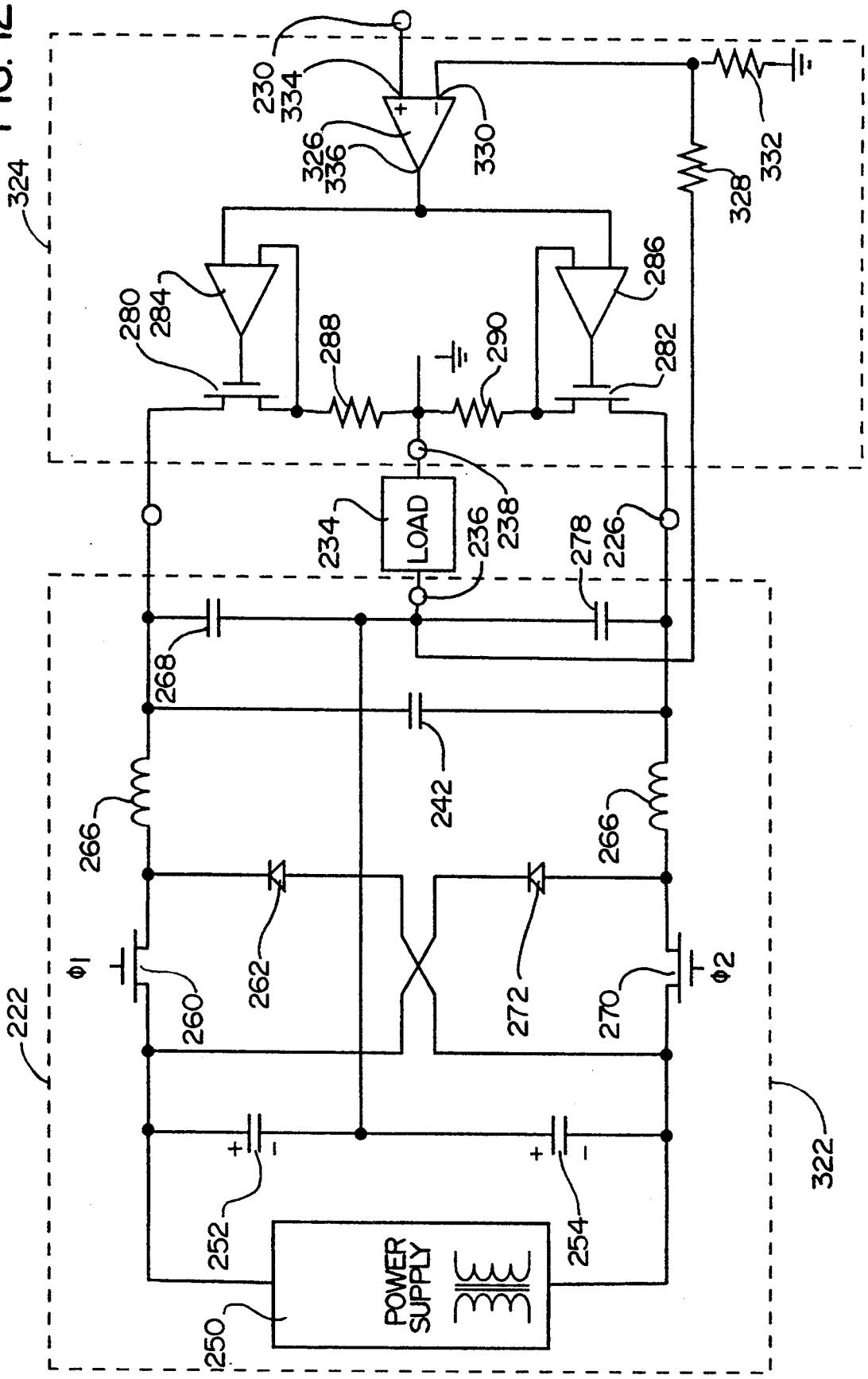

A sixth exemplary embodiment of the present invention is depicted at 322 in FIG. 12. The amplifier 322 is a detailed implementation of the basic amplifier configuration depicted in FIG. 4 above.

Again, this amplifier 322 operates in the same basic manner as the amplifier 220 described above, and the amplifier 322 will be discussed below only to the extent that it differs from the amplifier 220. In the following discussion, circuit elements of the amplifier 322 that are the same as those employed in the amplifier 220 will be identified in FIG. 12 by the reference characters employed in FIG. 7.

As with the amplifier 316 discussed above, the amplifier 322 eliminates the need for a high voltage preamplifier or input stage as a buffer. The amplifier 322 thus comprises a low voltage high current amplifier 324 containing an operational amplifier 326. Further, the input terminal 238 is connected to ground. The reference terminal 236, which was connected to ground in the amplifier 220, is now free to follow the audio frequency signal. This arrangement isolates the power supply 250 and the high voltages within the tracking power supply 222 from the input terminal 230.

The audio frequency signal present at the reference terminal 236 is connected through a scaling resistor 328 to an inverting terminal 330 of the operational amplifier 326. This inverting terminal 330 is connected through a reference resistor 332 to ground. A non-inverting terminal 334 of the operational amplifier 326 is connected to the audio input terminal 230. An output terminal 336 of the amplifier 326 is connected to the driving amplifiers 284 and 286.

Figure 13:
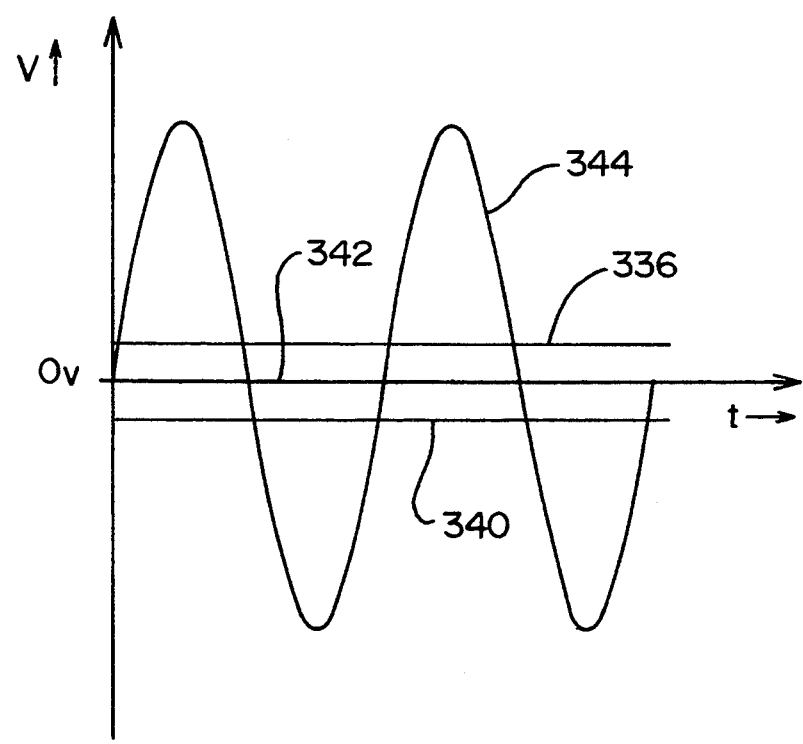
FIG. 13 depicts certain critical voltages present within the amplifier depicted in FIG. 12.

Before discussing the operation of the amplifier 322 in detail, certain critical voltages present within the amplifier 322 will be explained with reference to FIG. 13. In FIG. 13, the audio frequency input signal is sinusoidal. The source and sink supply voltages at the source and sink terminals 324 and 326 in FIG. 13 are indicated at 336 and 340, respectively. The voltage at the output terminal 238 is indicated at 342. The voltage at the reference terminal 236 is indicated at 344. FIG. 13 shows that the source and sink voltages present at the source and sink terminals 224 and 226 are fixed the offset voltage above and below ground, respectively. The voltage at the output terminal is fixed at ground. The voltage at the reference terminal 236 moves above and below ground following the audio frequency signal.

With an understanding of these voltages, the operation of the amplifier 322 will now be described. The audio frequency input signal present at the input terminal 230 is applied to the positive terminal of the operational amplifier 326. The signal present at the reference terminal 236 is scaled by the scaling and reference resistors 328 and 332 to provide a reference signal for the operational amplifier 326. The output of the operational amplifier 326 thus corresponds to the difference between this reference signal and the audio frequency input signal.

The output of the operational amplifier 326 is applied to the amplifiers 284 and 286. As will be discussed in further detail below, these amplifiers 284 and 286 drive the MOSFETs 280 and 282 to generate an output current for driving the load 234.

The amplifier 322 described above thus not only keeps the voltage between the source and sink supply terminals 224 and 226 constant at a low value, these voltages are held constant at a low value with respect to ground. Low voltage parts may therefore be used throughout the entire LVHC amplifier 324 with the attendant benefits as described above. The tenth embodiment described below is configured in the same basic manner as this sixth embodiment.

g. Seventh Embodiment

Figure 15:
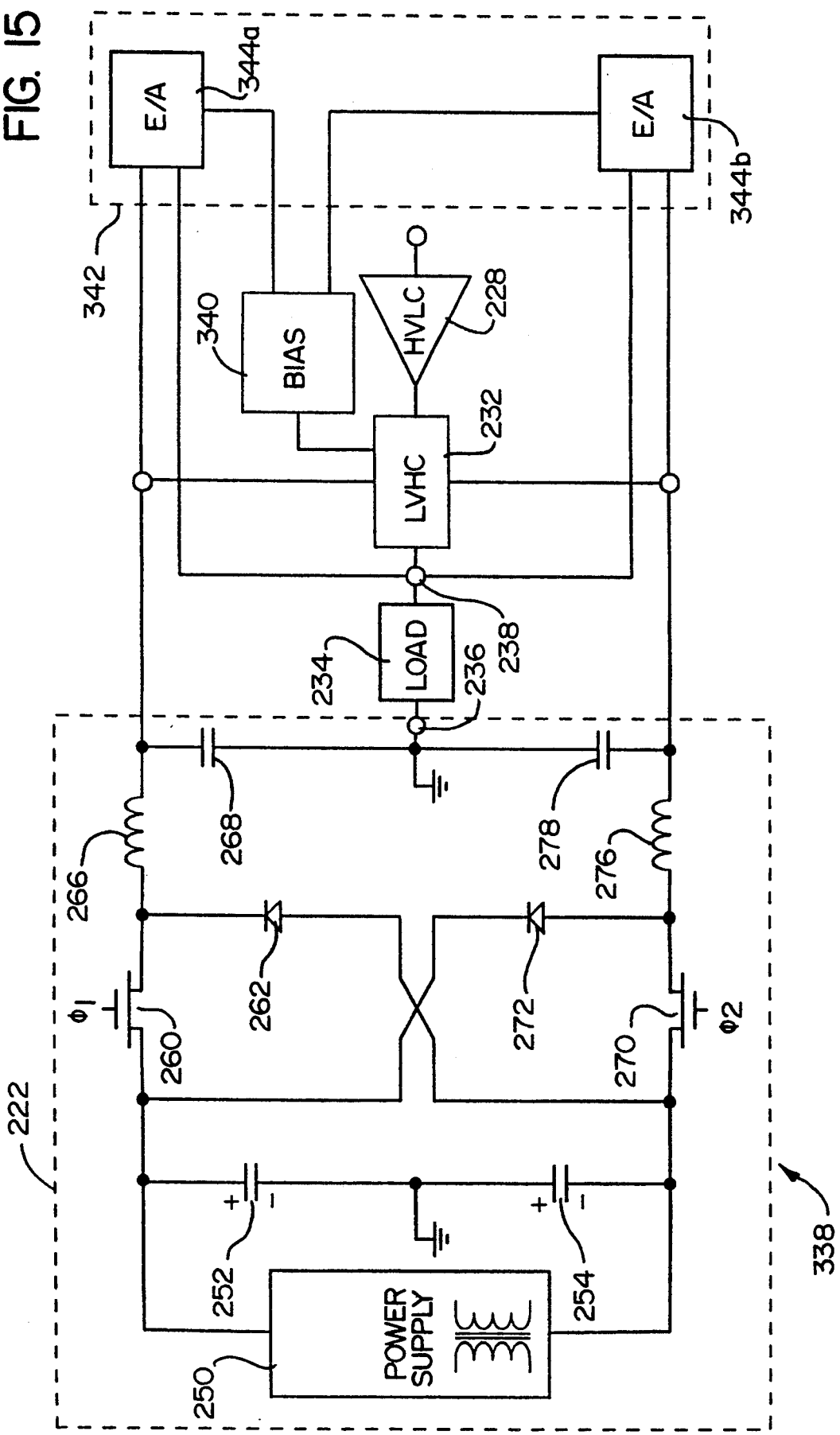
FIGS. 15–17 depict circuit diagrams of seventh through ninth embodiments of audio frequency amplifiers constructed in accordance with, and embodying, the principles of the present invention.

Referring now to FIG. 15, yet another exemplary amplifier 338 constructed corresponding to a seventh embodiment of the present invention will be discussed. The amplifier 338 is a detailed implementation of the basic amplifier configuration depicted in FIG. 6 above.

This amplifier 338 is constructed and operates in the same basic manner as the amplifier 220 described above. Circuit elements in the amplifier 338 that are the same as those employed in the amplifier 220 will be identified in FIG. 15 by the reference characters used in FIG. 7 and will not be discussed again in detail below.

The exemplary amplifier 338 employs a variable bias circuit 340 to supply a bias current to the LVHC amplifier 232. Variable bias circuits are well-known in the art and will not be disclosed herein in detail.

However, the amplifier 338 further comprises a discharge circuit 342 that controls the amount of bias current supplied by the bias setting circuit 340. This discharge circuit 342 comprises source and sink error amplifiers 344a and 344b that generate source and sink error signals based on a difference between: (a) the audio frequency output signal at the output terminal 238 and the source supply voltage at the terminal 224; and (b) the audio frequency output signal at the output terminal 238 and the sink supply voltage at the terminal 224, respectively. The source and sink error signals are "ORed" within the bias setting circuit 340 such that the bias is increased based on the greater of the source and sink error signals.

Therefore, whenever the discharge circuit 342 determines that conditions exist under which floating of the source and sink supply signals is likely to occur, the bias setting circuit 340 is controlled to increase the amount of bias current applied to the LVHC amplifier 232.

Other factors may be taken into account when determining when and how much the bias current should be increased. For example, the bias circuit 340 may be controlled to increase bias current whenever it is determined that: (a) the frequency of the audio frequency signal is high; (b) the amplifier 338 is driving an open circuit or light loads; (c) the voltage and current of the source and sink signals are out of phase; and/or (d) the audio frequency signal is assymetric. Increasing the bias current under one or more of the foregoing conditions will allow the output capacitor 268 to be discharged through the source output device 280 even though current would not otherwise be flowing therethrough.

With the error amplifiers 344a and 344b, the bias current can be continuously varied according to the magnitude of the conditions that cause floating. For example, the bias current may be increased corresponding to: (a) an increase in the frequency of the audio frequency signal; (b) the amount by which the phase of the voltage and current of the source and sink supply signals diverge; and/or (c) the amount by which a difference between source and sink supply signals of a rail-to-rail tracking power supply exceeds twice the offset value (as described above). In a simpler design, the error amplifiers 344a and 344b can be replaced with comparators and the bias current may be increased in one discrete step from a predetermined minimum level.

Accordingly, when the conditions that cause floating do not occur, the bias current is kept low to decrease the dissipation in the LVHC amplifier 232. However, the bias current is increased when floating is likely to occur to ensure that sufficient current is flowing through the output devices of the LVHC amplifier 232 to discharge the output capacitors 268 and 278 and thereby suppress or eliminate floating.

h. Eighth Embodiment

Figure 16:
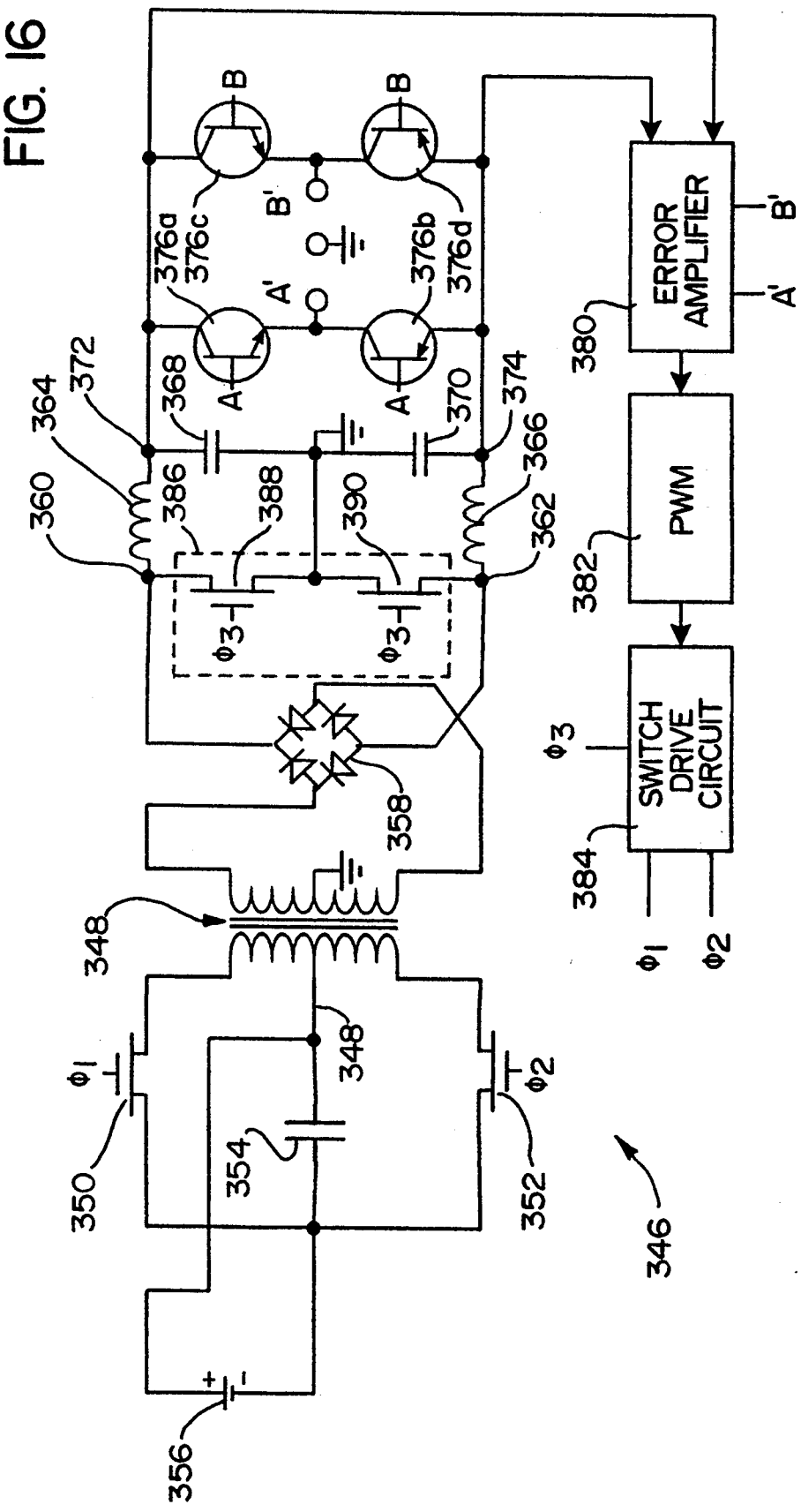

Depicted at 346 in FIG. 16 is still another exemplary amplifier corresponding to an eighth the present invention. This amplifier 346 is a voltage fed envelope tracker that amplifies both channels A and B of a stereo audio frequency signal. The amplifier 346 would employ a high voltage, low current amplifier, as does the basic amplifier configuration shown in FIG. 6.

The amplifier 346 is switched on the primary side of a transformer 348 by first and second MOSFETs 350 and 352. A capacitor 354 is connected between a center tap 348a of a primary side of the transformer 348 and a negative terminal of a DC power source 356. The positive terminal of the DC power source 356 is also connected to the primary side center tap 348a.

The secondary side of the transformer 348 has a grounded center tap 348b. The output of the transformer 348 is rectified by a diode bridge 358 to generate pulsed positive and negative DC voltages at terminals 360 and 362. The voltages at terminals 360 and 362 are low pass filtered by source and sink inductors 364 and 366 and source and sink output capacitors 368 and 370. The resultant signals at terminals 372 and 374 are source and sink supply signals that track the higher of the two channels A and B. Current is thus sourced and sinked to output transistors 376a, 376b, 376c, and 376d.

An error amplifier 380 generates an error signal indicative of the difference between the lesser of the source and sink voltages and the greater of the output signals A′ and B′. The error signal is transformed into a pulse width modulated signal by the pulse width modulator 382, a switch drive circuit 384 generates first and second drive signals $\phi_1$ and $\phi_2$ from the pulse width modulated signal.

Importantly, the amplifier 346 also comprises a discharge means 386 formed by first and second discharge switches 388 and 390. To drive these switches as appropriate to discharge the output capacitors 368 and 370 to prevent floating, the switch drive circuit generates a third drive signal $\phi_3$ that closes the discharge switches 388 and 390 any time the first and second switches 350 and 352 are both open.

In particular, if the current drawn by the output devices 376a,b,c,d is insufficient to discharge the output capacitors 368 and 370, current will flow through the inductors 364 and 366 and the switches 388 and 390 to ground. This current will discharge the output capacitors 368 and 370. The discharge means 386 thus eliminates floating and thereby decreases the dissipation in the output transistors 376a, 376b, 376c, and 376d.

i. Ninth Embodiment

Figure 17:
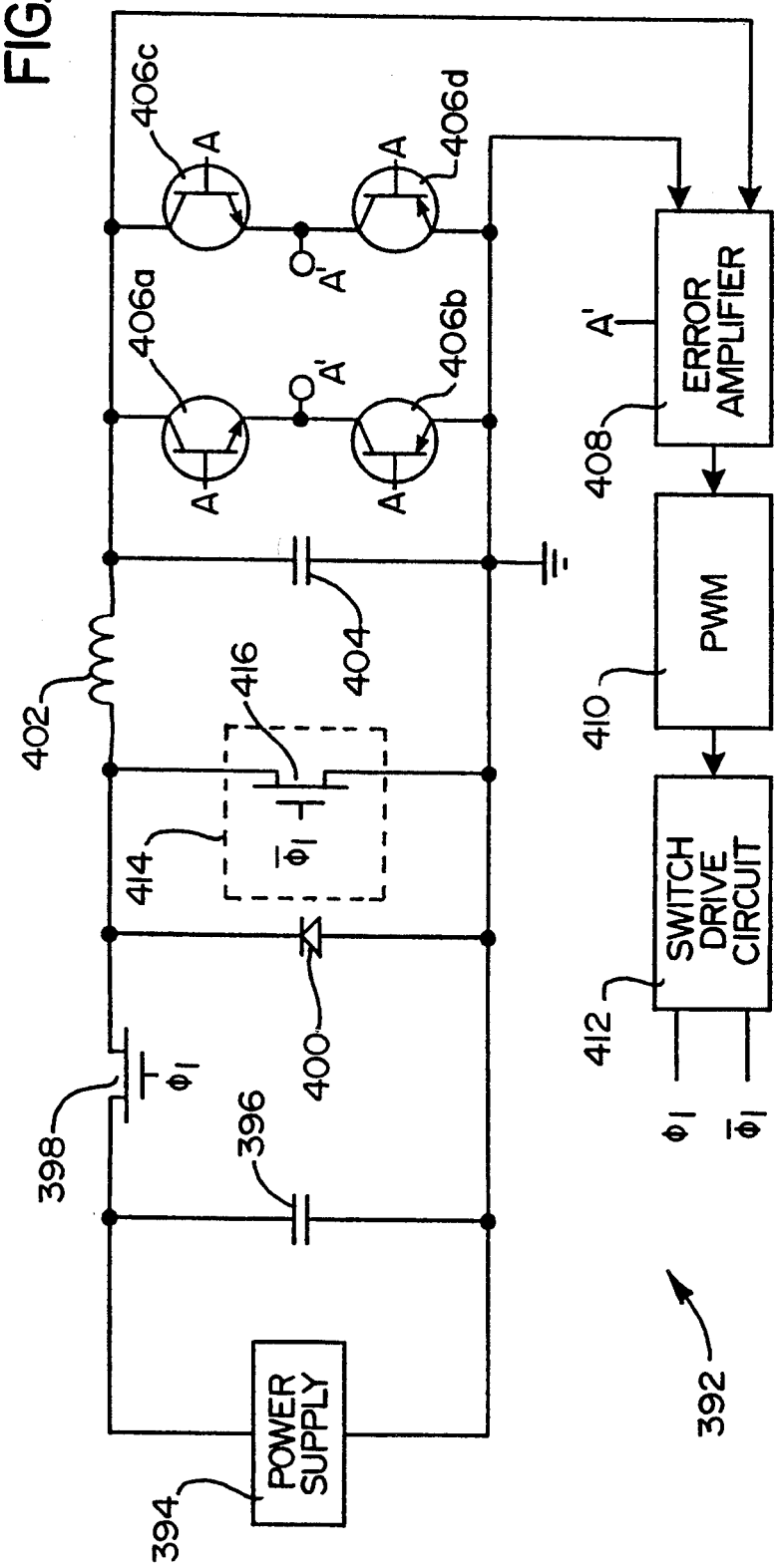

Depicted at 392 in FIG. 17 is yet another exemplary amplifier that implements the principles of the present invention. This amplifier 392 is a single ended envelope tracker that amplifies a single audio frequency signal A to obtain an amplified audio frequency signal A′. The amplifier 392 does not exactly correspond to any of the basic configurations depicted in FIGS. 4-6, but illustrates the flexibility and broad range of amplifier configurations in which the present invention can be employed.

The amplifier 392 basically comprises a power supply 394, a supply capacitor 396, switch 398, freewheeling diode 400, inductor 402, output capacitor 404, output transistors 406a, 406b, 406c, and 406d, an error amplifier 408, a pulse width modulator 410, a switch drive circuit 412, and a discharge element 414 comprising a switch 416.

The power supply 394 generates a fixed positive DC voltage across the supply capacitor 396. The switch 398 is controlled by a drive signal $\phi_1$ such that the switch 398, diode 400, inductor 402, and output capacitor 404 generate a supply voltage across the output transistors 406a, 406b, 406c, and 406d. To ensure that the output capacitor 404 is discharged, the discharge switch 416 is closed whenever the inverter switch 398 is opened. Again, the discharge element 414 will discharge the output capacitor 404 to prevent floating of the supply voltage.

With envelope trackers such as those shown at 346 and 392 in FIGS. 16 and 17 and discussed above, the voltage difference across the output devices is able to reach the maximum swing of the audio frequency signal without clipping plus the offset selected. The elimination of floating will thus not decrease the voltage rating of the output devices.

However, the elimination of floating will result in less dissipation in the output devices, which will yield the following benefits: (a) lower heat sinking capabilities being built into the amplifier; (b) lower power ratings for the output devices; and (c) allowing a reduction in size of other components in the amplifier such as the transformer, which would otherwise need to be larger to handle the power otherwise dissipated in the output devices.

To review briefly then, as shown in FIGS. 7-12 and 15-17 the present invention can be implemented in numerous amplifier configurations; in the interests of clarity and brevity, not all such configurations are discussed herein. However, it should be clear that the present invention can be employed to optimize the operation of a wide range of audio frequency amplifiers given such factors as the desired power rating and intended operating environment of the amplifier. The exemplary amplifier circuits depicted herein are intended to indicate the scope of the present invention, and the scope of the present invention should not be limited to the circuits described herein.

j. Tenth Embodiment

Figure 18:
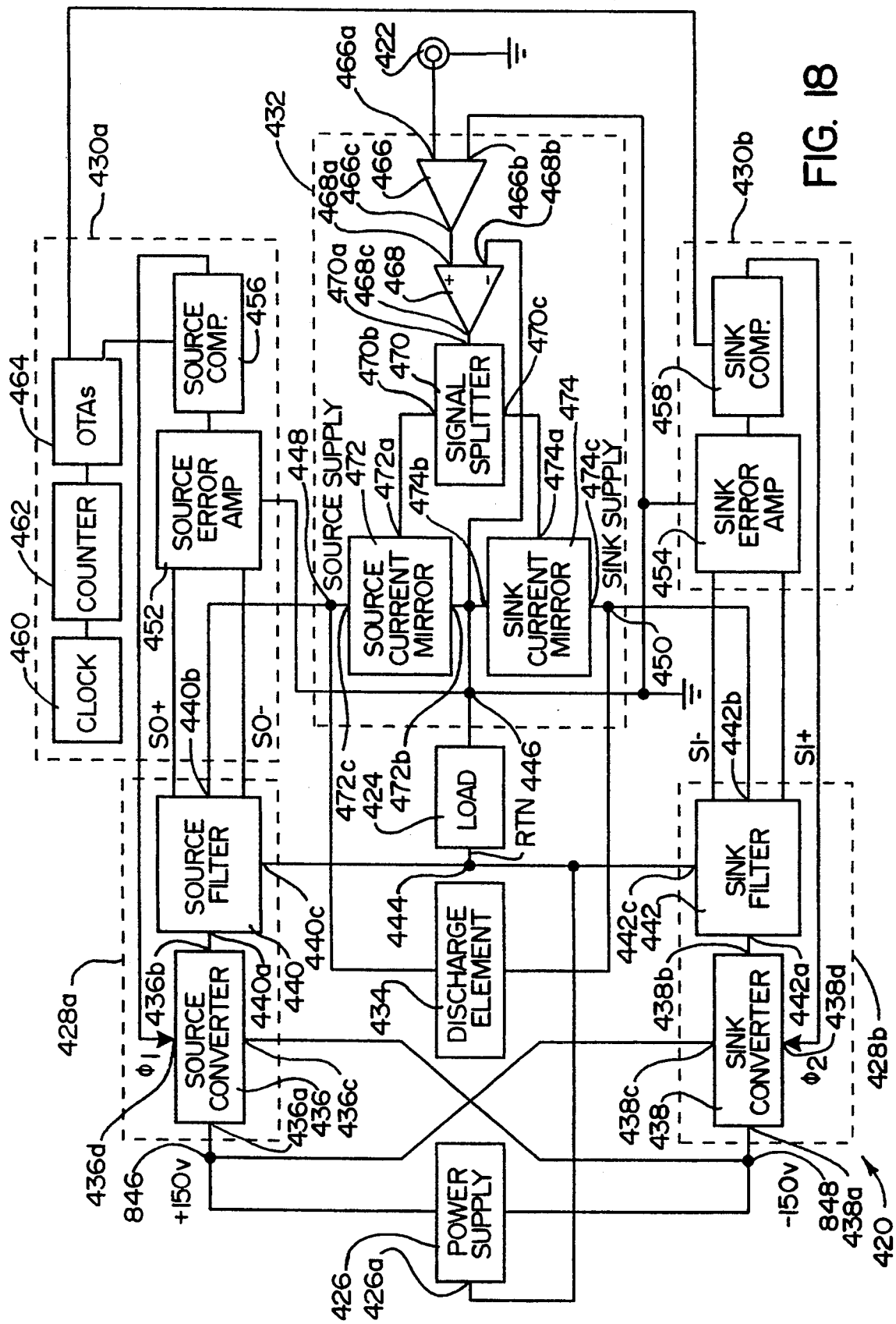
FIG. 18 contains a detailed block diagram of an audio frequency amplifier illustrating a tenth embodiment of the present invention.

Referring now to FIG. 18, depicted therein is a detailed block diagram of a high efficiency, high power audio frequency amplifier 420 constructed in accordance with, and embodying, a tenth embodiment of the present invention. This amplifier 420 is a class BD amplifier having a rail-to-rail tracking power supply and basically corresponds to the basic amplifier configuration illustrated in FIG. 4 above.

The amplifier 420 amplifies an audio frequency signal present at an input terminal 422 and generates a high power amplified audio frequency signal for driving a load 424. It should be noted that the exemplary amplifier 420 will amplify only one channel of a stereo audio frequency program, and thus significant portions thereof must be duplicated to obtain a commercial stereo amplifier.

Importantly, application of the principles of the present invention allow this amplifier 420 to be constructed without a high voltage preamplification stage, and the absence of such a high voltage preamplification stage should be noted.

The block diagram depicted in FIG. 18 provides a broad overview of construction of the amplifier 420. While the general operation of the amplifier 420 will be discussed with reference to FIG. 18, each of the blocks of the diagram depicted in FIG. 18 will be discussed below in further detail.

The amplifier 420 basically comprises: (a) a power supply 426; (b) a switched converter circuit 428a,b; (c) a control circuit 430a,b for driving the converter circuit 428a,b; (d) a low voltage, high current (LVHC) amplifier 432; and (c) a discharge element 434.

The power supply 426 generates fixed positive and negative DC voltages. As shown in FIG. 18, these voltages are +150 volts and −150 volts in the exemplary amplifier 420.

Each of the converter circuits 428a,b comprises a switch converter, identified by reference characters 436 and 438, and a filter, identified by reference characters 440 and 442.

The source and sink switch converters 436 and 438 have input terminal 436a and 438a, output terminals 436b and 438b, reference terminals 436c and 438c, and drive terminals 436d and 438d. The positive and negative DC voltages generated by the power supply 426 are applied to the input terminals 436a and 438a. The reference terminals 436c and 438c are cross-coupled such that the rectifier circuit 428a,b forms a rail-to-rail tracking power supply; more specifically, the source converter reference terminal 436c is connected to the sink converter input terminal 438a, while the sink converter reference terminal 438c is connected to the source converter input terminal 436a. As will be described in further detail below, the converter drive terminals 436d and 438d are connected to the control circuits 430a and 430b, respectively.

The source and sink filters 440 and 442 have input terminals 440a and 442a, output terminals 440b and 442b, and reference terminals 440c and 442c. The switch converter output terminals 436b and 438b are connected to the filter input terminals 440a and 442a.

The load 424 is connected between a load reference terminal 444 and a load output terminal 446. The filter reference terminals 440c and 442c are connected to the load reference terminal 444. This load reference terminal 444 is further connected to a center tap 426a of the power supply 426. As will be discussed in further detail below, the filter output terminals 440b and 442b are connected to source supply and sink supply terminals 448 and 450 of the LVHC amplifier 432.

The filters 440 and 442 further have sense terminals S0+ and S0− and S1+ and S1−. The source filter terminals S0+ and S0−, sink filter terminals S1+ and S1−, and filter output terminals 440b and 442b are connected to the control circuit 430a,b.

Referring now to the control circuit 430a,b, this circuit comprises source and sink error amps 452 and 454, source and sink comparator circuits 456 and 458, a clock circuit 460, a counter circuit 462, and an operational transconductance amplifier (OTA) circuit 464. The clock circuit 460 and counter circuit 462 provide a clock signal. The OTA circuit 464 generates two square wave current signals based on the clock signal generated by the clock circuit 460 and counter circuit 462. The comparator circuits 456 and 458 integrate these square wave current signals to obtain triangular waveform voltage signals and compare these triangular waveform voltage signals with source and sink error voltages generated by the source and sink error amps 452 and 454. The outputs of the comparator circuits 456 and 458 are the pulse-width modulated control signals $\phi_1$ and $\phi_2$ that are applied to the drive terminals 436d and 438d of the source and sink converter circuits 436 and 438. The generation of these signals $\phi_1$ and $\phi_2$ will be discussed in further detail below.

The LVHC amplifier 432 comprises a voltage error preamplifier 466, a transconductance amplifier 468, a signal splitting circuit 470, and source and sink current mirrors 472 and 474. An input terminal 466a of the preamplifier 466 is connected to the audio frequency input terminal 422, while a reference terminal 466b of the preamplifier 466 is connected to the load reference terminal 444.

An output terminal 466c of the preamplifier 466 is connected to an input terminal 468a of the transconductance amplifier 468. A reference terminal 468b of the transconductance amplifier 468 is connected to the load output terminal 446, while an output terminal 468c thereof is connected to an input terminal 470a of the signal splitter circuit 470.

Output terminals 470b and 470c of the signal splitter 470 are connected to drive terminals 472a and 474a of the source and sink current mirrors 472 and 474, respectively. Reference terminals 472b and 474b of the current mirrors 472 and 474 are connected to the load reference terminal 446, while supply terminals 472c and 474c thereof are connected to the source supply terminal 448 and sink supply terminal 450, respectively.

As just described, the LVHC amplifier 432 is a transconductance amplifier operated with feedback. The LVHC amplifier 432 thus yields a voltage amplifier with output impedance inversely proportional to transconductance (or, more generally, transadmittance).

In particular, the transconductance amplifier 468 converts an input/output voltage difference between the voltage at the output terminal 466c of the preamplifier 466 and the voltage at the load output terminal 446 into a drive current. The signal splitter circuit 470 splits the drive current into source and sink drive currents, providing additional bias current to these source and sink drive currents. This results in the LVHC amplifier 432 operating as a class AB non-switching amplifier.

The source and sink drive currents are then amplified by the source and sink push-pull current mirrors 472 and 474 to produce large scale class AB source and sink supply currents. These source and sink supply currents are combined at the load output terminal 446 to produce an output current that is proportional to the input/output voltage difference at the transconductance amplifier 468.

Figure 19A:
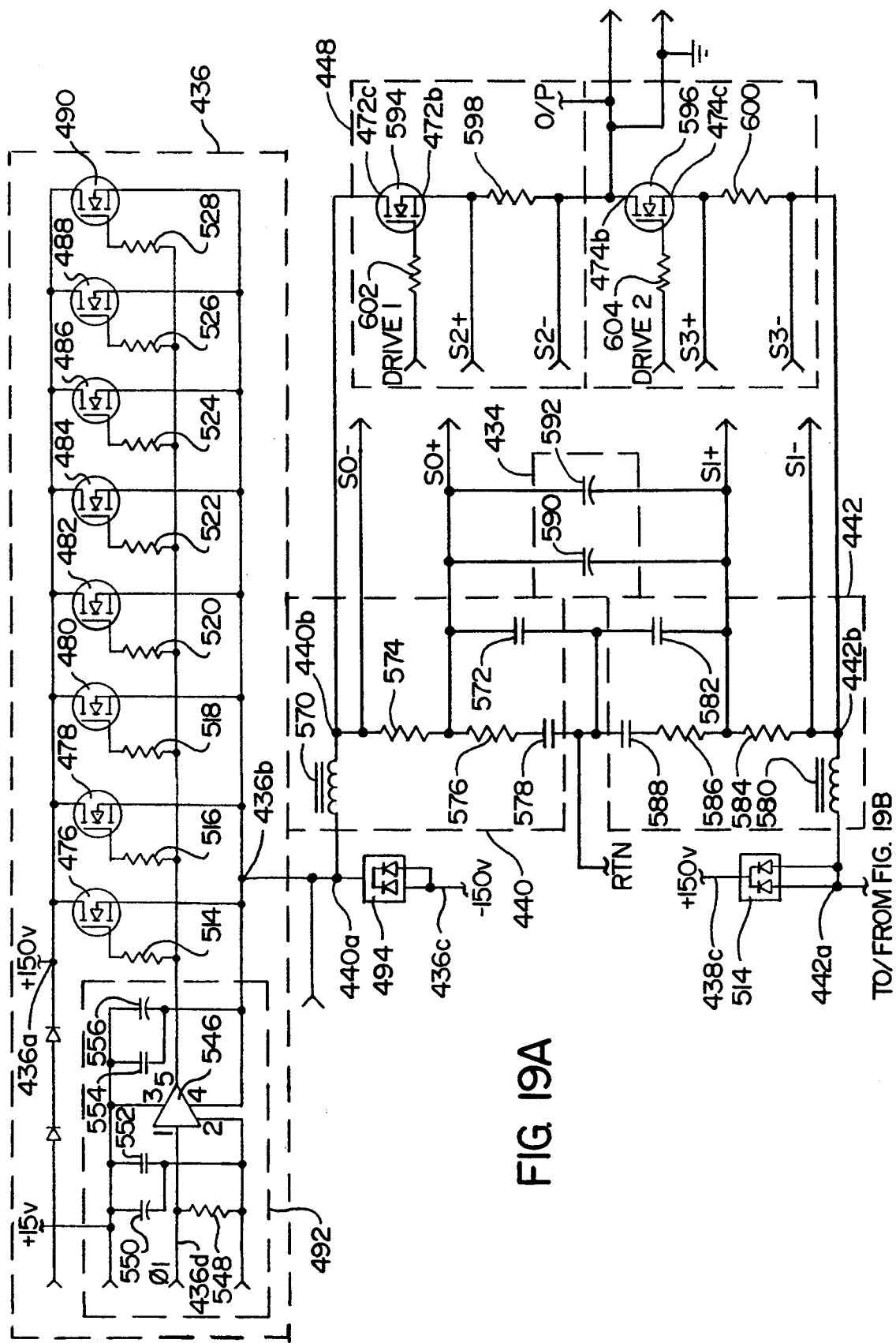
Figure 20:
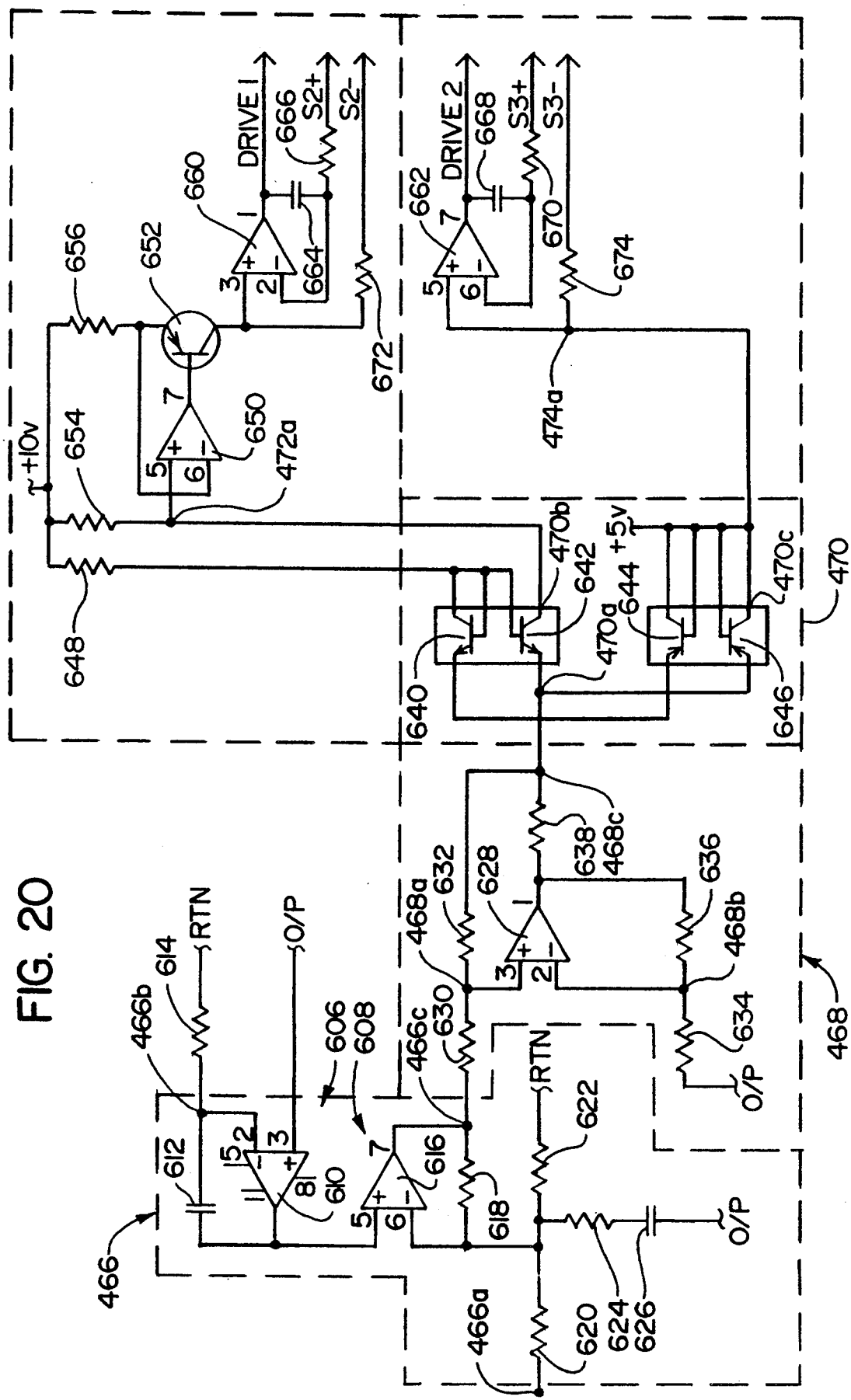
Figure 21A:
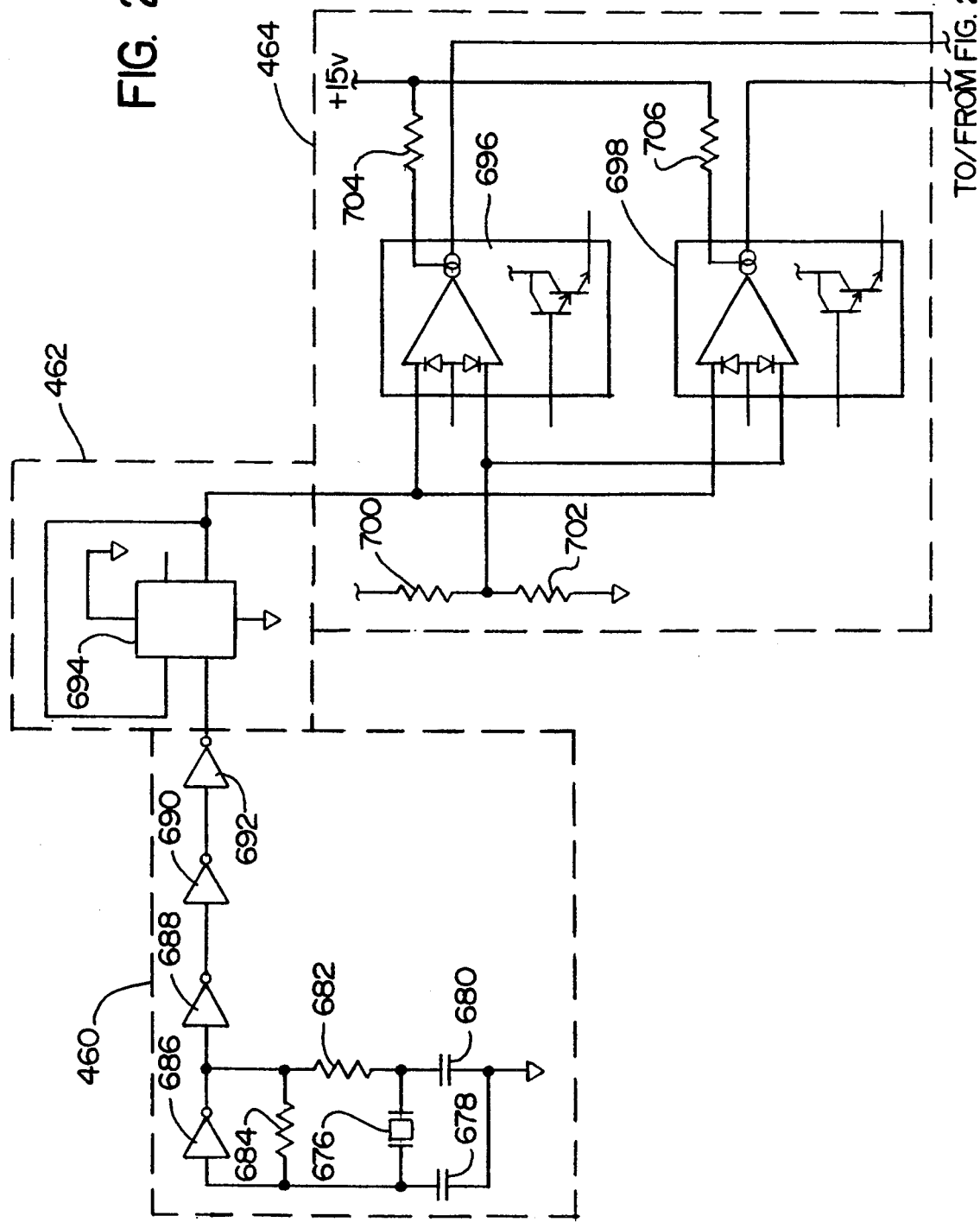
Figure 21D:
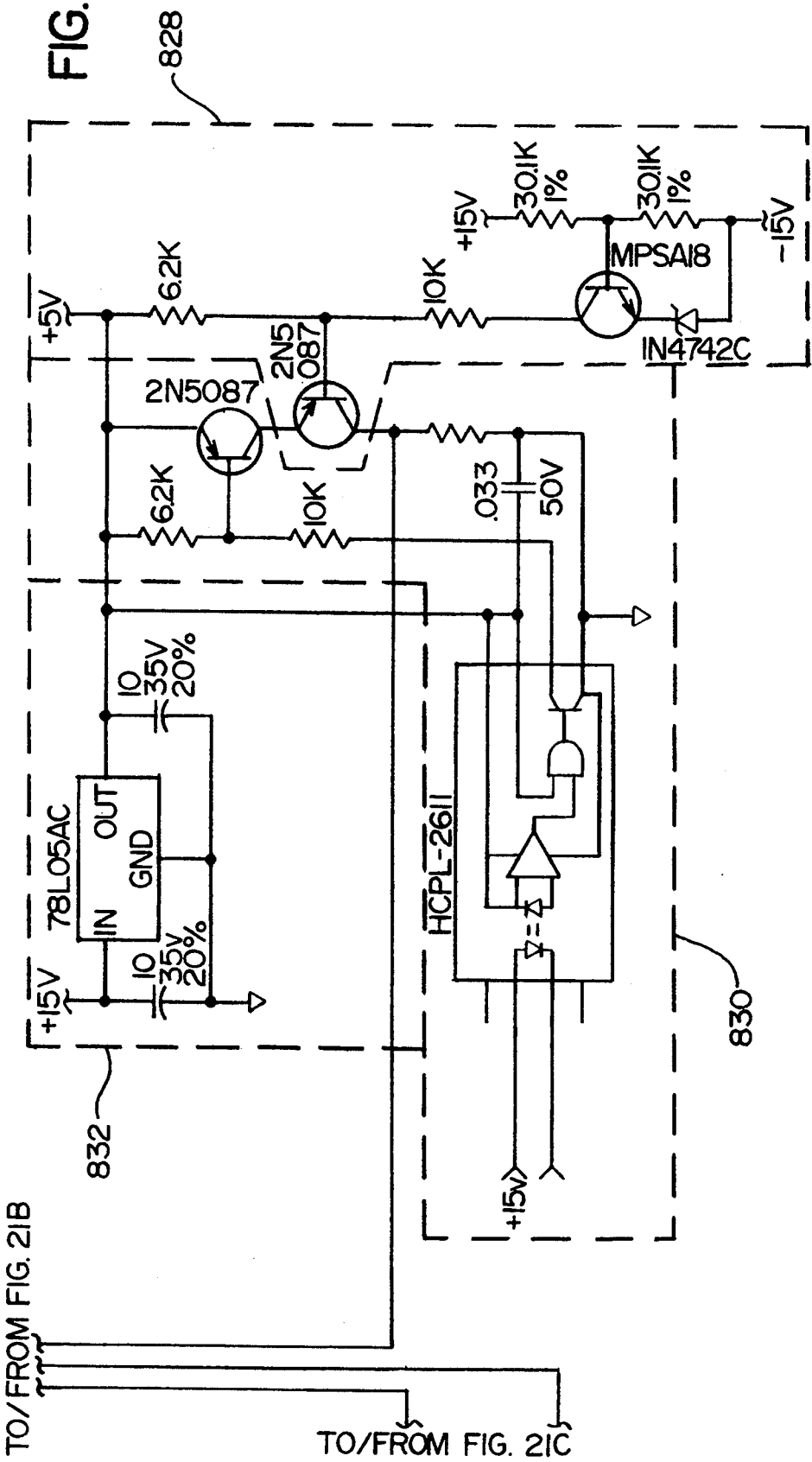

Referring now to FIGS. 19–22, the construction and operation of the amplifier 420 will be described in further detail. FIG. 19 depicts the discharge element 434, the source and sink converters 436 and 438, the source and sink filters 440 and 442, and portions of the LVHC amplifier 432. FIG. 20 depicts the remaining portions of the LVHC amplifier 432. FIG. 21 depicts the details of the control circuit 430a,b.

As shown in FIG. 19, the source converter circuit 436 comprises a plurality of n-channel MOSFETs 476–490, a source drive circuit 492, and a source rectifier 494, while the sink converter circuit 438 comprises a plurality of n-channel MOSFETs 496–510, a sink drive circuit 512, and a sink rectifier 514. Associated with each of the MOSFETs 476–490 and 494–508 is a damping resistor to provide damping of possible parasitic oscillations; these damping resistors are identified by reference characters 514–544.

The source MOSFET drive circuit 492 comprises a gate driver 546, a resistor 548, and capacitors 550, 552, 554, and 556. The gate driver 546 provides the gate drive voltage and current necessary to turn the MOSFETs 476–490 ON and OFF according to the signal $\phi_1$ applied to its input. The resistor 548 forces the driver to generate an OFF command should an open circuit occur across pins 1 and 2 of the gate driver 546. The capacitors 550–556 are supply bypass capacitors that provide a low impedance path to ground for high frequency signals present on the supply voltage for the gate driver 546. The sink MOSFET drive circuit 512 similarly comprises a gate driver 558, a resistor 560, and capacitors 562, 564, 566, and 568. The sink MOSFET drive circuit 512 operates in the same manner as the source MOSFET drive circuit 492 to turn the sink MOSFETs 496–510 ON and OFF according to the drive signal $\phi_2$ applied to pin 1 of the gate driver 558.

In the exemplary audio frequency amplifier 420, the rectifiers 494 and 514 comprise a pair of free-wheeling diodes connected in parallel. The cathodes of the free-wheeling diodes that comprise the source rectifier 494 are connected to the output terminal 436b of the source converter circuit 436, while the anodes of these diodes are connected to the input terminal 438a of the sink converter circuit 438. The anodes of the diodes that form the sink rectifier 514 are connected to the sink converter circuit output terminal 438b and the cathodes of these diodes are connected to the source converter input terminal 436a. This is what is referred to herein as cross-coupling of the reference points and allows the amplifier 420 to operate as a rail-to-rail tracker. The cross-coupled rectifiers 494 and 514 allow current to flow between the power supply 426 and the conducting output device.

The source filter 440 comprises a source inductor 570, a source output capacitor 572, a source sense resistor 574, a damping resistor 576, and a damping capacitor 578.

The inductor 570 and output capacitor 572 form a low-pass filter having a cut-off point of approximately 50–60 KHz.

The sense resistor 574 is provided to obtain a voltage analog of the current flowing through the inductor 570. The signals S0+ and S0− discussed briefly above are measured on either side of the resistor 574 and are used by the source error amplifier 452 as will be described in further detail below. The resistor 576 and capacitor 578 form a damping network that reduces ringing of the filter 440.

The sink filter 442 comprises a sink inductor 580, a sink output capacitor 582, a sink sense resistor 584, a damping resistor 586, and a damping capacitor 588. The sink filter 442 operates in the same basic manner and has substantially the same characteristics as the source filter 440 and will not be discussed in further detail herein.

The discharge element 434 comprises first and second discharge capacitors 590 and 592 connected in parallel across the output capacitors 572 and 582 in the exemplary amplifier 420. So arranged, the discharge capacitors 590 and 592 create a path for discharging the output capacitors 572 and 582 to prevent floating of the source and sink supply voltages present at the output terminals 440b and 442b of the filters 440 and 442.

Moving now to the right edge of FIG. 19, shown therein are the main output devices of the amplifier 420. In particular, a source MOSFET is indicated by reference character 594, while a sink MOSFET is shown at 596. It should be noted that these output devices 594 and 596 are both n-channel MOSFETs in the exemplary amplifier 420. This is possible because additional circuitry is provided for the source MOSFET 594 as will be discussed with reference to FIG. 20. The use of two n-channel MOSFETs with additional circuitry to provide the proper polarity to the source MOSFET 594 is desirable at the present time because p-channel MOSFETs are currently significantly more expensive than n-channel devices. However, should the price differential between n-channel and p-channel MOSFETs be eliminated, the use of complimentary p-channel and n-channel MOSFETs as the output devices 594 and 596 may be preferable because complimentary MOSFETs would yield a reduced parts count and less circuit complexity.

The source and sink MOSFETs 594 and 596 form the hole of the source current mirror 472 and sink current mirror 474, respectively. The reference and supply terminals 472b and 472c of the source current mirror 472 are the drain and supply of the source MOSFET 594, respectively, while the reference and supply terminals 474b and 474c of the sink current mirror 474 is the source of the sink MOSFET 596.

Additionally, however, the source and sink current mirrors 472 and 474 comprise sense resistors 598 and 600 arranged in series with the source and sink MOSFETs 594 and 596. Voltages S2+ and S2− are detected on either side of the sense resistor 598, and voltages S3+ and S3− are detected on either side of the sense resistor 600. The purpose of the voltages detected across the sense resistors 598 and 600 will be discussed in detail during the discussion of FIG. 20.

Resistors 602 and 604 are damping resistors that are connected to the gates of the MOSFETs 594 and 596 to suppress possible parasitic oscillations.

Referring now to FIG. 20, the remaining portions of the LVHC amplifier 432 will now be discussed. The preamplifier 466 comprises an offset servo amplifier circuit 606 and an input error amplifier circuit 608. The offset servo amplifier circuit 606 comprises an operational amplifier 610, capacitor 612, and resistor 614. The capacitor 612, resistor 614, and operational amplifier 610 form an integrator circuit. The offset servo amplifier circuit 606 so configured operates at low frequencies only to eliminate offset in the audio frequency output signal RTN employed by the input error amplifier circuit 608.

The input error amplifier circuit 608 comprises an operational amplifier 616 and resistors 618, 620, 622, 624 and capacitor 626 associated therewith. The resistors 618, 620, and 622 set the closed loop gain of the circuit 608, while the resistors 620, 622, 624, capacitor 626, and operational amplifier 616 set the open loop gain of the circuit 608.

The transconductance amplifier circuit 468 comprises an operation amplifier 628 and associated resistors 630, 632, 634, 636 and 638 configured as a Howland current source. The resistors 630 and 632 provide positive feedback, while the resistors 634 and 636 provide negative feedback. The resistor 638 scales the current flowing out of the op amp 628.

The current flowing through the resistor 638 is split by the signal splitter 470. In particular, the signal splitter 470 comprises transistors 640, 642, 644, and 646 configured to generate two current signals from the current flowing out of the op amp 628 and drive the current mirrors 472 and 474. A resistor 648 determines the quiescent current in the transistors 640, 642, 644, and 646.

An operational amplifier 650 controls a transistor 652 to provide accurate current mirroring given that two n-channel MOSFETs 594 and 596 are used as output devices. Resistors 654 and 656 set the scaling ratio of the amplifier 650 and transistor 652 to one.

Operational amplifiers 660 and 662 generate signals DRIVE1 and DRIVE2 for driving the source and sink MOSFETs 594 and 596 employed as output devices. A capacitor 664 and resistor 666 provide frequency compensation to suppress oscillations in the op amp 660, while a capacitor 668 and resistor 670 perform the same function for the op amp 662. Resistors 672 and 674 are current scaling resistors.

Referring now to FIG. 21, the control circuit 430a,b will be described in further detail. The clock circuit 460 comprises a ceramic resonator 676, capacitors 678 and 680, resistors 682 and 684, and inverters 686, 688, 690, and 692. The ceramic resonator 676 generates a 1000 KHz signal. The capacitors 678 and 680 control high frequency gain, and the resistor 682 damps spurious signals generated by the resonator 676. The resistor 684 generates bias current for the inverter 686. The inverters 686–692 square up the signal generated by the clock circuit 460 to obtain a stable square wave clock signal having a frequency of 1000 KHz.

The clock signal is sent to the counter circuit 462, which comprises a flip flop 694 configured as a divide by two counter. The output of the flip flop 694 is thus a square wave clock signal having a frequency of 500 KHz.

This 500 KHz clock signal is then passed to source and sink operational transconductance amplifiers (OTAs) 696 and 698 that comprise the OTA circuit 464. The OTAs 696 and 698 generate square wave current signals corresponding to the square wave clock signal input thereto. The OTA circuit 464 further comprises resistors 700 and 702 that establish a reference voltage for the OTAs 696 and 698 and resistors 704 and 706 that scale the current signals generated by the OTAs 696 and 698.

The square wave current signals generated by the OTAs 696 and 698 are sent to the source and sink comparator circuits 456 and 458, respectively. These square wave current signals are employed to generate one of the two signals input to the comparator circuits 456 and 458. The other signals input to these comparator circuits 456 and 458 are source and sink error signals generated by the source and sink error amplifiers 452 and 454. Further discussion of the comparator circuits 456 and 458 will be delayed until a discussion of the source and sink error signals can be presented.

Depicted in detail FIG. 21 are the source and sink error amplifiers 452 and 454. As shown in that figure, the source and sink error amplifiers 452 and 454 of the exemplary amplifier 420 each comprise a voltage error amplifier and a current error amplifier. In,particular, operational amplifiers 708 and 710 and their associated circuitry form source and sink voltage error amplifiers 712 and 714, while operational amplifiers 716 and 718 and their associated circuitry form source and sink current error amplifiers 720 and 722.

In general, the voltage error amplifiers compare the source and sink supply signals with reference signals that are offset by a predetermined value above and below, respectively, the audio frequency output signal at terminal 446. Voltage error signals so generated are employed as command signals for the current error amplifiers. The current error amplifiers generate current error signals based on: (a) the voltage error signals generated by the voltage error amplifiers; and (b) voltage signals that are analogs of the currents flowing through the inductors 570 and 580 of the source and sink filters 440 and 442. Current error signals generated by the current error amplifiers are sent to comparators 452 and 454 to develop the pulse width modulated drive signals $\phi_1$ and $\phi_2$ employed to drive the source and sink converters 436 and 438.

The source and sink error amplifiers 452 and 454 as just-described perform what is commonly referred to as current mode control to generate the source and sink error signals. Current mode control achieves first order control of the system, resulting in a tightly regulated feedback loop that increases system stability and causes the source and sink supply signals closely to track the audio frequency output signal. However, an operable audio frequency amplifier may be constructed according to the principles of the present invention without such current mode control. For example, a system could be developed that generates the drive signals $\phi_1$ and $\phi_2$ based solely on the voltage error signal generated by the voltage error amplifier.

Referring again to FIG. 21, the source and sink error amplifiers 452 and 454 will now be described in detail. The voltage error amplifier 712 comprises the op amp 708, resistors 724, 726, 728, 730, and 732, and capacitor 734. Resistors 724, 726, 728 and capacitor 734 set the gain of the voltage error amplifier 712. Resistors 732 and 730 form a voltage divider that determines the amount of offset that the source supply signal is set above the audio frequency output signal.

One input to the voltage error amplifier 712 is grounded. The other input to the error amplifier 712 is the sense voltage SO−, which is also the source supply signal. Accordingly, the command input to the voltage error amplifier 712 is zero volts, and the equilibrium point of this amplifier 712 occurs when the source supply signal S0− offset by −5 volts equals equals zero volts. A source voltage error signal generated by the source voltage error amplifier 712 is present at terminal 1 of the op amp 708.

Referring now to the source current error amplifier 720, this current error amplifier 720 comprises the op amp 716, resistors 736, 738, 740, and capacitors 742, 744, 746. The resistors 736, 738, 740 and capacitors 742, 744, 746 set the gain of the current error amplifier 720.

The command input to the current error amplifier 720 is the source voltage error signal generated by the source voltage error amplifier 712. The other input to the current error amplifier 720 is the difference between the signals S0+ and S0−, which corresponds to the voltage across the source sense resistor 574 depicted in FIG. 19. The difference between S0+ and S0− is an analog of the current through the inductor 570 shown in FIG. 19. The current error signal generated at the output terminal 1 of the current error amplifier 720 is the difference between: (a) the voltage error signal; and (b) the voltage across the sense resistor 574. The equilibrium point of this error amplifier 720 occurs when the current error signal generated thereby equals the voltage error signal.

The source current error signal generated by the source current error amplifier 420 is sent to the source comparator circuit 456. The source comparator circuit 456 comprises a comparator 748, resistors 749, 750, 752, 754, and capacitor 756. The capacitor 756 integrates the square wave current signal generated by the source OTA 696 to obtain a source triangle wave voltage reference signal. The comparator 748 output is HIGH when the level of the source current error signal is greater than that of the source triangle wave voltage reference signal and LOW when the level of the source current error signal is less than that of the source triangle wave voltage reference signal.

The output of the comparator 748 is thus a pulsed signal having a frequency of 500 KHz, where the width of the pulses thereof are increased and decreased according to the magnitude of the source current error signal. This pulsed signal at the output of the comparator 748 is the source drive signal $\phi_1$ discussed above.

Resistor 749 provides bias current for the comparator 748. Resistors 750 and 752 provide hysteresis to the comparator 748 to square up the output thereof. Resistor 754 scales the output current of the comparator 748.

The sink error amplifier 454 is constructed and operates in the same basic fashion as the source error amplifier 458 and will be described only briefly herein. The sink voltage error amplifier 714 comprises the op amp 710, resistors 758, 760, 762, 764, 766, and capacitor 768. The resistors 758-62 and capacitor 768 set the gain of the amplifier 714, while the resistors 764 and 766 form a voltage divider that establishes a +5 volt offset. The audio frequency output signal RTN is thus compared with the sink supply voltage raised by five volts to generate a sink voltage error signal at pin 7 of op amp 710.

The sink current error amplifier 722 comprises the op amp 718, resistors 770, 772, 774, and capacitors 776, 778, 780. The resistors 770, 772, 774 and capacitors 776, 778, 780 set the gain of the current error amplifier 722. The sink current error signal is present at pin 7 of the op amp 718.

The sink comparator circuit 458 functions in the same basic manner as the source comparator circuit 456 described above but further comprises an inverter circuit to reverse the polarity of the sink current error signal. In particular, the sink comparator circuit 458 comprises: (a) an operational amplifier 782 configured as an inverter by resistors 784 and 786 associated therewith; and (b) a comparator 788 having resistors 790, 792, 794, 796 and capacitor 798 associated therewith to create hysteresis.

The capacitor 798 integrates the square wave current signal generated by the sink OTA 698 to obtain a sink triangular wave reference signal. The sink current error signal is first inverted by the operational amplifier 782 and resistors 784 and 786 and then compared with the sink triangular wave reference signal. Resistor 790 provides bias current for the comparator 788. Resistors 792 and 794 provide hysteresis, while the resistor 796 scales the output current of the comparator 788.

The remaining circuitry shown in FIG. 21 provides isolation between the control circuit 430a,b and the switched converter circuit 428a,b and performs several supervisory functions.

In particular, a source isolation circuit 800 comprises an opto-coupler 802, resistors 804, 806, transistor 808, and diode 810. A sink isolation circuit 812 similarly comprises an opto-coupler 814, resistors 816, 818, transistor 820, and diode 822. The opto-couplers 802 and 814 provide physical isolation between the control circuit 430a,b and the converter circuit 428a,b. The transistors 808 and 820 and the components 804, 806, 810, 816, 818, 822 associated therewith invert the outputs of the opto-couplers 802 and 814 to yield the drive signals $\phi_1$ and $\phi_2$.

Shown at 824, 826, and 828 in FIG. 21 are first, second, and third under voltage lockout (UVLO) circuits. These UVLO circuits 824, 826, and 828 compare voltages at various test points throughout the amplifier 420 with reference voltages and prevents transmission of the drive signals $\phi_1$ and $\phi_2$ to the converter circuit 428a,b when the voltages at the test points are out of range. Another circuit indicated at reference character 830 allows a remote control to be used to prevent transmission of the drive signals $\phi_1$ and $\phi_2$ to the converter circuit 428a,b. This allows the amplifier 420 to be shut off by remote control. A circuit 832 provides a regulated voltage source for use by the circuits 828 and 830. These circuits 824, 826, 282, 830, and 832 are not essential to the operation of the present invention and will not be discussed in detail herein.

At this point, it should be emphasized that, in the exemplary circuit 420, the output terminal 446 is connected to ground and the return terminal 444 is allowed to follow the audio frequency signal as shown in FIG. 4 above. The source supply signal, sink supply signal, RTN signal, and O/P signal waveforms obtained with the exemplary LVHC amplifier 432 will correspond to those depicted in FIG. 13 above for a sinusoidal audio frequency signal.

Connected in this manner, all of the components within the LVHC amplifier 432 and the control circuit 430 associated therewith may be low voltage components and are referred directly to ground. Grounding the output terminal 446 increases the reproduceability of the amplifier 420 by eliminating the component matching that would otherwise be required if the control circuit 430a,b was output-referred.

Even with a more conventional grounding situation such as is shown in FIG. 6 above, however, the present invention would allow the use of the exemplary LVHC amplifier 432 and control circuit 430 described herein. In this case, the negative output terminal 446 will be ungrounded and will follow the audio frequency signal and the return terminal 444 will be connected to ground. With this more conventional grounding scheme, the components within the amplifier 432 and control circuit 430 will not be referenced to a ground, but will instead be referenced to the audio frequency output signal. Referring the control circuit 430a,b to the audio frequency output signal increases the reproduceability of the amplifier 420 by eliminating the component matching that would otherwise be required if the circuit 420 was conventionally grounded and the control circuit 430a,b was referred to ground.

Figure 22:
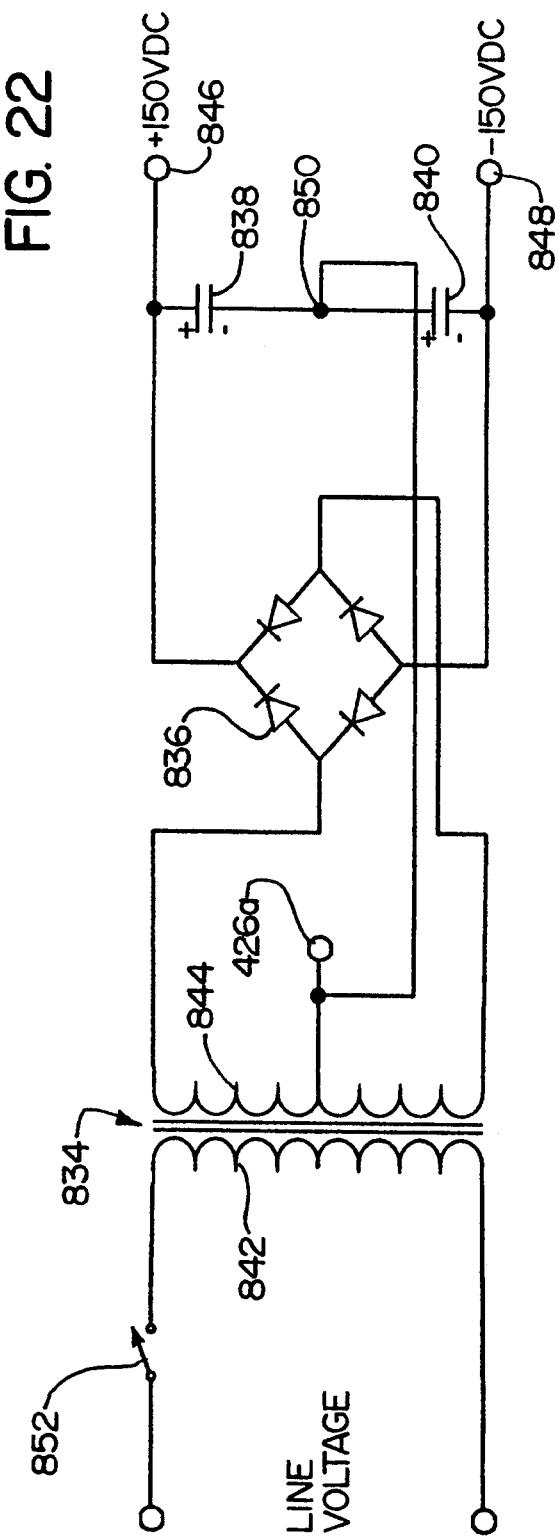

Referring next to FIG. 22, depicted therein are the details of construction of the power supply 426. This power supply 426 basically comprises a transformer 834, a diode bridge 836, and supply capacitors 838 and 840. AC line voltage is applied to primary windings 842 of the transformer 834. Secondary windings 844 of the transformer 834 are connected to the diode bridge 836 which rectifies the AC signal present on these secondary windings 844 to obtain positive and negative source voltages at positive and negative source terminals 846 and 848. The transformer secondary windings 844 have a center tap 426a connected to the load return terminal 444 as described above. A juncture 850 between the capacitors 838 is connected to the center tap 426a. A switch 852 allows the transformer 834 to be disconnected from the AC line voltage.

The transformer 834 so arranged provides isolation between the amplifier 420 and the AC line voltage and steps the AC voltage up or down as necessary to obtain desired DC voltages at the positive and negative source terminals 846 and 848.

One aspect of the exemplary amplifier 420 is that the drive control signals $\phi_1$ and $\phi_2$ are generated such that the source and sink supply signals reach maximum and minimum levels, respectively, that correspond to the point at which clipping will occur. In particular, the source and sink supply voltages are not free to track up to the +150 and −150 fixed DC supply voltages, but are instead limited in the exemplary amplifier 420 to approximately +75 volts and −75 volts. Thus, the audio frequency signal is clipped if it exceeds +75 volts or goes below −75 volts. The magnitude of the voltage level at which clipping occurs is referred to herein as the clipping level. Accordingly, the clipping level in the exemplary amplifier 420 is 75 volts.

The components shown in FIGS. 19–22 are more particularly identified in Table A attached hereto. Where important, Table A contains ranges or acceptable alternatives of each of the components listed therein.

k. Eleventh Embodiment

Figure 23:
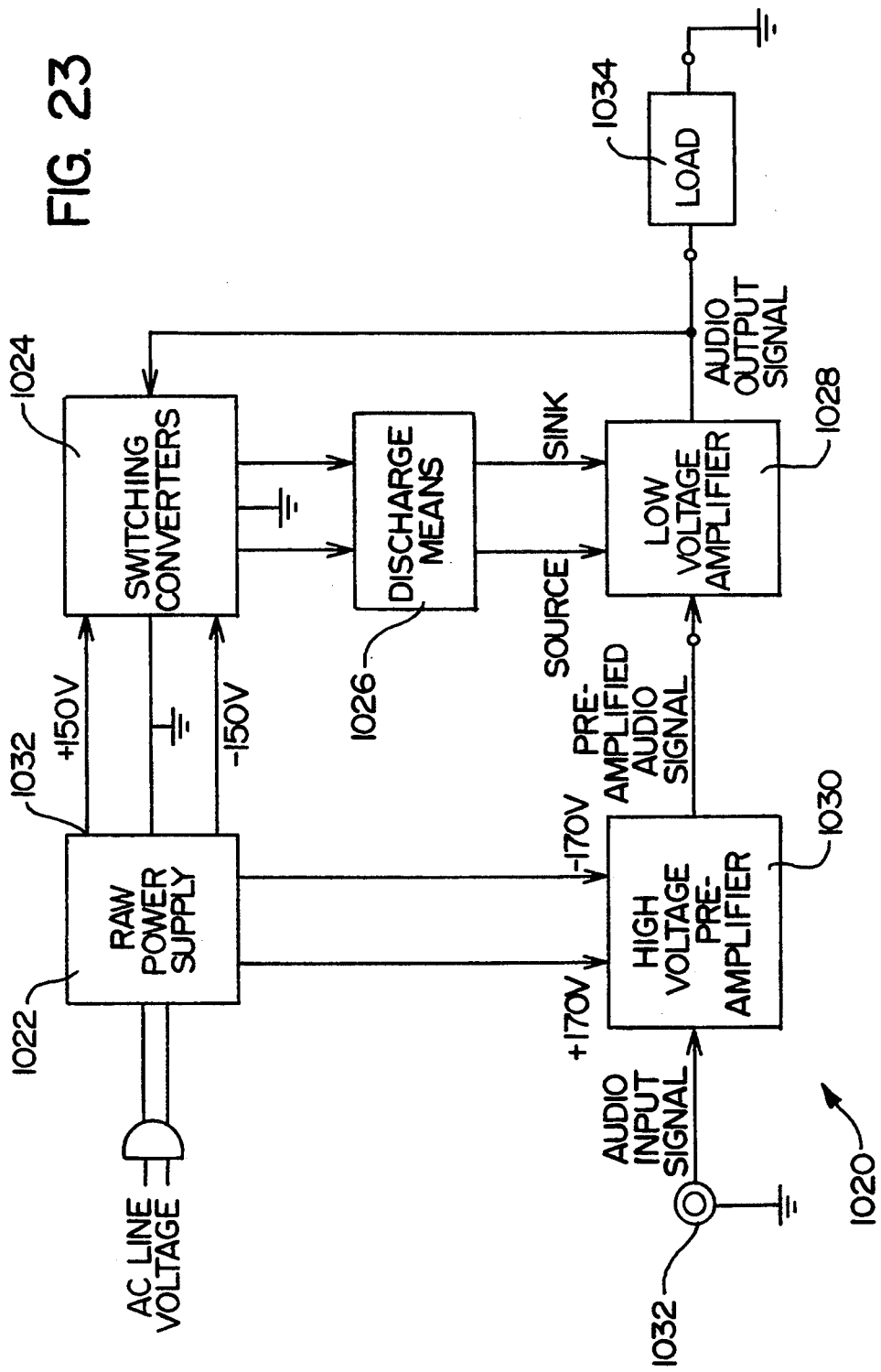
FIG. 23 contains a simplified block diagram of yet another exemplary audio frequency amplifier illustrating an eleventh embodiment of the present invention.

Another exemplary amplifier is depicted in block diagram form at 1020 in FIG. 23. This amplifier 1020 is a class BD amplifier having a rail-to-rail tracking power supply and would normally be configured to amplify a preamplied audio frequency signal generated by a conventional high voltage, low current preamplifier. In this respect, the amplifier 1020 corresponds in basic structure to the amplifier configuration illustrated in FIG. 6 above.

Accordingly, as shown in FIG. 23, this amplifier 1020 basically comprises a raw power supply 1022, a switching converter circuit 1024, a discharge circuit 1026, a low voltage high current amplifier (LVHC) 1028, and a high voltage low current (HVLC) preamplifier 1030. An audio frequency input signal present at an input terminal 1032 is amplified by the HVLC preamplifier 1030 to obtain a preamplified audio frequency signal. The LVHC amplifier 1028 amplifies the preamplified audio frequency signal to obtain an audio frequency output signal. The audio frequency output signal is delivered to a load 1034.

The raw power supply generates a first positive DC voltage and a second negative DC voltage for supplying power to the switching converter circuit 1024. The switching converter circuit circuit 1024 delivers power to the low voltage amplifier stage 1028 in the form of source and sink supply signals that track the audio frequency output signal. The raw power supply also generates a second DC voltage and a second negative DC voltage for supplying power to the HVLC amplifier 1030. The raw power supply 1022 and HVLC preamplifier 1030 are well known in the art and will not be discussed in detail herein.

Figure 24A:
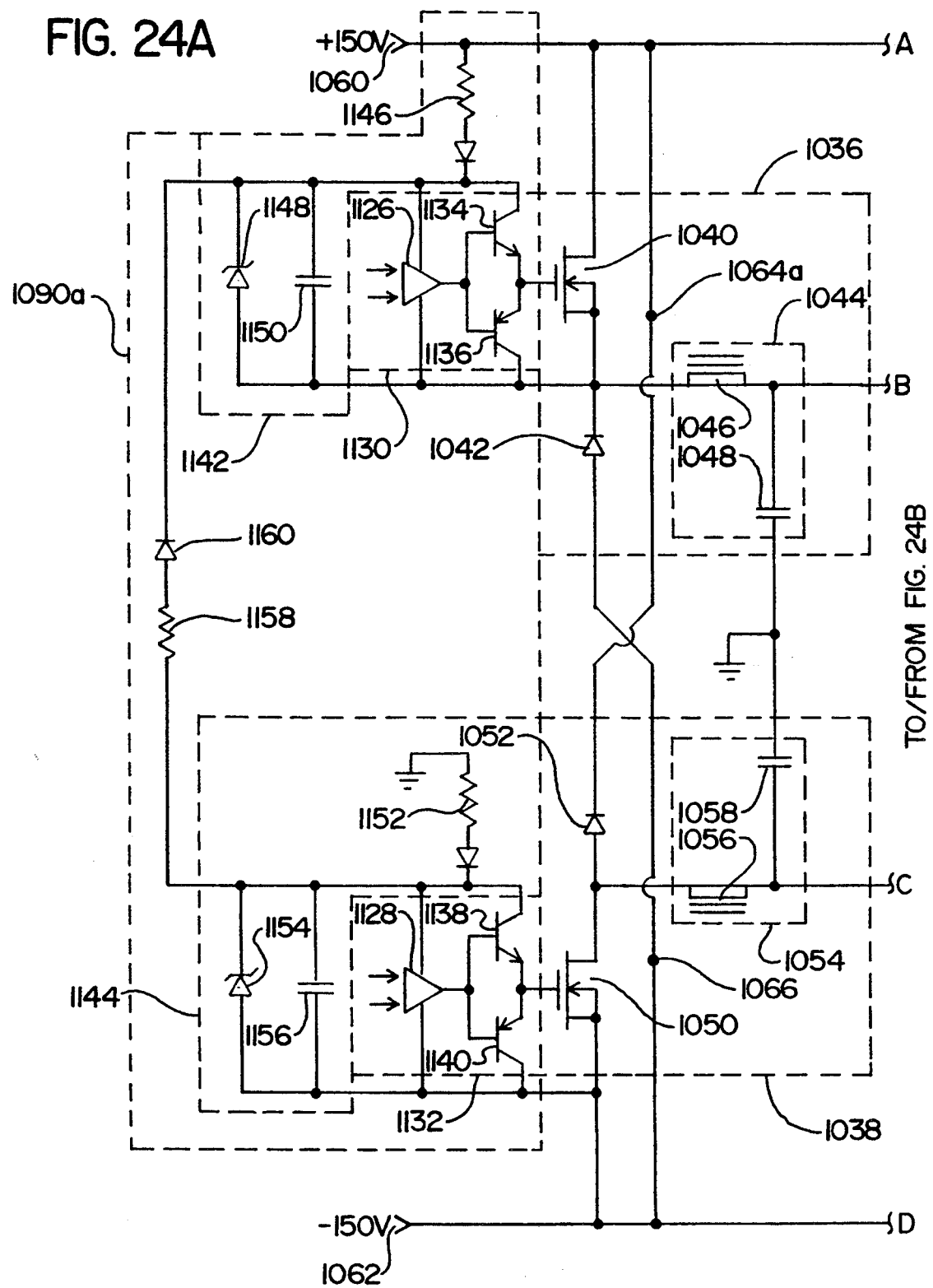
FIG. 24A–24C depict a detailed circuit diagram showing the details of construction of the amplifier depicted in FIG. 23.

Referring now to FIG. 24A, the switching converter circuit 1024, discharge element 1026, and LVHC amplifier 1028 will now be described in detail. The more important components in FIG. 24 will first be described, after which a more detailed discussion of the components shown in FIG. 24 will be presented.

The switching converter circuit 1024 comprises a source freewheeling rectifier circuit (source circuit) 1036 and a sink freewheeling rectifier circuit (sink circuit) 1038. The source circuit 1036 basically comprises a source switch 1040, a source freewheeling diode 1042, and a source low pass filter 1044 comprising an inductor 1046 and an output capacitor 1048. The sink circuit 1038 basically comprises a sink switch 1050, a sink freewheeling diode 1052, and a sink low pass filter 1054 comprising an inductor 1056 and an output capacitor 1058.

Figure 24B:
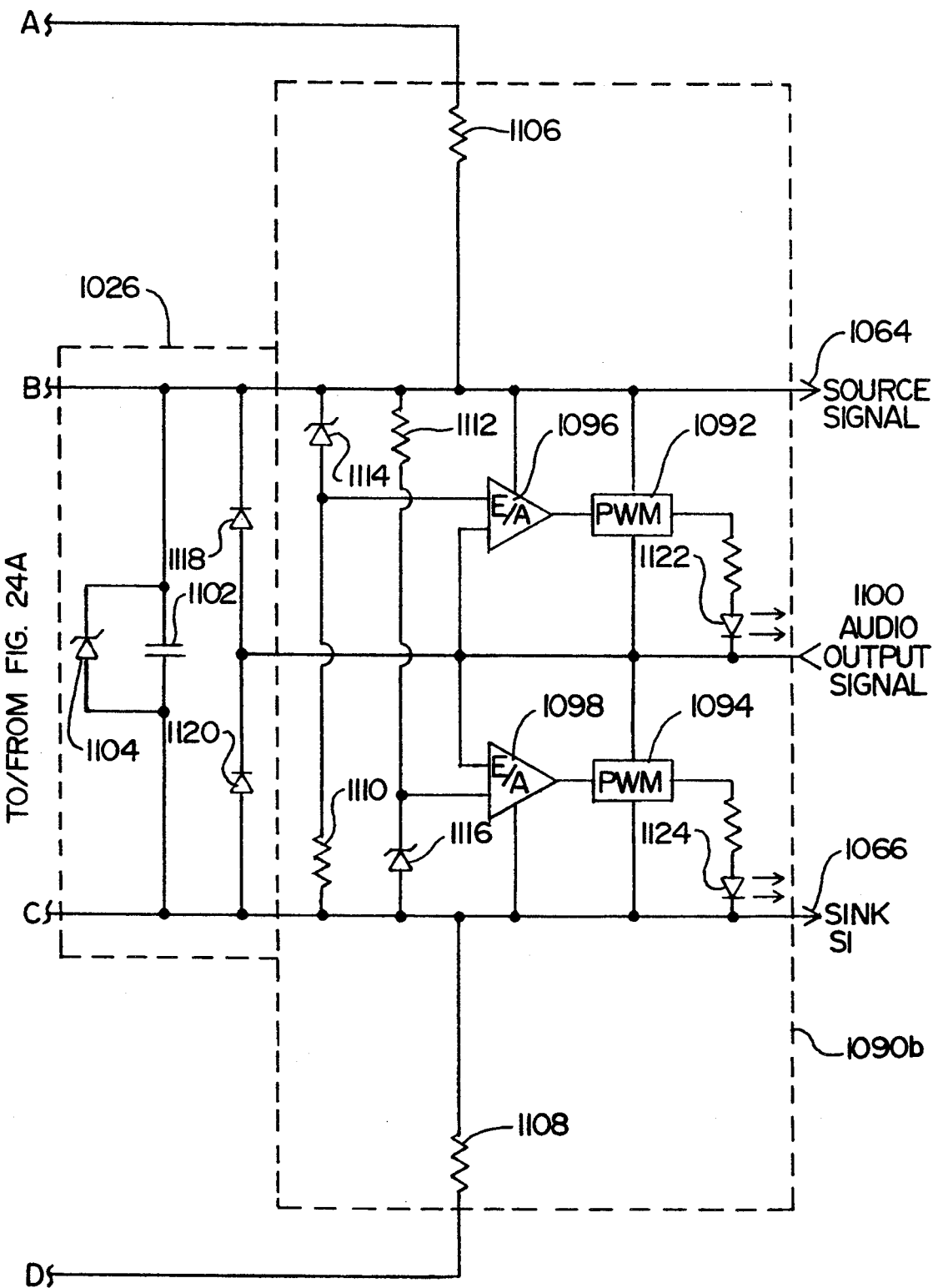

In FIG. 24A, positive and negative input terminals to the circuits 1036 and 1038 are identified at 1060 and 1062, source and sink output terminals thereof are identified at 1064 and 1066 in FIG. 24B, and source and sink references points thereof are identified at 1066a and 1064a in FIG. 24A, respectively. The input terminals 1060 and 1062 of the circuits 1036 and 1038 are connected to the raw power supply output terminals. The signals present at the source and sink output terminals 1064 and 1066 will be referred to as the source and sink supply signals, respectively.

Figure 24C:
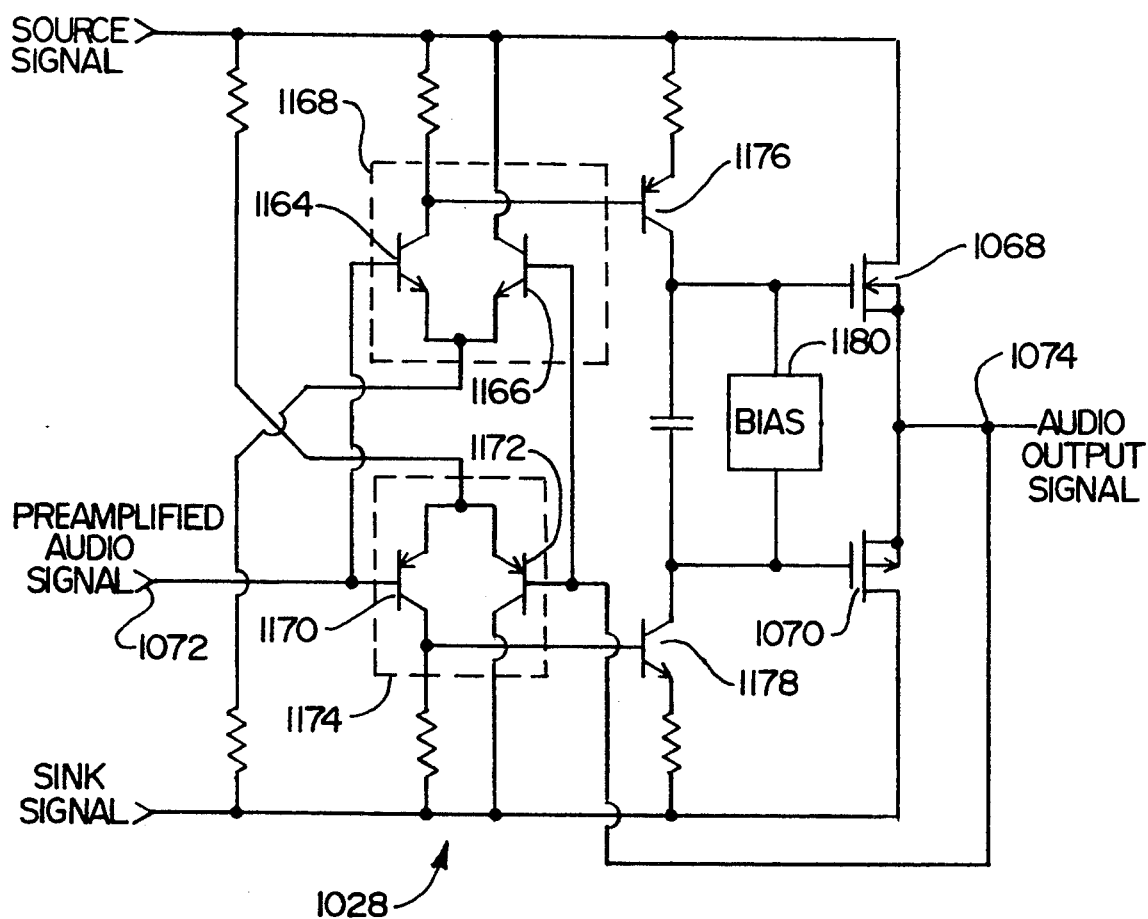

Referring now to FIG. 24C, the LVHC amplifier 1028 contains a positive transistor 1068 and a negative transistor 1070 arranged in a push-pull configuration and biased for class B operation. In the exemplary amplifier circuit 1020, the transistors 1068 and 1070 are complimentary MOSFETs. The output terminal 1064 of the source circuit 1036 is connected to the drain of the positive transistor 1068, while the output terminal 1066 of the sink circuit 1038 is connected to the drain of the negative transistor 1070.

The gates of the transistors 1068 and 1070 are connected through a drive circuit that will discussed in more detail below to a terminal 1072 at which the preamplified audio frequency signal is present. The sources of these transistors 1068 and 1070 are connected to an audio frequency output terminal 1074. The transistors 1068 and 1070 amplify the preamplified audio frequency signal to obtain an audio frequency output signal; the audio frequency output signal is present at the audio frequency output terminal 1074.

In the switching converter circuit 1020 just described, the reference points 1066a and 1064a are not connected to ground. Instead, the source reference point 1066a is connected to the sink rectifier input terminal 1062 (the negative terminal of the power supply 1022), and the sink reference point 1064a is connected to the source rectifier input terminal 1060 (the positive terminal of the power supply 1022). This arrangement is referred to as cross-coupling the rectifier reference points.

With the switching converter circuit 1024, the source supply signal is always a small predetermined voltage (approximately 5 volts in the exemplary circuit 1020) above the audio frequency output signal, even when the audio frequency output signal goes below zero volts. At the same time, the sink supply signal is always a small predetermined voltage (approximately 5 volts in the exemplary circuit 1020) below the audio frequency output signal, even when the audio frequency output signal goes above zero volts.

With the exemplary circuit 1020, the total voltage drop across the transistors 1068 and 1070 is thus never greater than approximately 10 volts. This 10 volt drop is substantially the minimum required to keep the transistors 1068 and 1070 out of saturation.

Referring again to FIG. 24, the remaining portions of the switching converter circuit 1024 and the LVHC amplifier 1028 will be now described in further detail. Also shown in FIG. 24A and 24B is a control circuit 1090 that generates the pulse modulated signal which operates the source and sink switches 1040 and 1050. The control circuit 1090 is identified by reference character 1090a in FIG. 24A and reference character 1090b in FIG. 24B.

The construction and operation of the control circuit 1090 will now be explained. Referring initially to FIG. 24B, depicted therein are first and second pulse width modulating circuits 1092 and 1094 and first and second E/A amplifiers 1096 and 1098. The modulating circuits 1092 and 1094 and amplifiers 1096 and 1098 may be similar to those employed by the control circuit 430a,b described above and will not be described in detail herein.

These components 1092–1098 are connected in feedback loops that generate first and second control signals. More particularly, the first E/A amplifier 1096 detects the difference between the source signal at terminal 1064 and the audio frequency output signal at a terminal 1100 and generates a first difference signal that controls the first PWM circuit 1092. The output of the first PWM circuit 1092 is the first control signal, which is essentially a pulsed periodic signal, where the widths of the pulses are controlled by the output of the first amplifier 1096.

In similar fashion, the second E/A amplifier 1098 detects the difference between the sink signal at the terminal 1066 and the audio frequency output signal at the terminal 1100 and generates a second difference signal that controls the second PWM circuit 1094. The output of the second PWM circuit 1094 is the second control signal; the second control signal is also a pulsed periodic signal, the widths of the pulses being controlled by the output of the second amplifier 1098.

In the exemplary circuit 1020, the frequency of the first and second pulsed signals is approximately 500 KHz, and the pulse widths of these signals vary under control of the first and second difference signals.

The discharge circuit 1026 comprises a locking capacitor 1102 connected between the source and sink terminals 1064 and 1066. This capacitor 1102 equalizes the voltages at the terminals 1064 and 1066 to discharge the source and sink output capacitors 1048 and 1058 when floating of the source and sink supply signals is likely to occur. As discussed above, the value of the locking capacitor 1102 must be significantly larger than the values of the capacitors 1048 and 1058; in particular, to operate successfully the value of the capacitor 1102 must be at least 100 times the value of the capacitors 1048 and 1058 and is approximately 1000 times the value of the capacitors 1048 and 1058 in the exemplary circuit 1020.

The discharge circuit 1026 also comprises a Zener diode 1104 connected in parallel across the locking capacitor 1102. The diode 1104 provides an additional guarantee that the voltage across the locking capacitor 1100 will not become too high and thus damage the LVHC amplifier 1028.

The control circuit 1090 further comprises resistors 1106, 1108, 1110, and 1112, Zener diodes 1114 and 1116, and diodes 1118 and 1120. The resistors 1106 and 1108 are connected between the input terminals 1060 and 1062 and the output terminals 1064 and 1066, respectively, to provide a small "start up" current to permit the system to start operating. Resistors 1110 and 1112 provide biasing currents to Zener diodes 1114 and 1116, respectively. The Zener diodes 1114 and 1116 maintain a five volt difference between the terminals 1064 and 1066 and the terminal 1100. Diodes 1118 and 1120 are connected between the terminals 1064 and 1066 and the terminal 1100, respectively, to ensure that the voltage at terminal 1064 cannot negative with reference to the voltage at terminal 1100 and the voltage at terminal 1066 cannot swing positive relative to the voltage at terminal 1100.

The LEDs 1122 and 1124 shown in FIG. 24B are illuminated according to the first and second control signals, respectively. The illumination of the LEDs 1122 and 1124 drive opto-couplers 1126 and 1128 shown in FIG. 24A.

The opto-couplers 1126 and 1128 are part of first and second switch drive circuits 1130 and 1132; these switch drive circuits 1130 and 1132 also comprise first through fourth driving transistors 1134, 1136, 1138, and 1140. The first and second driving transistors 1134 and 1136 are arranged in a complimentary configuration and are connected between the opto-coupler 1126 and the source switch 1040. The third and fourth driving transistors are similarly arranged in a complimentary configuration between the opto-coupler 1128 and the sink switch 1050.

First and second shunt regulator circuits 1142 and 1144 provide a regulated 15 volts to the switch drive circuits 1130 and 1132, respectively. The first regulator circuit 1142 comprises a resistor 1146, a Zener diode 1148, and a capacitor 1150. The second regulator circuit 1144 similarly comprises a resistor 1152, a Zener diode 1154, and a capacitor 1156.

A resistor 1158 and a diode 1160 are connected between the regulator circuit 1142 and 1144 to obtain current from the shunt regulator circuit 1144 to cause the Zener diode 1148 and capacitor 1150 of the shunt regulator circuit 1142 to operate.

The control circuit 1090 operates as follows. The E/A amplifiers 1096 and 1098 generate signals that indicate the difference between the audio frequency output signal and the source and sink supply signals, respectively. Based on the output of the E/A amplifiers, the PWM circuits 1092 and 1094 generate the first and second control signals so that the width of the pulses therein corresponds to the amplitude of the audio frequency output signal; in general, the higher the amplitude of the audio frequency output signal, the greater the pulse width of the first and second control signals.

The LEDs 1122 and 1124 turn ON and OFF as the first and second control signals go HIGH and LOW; the opto-couplers 1126 and 1128 in turn generate HIGH and LOW signals as the LEDs turn ON and OFF. The switch drive amplifiers 1134–1140 CLOSE and OPEN the source and sink switches 1040 and 1050 as the opto-couplers 1126 and 1128 generate HIGH and LOW signals.

The result is that the source switch is open a greater percentage of the switch period as the audio frequency output signal goes lower and is closed a greater percentage of the switch period as the audio frequency output signal goes higher. The sink switch operates in an opposite manner. This results in source and sink signals that closely track the rise and fall of the audio frequency output signal; that is, the source and sink signals of the exemplary switching converter circuit 1024 are five volts above and five volts below, respectively, the audio frequency output signal at all times.

Referring now to FIG. 24C, the construction and operation of the exemplary LVHC amplifier circuit 1028 will now be explained. Indicated at 1072 in FIG. 24C is the audio input terminal described above at which a preamplified audio frequency signal is present. The positive and negative transistors 1068 and 1070 discussed briefly above are also shown in FIG. 8. Transistors 1164 and 1166 form a first differential amplifier 1168, while transistors 1170 and 1172 form a second differential amplifier 1174.

The outputs of the first and second differential amplifiers 1168 and 1174 drive transistors 1176 and 1178 which in turn drive the positive and negative transistors 1068 and 1070.

A bias circuit 1180 sets a constant voltage between the gates of the positive and negative transistors 1068 and 1070, thereby controlling the biasing or quiescent current thereof.

As discussed briefly above, the drains of the transistors 1068 and 1070 are connected to the source and sink supply signals, respectively. As the source and sink signals track the audio frequency output signal over its entire range, they can both be maintained approximately 10 volts apart at all times. Accordingly, the voltage drop across any component within the LVHC amplifer 1028 is not more than 10 volts, and in most cases is less than 10 volts. Accordingly, all of the components 1068, 1070, and 1164–1180 in this amplifier 1028 may be low voltage components.

1. Twelfth Embodiment

Figure 14:
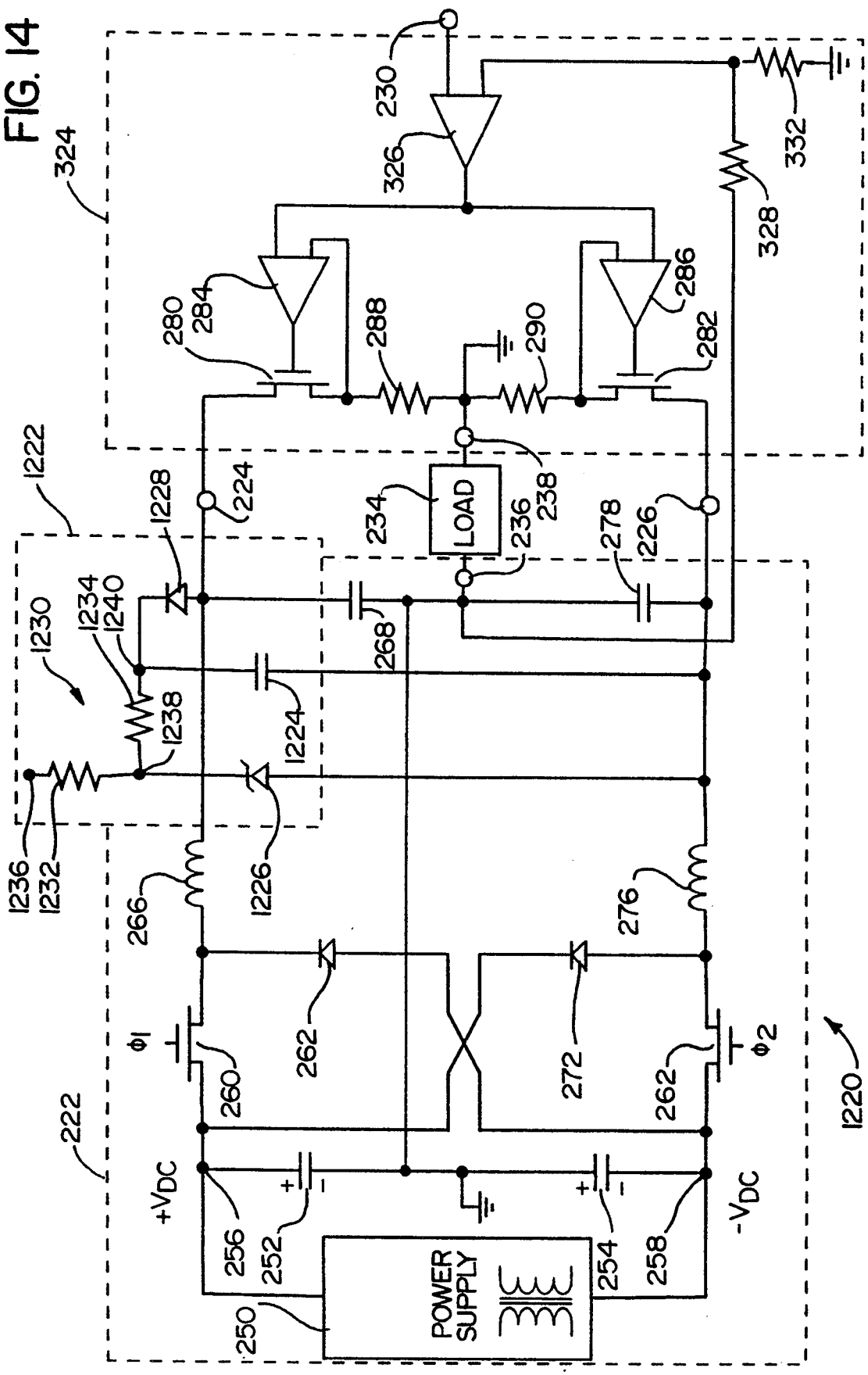
FIG. 14 depicts a twelfth embodiment of the present invent ion.

Referring now to FIG. 14, a twelfth embodiment of the present invention will now be explained. Depicted in FIG. 14 is an amplifier circuit 1220 is another exemplary amplifier constructed in accordance with, and embodying, the present invention. The amplifier 1220 is a detailed implementation of the basic amplifier configuration depicted in FIG. 4 above. This amplifier 1220 is constructed and operates in the same basic manner as the amplifier 322 described above with reference to FIG. 12. Circuit elements in the amplifier 1220 that are the same as those employed in the amplifier 322 will be identified in FIG. 14 by the reference characters used in FIG. 12 and will not be discussed in detail again below.

The amplifier 1220 comprises a discharge circuit 1222 to eliminate floating of the source and sink supply voltages. The discharge circuit comprises the locking capacitor 1224, a zener diode 1226, a diode 1228, a voltage divider circuit 1230 comprising resistors 1232 and 1234, and voltage source 1236. The voltage source 1236 is always greater than the source supply signal.

The resistor 1232 is connected between the voltage source 1236 and a first node 1238, while the resistor 1234 is connected between the first node 1238 and a second node 1240. The Zener diode 1226 is connected between the first node 1238 and the sink supply terminal 226 to maintain a constant voltage greater than twice the offset value at the first node 123. So configured, the zener diode 1226 and voltage divider circuit 1230 generate a constant voltage relative to the sink supply signal at the second node 1240. This constant voltage is set by the characteristics of the Zener diode 1226 and the resistor 1234 at slightly greater than twice the offset voltage; in the exemplary circuit 1220, the offset voltage is five volts and the voltage at the second node 1240 is always approximately eleven volts above the sink supply signal.

The diode 1228 is connected between the source supply terminal 224 and the second node 1240, while the locking capacitor 1224 is connected between the sink supply terminal 226 and the second node 1240.

As long as the difference between the source and sink supply signals is less than than the eleven volts set by the Zener diode 1226 and the voltage divider 1230, current will not flow through the locking capacitor 1224. If the difference between the source and sink supply signals exceeds eleven volts, however, the locking capacitor 1224 is allowed to discharge the output capacitors 268 and 278.

Implemented as described above, the discharge circuit 1222 isolates the locking capacitor 1224 from the output capacitors 268 and 278 when floating does not occur. In particular: when the source supply signal floats at least one volt, the source supply capacitor 268 is discharged through the diode 1228 and locking capacitor 1224 to the sink supply terminal 226 to prevent further floating; and when the sink supply signal floats at least one volt, the sink supply capacitor 278 is discharged through the locking capacitor 1224 and diode 1228 to the source supply terminal 224 to prevent further floating of the sink supply signal.

IV. CONCLUSION

From the forgoing, it should be clear that the present invention may be embodied in forms other than that described above.

For example, with of the embodiment shown in FIGS. 8–10 and 15, the power supply 222 can be converted to a rail-to-ground tracking power supply by connecting the rectifier reference points to ground rather than cross-coupled as shown in those Figures. In this case, the control circuitry would generate the signals $\phi_1$ and $\phi_2$ such that the source and sink supply voltages are do not cross zero when the opposite output device is conducting.

With rail-to-ground tracking power supplies, the error amplifiers, pulse width modulators, and switch drive circuits will be designed to generate the source and sink supply voltages such that: (a) the source supply signal is a first predetermined voltage above the audio frequency output signal when the audio frequency signal is positive; (b) the sink supply signal is a second predetermined audio frequency signal below the audio frequency output signal when the audio frequency signal is negative; (c) the source supply signal is a third predetermined voltage above zero volts when the audio frequency output signal is negative; and (d) the sink supply signal is a fourth predetermined voltage below zero volts below zero volts when the audio frequency output signal is positive.

The first, second, third, and fourth predetermined offset voltages may be equal in certain cases; however, in the preferred case, the first and second predetermined voltages are equal and set to a small value (i.e., 5 volts) while the third and fourth predetermined voltages are set at or very close to zero. The selection and generation of the appropriate predetermined offset voltages are well within the skill of one of ordinary skill in the art and will not be discussed herein in further detail.

The active discharge circuits 294 shown in FIG. 8 and and 342 shown in FIG. 15 will ensure that floating will not occur with a rail-to-ground tracking power supply, yielding the benefits described above with reference to FIG. 2B.

The passive discharge elements and circuits depicted at 302 in FIG. 9 and 312 in FIG. 10 will not prevent floating but will limit floating. This limit on the amount of floating can be important in certain relatively low voltage amplifiers. For example, if the amplifier clips the audio frequency signal at 40 volts, a passive, zener diode based discharge circuit can be used to limit the maximum voltage across the output device at 40 volts. This allows the use of relatively low voltage 50 volt MOSFETs to be used as output devices because the possibility that floating could cause the voltage across such a MOSFET to exceed 50 volts would be eliminated.

Additionally, the choice of which discharge means should be used in a given amplifier should be made based on such factors as: (a) whether the amplifier uses a rail-to-rail, rail-to-ground, or envelope tracking power supply; (b) the voltage level at which the amplifier clips the audio frequency signal; (c) and the cost and complexity of the control circuitry used to develop the tracking supply signals.

From the forgoing, it should be clear that the present invention may be embodied in forms other than those described above. The above-described examples are therefore to be considered in all respects illustrative and not restrictive, the scope of the invention being indicated by the appended claims rather than the foregoing description. All changes that come within the meaning and scope of the claims are intended to be embraced therein.

TABLE A

| REFERENCE CHARACTER | PART DESCRIPTION |
| --- | --- |
| 476–490 | IRF740 |
| 494 | HFA50PA60C |
| 496–510 | IRF740 |
| 530–544 | 22 ohms FP |
| 546 | TC4420 |
| 548 | 3.3K ohms |
| 550 | 10 µF 35V |
| 552–554 | .1 µF 50V |
| 556 | 10 µF 35V |
| 558 | TC4420 |
| 560 | 3.3K ohms |
| 562 | 10 µF 35V |
| 564–566 | .1 µF 50V |
| 568 | 10 µF 35V |
| 570 | 15 µH |
| 572 | .22 µF 250V 20% |
| 574 | .02 ohms 3W 1% |
| 576 | 2.2 ohms 3W 1% |
| 578 | .22 µF 250V 20% |
| 580 | 15 µH |
| 582 | .22 µF 250V 20% |
| 584 | .02 ohms 3W 1% |
| 586 | 2.2 ohms 3W 1% |
| 588 | .22 µF 250V 20% |
| 590–592 | 560 µF 25V 20% |
| 594–596 | MTP50NO5E |
| 598–600 | .02 ohms 3W |
| 602–604 | 22 ohms FP |
| 610 | LT1097CNB |
| 612 | .47 µF 50V 5% |
| 614 | 1M |
| 616 | AR3B 5532 |
| 618 | 16.9K ohms 1% |
| 620 | 604 ohms 1% |
| 622 | 16.9K ohms 1% |
| 624 | 100 |
| 626 | 50V 1000PF 5% |
| 628 | OP-275 |
| 630–636 | 11K ohms 1% |
| 638 | 1% 301 |
| 640 | SSM-2210 |
| 644/646 | SSM-2220 |
| 648 | 11K ohms 1% |
| 650 | OP-275 |
| 652 | 2N5087 |
| 654–656 | 357 ohms 1% |
| 658 | 100K ohms |
| 660–662 | OP-275 |
| 664 | 50V 1000PF 5% |
| 666 | 1K ohms |
| 668 | 1000PF 50V 5% |
| 670 | 1K ohms |
| 672–674 | 1% 69.8 |
| 676 | 1000 KHz |
| 678–680 | .033 µF 50V |
| 682 | 470 ohms |
| 684 | 1.0M |
| 686–692 | CD4069 |
| 694 | MC14013BCP |
| 696–698 | LM13600AN |
| 700–706 | 30.1K ohms 1% |
| 708–710 | TLO-72 |
| 716–718 | SSM-2139 |
| 724 | 470 ohms |
| 726–728 | 10K ohms |
| 730 | 12.1K ohms |
| 732 | 30.1K ohms |
| 734 | .001 µF |
| 736–738 | 470 ohms |
| 740 | 6.2K ohms |
| 742 | .0027 µF |
| 744–746 | .001 µF |
| 748 | LM319N |
| 749 | 20K ohms |
| 750 | 470 ohms |
| 752 | 100K ohms |
| 754 | 220 ohms |
| 756 | .001 µF |
| 758 | 470 ohms |
| 760–762 | 10K ohms |
| 764 | 12.1K ohms |
| 766 | 30.1K ohms |
| 768 | .001 µF |

TABLE A-continued

| REFERENCE CHARACTER | PART DESCRIPTION |
| --- | --- |
| 770–772 | 470 ohms |
| 774 | 8.2K ohms |
| 776 | .0027 µF |
| 778–780 | .001 µF |
| 782 | TL0072 |
| 784–786 | 10K ohms |
| 788 | LN 319N |
| 790 | 20K ohms |
| 792 | 470 ohms |
| 794 | 100K ohms |
| 796 | 220 ohms |
| 798 | .001 µF |
| 802 | HCPL-2611 |
| 804–806 | 390 ohms 1% |
| 808 | MPS2369A |
| 810 | 1N4148 |
| 814 | HCPL-2611 |
| 816–818 | 390 ohms 1% |
| 820 | MPS2369A |
| 822 | 1N4148 |
| 838, 840 | 3300 µF150V |
| 836 | MB254W |
| 834 | Core: EI - 175 M6 3" Stack Primary: 106 turns AWG20 × 4 Secondary: 168 turns center-tapped AWG20 × 3 |

I claim:

1. An amplifier comprising:
   a. first amplification means for amplifying an input signal to obtain an amplified output signal, the first amplification means having at least one supply terminal;
   b. second amplification means for generating a supply signal and applying this supply signal to the supply terminal of the first amplification means, where
      i. the second amplification means so generates the supply signal that the supply signal is offset from the output signal by a predetermined offset value, and
      ii. the second amplification means comprises at least one output capacitor for filtering out a high frequency component of the supply signal; and
   c. discharge means for discharging the at least one output capacitor to ensure that a difference between the supply signal and the output signal does not exceed the predetermined offset value.

2. An amplifier as recited in claim 1, further comprising power supply means for generating a fixed DC voltage, in which:
   a. the second amplification means comprises
      i. filter means comprising an inductor and the at least one output capacitor,
      ii. first switching means connected between the power supply means and the filter means, the first switching means being controlled by a first control signal, and
      iii. a freewheeling diode connected across the first switching means and the power supply means; and
   b. the discharge means comprises second switching means connected in parallel with the freewheeling diode, the second switching means being controlled by a first inverted control signal, where the first inverted control signal is the inverse of the first control signal.

3. An amplifier as recited in claim 1, further comprising power supply means for generating positive and negative fixed DC voltages at positive and negative power supply terminals, respectively, in which:
   a. the first amplification means comprises first and second supply terminals;
   b. the second amplification means comprises
      i. first and second output capacitors,
      ii. first filter means comprising a first inductor and the first output capacitor,
      iii. second filter means comprising a second inductor and the second output capacitor,
      iv. first switching means connected between the positive terminal and the first filter means, the first switching means being controlled by a first control signal,
      v. second switching means connected between the negative terminal and the second filter means, the second switching means being controlled by a second control signal,
      vi. a first freewheeling diode connected across the first switching means and the power supply means, and
      vii. a second freewheeling diode connected across the second switching means and the power supply means; and
   b. the discharge means comprises
      i. third switching means connected in parallel with the first freewheeling diode, the third switching means being controlled by a first inverted control signal, where the first inverted control signal is the inverse of the first control signal, and
      ii. fourth switching means connected in parallel with the second freewheeling diode, the fourth switching means being controlled by a second inverted control signal, where the second inverted control signal is the inverse of the second control signal.

4. An amplifier as recited in claim 1, in which:
   a. the first amplification means comprises first and second supply terminals;
   b. the second amplification means comprises
      i. power supply means having positive and negative terminals for generating positive and negative fixed DC voltages at the positive and negative power supply terminals,
      ii. first and second rectifier circuits having first and second rectifier input terminals connected to the positive and negative power supply terminals, first and second rectifier output terminals connected to the first and second supply terminals, and first and second rectifier reference points, respectively, where the first rectifier reference point is connected to the negative power supply terminal and the second rectifier reference point is connected to the positive power supply terminal; and
   b. the discharge means comprises a locking capacitor connected between the first and second supply terminals.

5. An amplifier as recited in claim 4, in which a value of the locking capacitor is at least ten times a value of the output capacitor.

6. An amplifier as recited in claim 4, in which a value of the locking capacitor is at least one hundred times a value of the output capacitor.

7. An amplifier as recited in claim 1, further comprising power supply means for generating positive and negative fixed DC voltages at positive and negative power supply terminals, respectively, in which:
  a. the first amplification means comprises first and second supply terminals;
  b. the second amplification means comprises first and second rectifier circuits having first and second rectifier input terminals connected to the positive and negative power supply terminals, first and second rectifier output terminals connected to the first and second supply terminals, and first and second rectifier reference points, respectively, where the first rectifier reference point is connected to the negative power supply terminal and the second rectifier reference point is connected to the positive power supply terminal; and
  b. the discharge means comprises a Zener diode connected between the first and second supply terminals.

8. An amplifier as recited in claim 1, further comprising power supply means for generating positive and negative fixed DC voltages at positive and negative power supply terminals, respectively, in which:
  a. the first amplification means comprises first and second supply terminals and an output terminal at which the amplified output signal is present;
  b. the second amplification means comprises first and second rectifier circuits having first and second input terminals connected to the positive and negative power supply terminals, first and second output terminals connected to the first and second supply terminals, and first and second rectifier reference points, respectively, where the first rectifier reference point is connected to the negative power supply terminal and the second rectifier reference point is connected to the positive power supply terminal; and
  b. the discharge means comprises a first Zener diode connected between the first supply terminal and the output terminal and a second Zener diode connected between the second supply terminal and the output terminal.

9. An amplifier as recited in claim 1, in which:
  a. the first amplification means comprises means for setting a bias current thereof; and
  b. the discharge means comprises means for controlling the means for setting the bias current to increase the bias current and thereby discharge the at least one output capacitor when the difference between the supply signal and the output signal is likely to exceed the predetermined offset value.

10. An amplifier as recited in claim 1, further comprising power supply means for generating positive and negative fixed DC voltages at positive and negative power supply terminals, respectively, in which:
  a. the first amplification means comprises first and second supply terminals;
  b. the second amplification means generates a first supply voltage having a positive maximum value and a second supply signal having a negative maximum value; and
  b. the positive fixed DC voltage is at least fifty percent greater than the positive maximum value and the negative fixed DC voltage is at least fifty percent less than the negative maximum value.

11. An amplifier as recited in claim 1, further comprising power supply means for generating positive and negative fixed DC voltages at positive and negative power supply terminals, respectively, the power supply means further having a center tap, in which:
  a. the first amplification means comprises first and second supply terminals; and
  b. the second amplification means comprises
    i. first and second output capacitors,
    ii. first filter means comprising a first inductor and the first output capacitor,
    iii. second filter means comprising a second inductor and the second output capacitor,
    iv. first switching means connected between the positive terminal and the first filter means, the first switching means being controlled by a first control signal,
    v. second switching means connected between the negative terminal and the second filter means, the second switching means being controlled by a second control signal,
    vi. a first freewheeling diode connected across the first switching means and to the center tap of the power supply means, and
    vii. a second freewheeling diode connected across the second switching means and to the center tap of the power supply means.

12. An amplifier as recited in claim 11, in which the discharge means comprises:
  a. third switching means connected in parallel with the first freewheeling diode, the third switching means being controlled by a first inverted control signal, where the first inverted control signal is the inverse of the first control signal; and
  b. fourth switching means connected in parallel with the second freewheeling diode, the fourth switching means being controlled by a second inverted control signal, where the second inverted control signal is the inverse of the second control signal.

13. An amplifier as recited in claim 11, in which the discharge means comprises a first Zener diode connected between the first supply terminal and ground and a second Zener diode connected between the second supply terminal and ground.

14. An amplifier as recited in claim 11, in which the discharge means comprises a Zener diode connected between the first supply terminal and the second supply terminal.

15. An audio frequency amplifier as recited in claim 1, in which a clipping level is defined as a maximum magnitude that the amplified output signal can reach without clipping, where the first amplification means comprises at least one component that is voltage rated at no more than the clipping level.

16. An audio frequency amplifier as recited in claim 1, in which a clipping level is defined as a maximum magnitude that the amplified output signal can reach without clipping, where the first amplification means comprises at least one component that is voltage rated at no more than fifty percent of the clipping level.

17. An audio frequency amplifier as recited in claim 1, in which a clipping level is defined as a maximum magnitude that the amplified output signal can reach without clipping, where the first amplification means comprises at least one component that is voltage rated at no more than twenty five percent of the clipping level.

18. An audio frequency amplifier for amplifying an audio frequency signal to obtain an amplified audio frequency signal and delivering the amplified audio frequency signal to a load, comprising:

a. an input terminal, the audio frequency signal being applied to the input terminal;
b. an output terminal;
c. a return terminal, the load being connected between the output and return terminals;
d. first amplification means for generating the amplified output signal, where the first amplification means has source and sink supply terminals;
e. second amplification means for generating tracking source and sink supply signals at the source and sink terminals of the first amplification means, where
 i. the source and sink signals source current to and sink current from, respectively, the first amplification means, and
 ii. the second amplification means comprises source and sink output capacitors for filtering out high frequency components of the source and sink supply signals; and
f. discharge means for discharging the source output capacitor to ensure that the source supply signal tracks the audio frequency signal and discharging the sink output capacitor to ensure that the sink supply signal tracks the audio frequency signal.

19. An audio frequency amplifier as recited in claim 18, in which:
a. the input terminal is directly connected to the first amplification means such that the first amplification means generates the amplified output signal directly from the audio frequency input signal;
b. the output terminal is directly connected to the first amplification means and is grounded; and
c. the first and second output capacitors are connected together at the return terminal.

20. An audio frequency amplifier as recited in claim 18, in which:
a. the input terminal is connected to the first amplification means through a coupling means for electrically isolating the input terminal from the first amplification means;
b. the output terminal is directly connected to the first amplification means; and
c. the return terminal is connected to ground.

21. An audio frequency amplifier as recited in claim 18, further comprising preamplification means connected to the input terminal for generating a high voltage, low current preamplified audio frequency signal from the audio frequency signal, in which:
a. the first amplification means generates the amplified output signal from the preamplified audio frequency signal;
b. the output terminal is directly connected to the first amplification means; and p1 c. the return terminal is connected to ground.

22. An amplifier comprising:
a. first amplification means for amplifying an input signal to obtain an amplified output signal, the first amplification means having first and second supply terminals;
b. power supply means for generating first and second supply signals and applying the first and second supply signals to the first and second supply terminals of the first amplification means, where
 i. the power supply means so generates the first supply signal that the first supply signal is above the output signal by a first predetermined offset value,
 ii. the power supply means so generates the second supply signal that the second supply signal is below the output signal by a second predetermined offset value, and
 iii. the power supply means comprises first and second output capacitors for filtering out high frequency components of the first and second supply signals; and
c. discharge means for discharging the first and second output capacitors to ensure that a difference between the first and second supply signals does not exceed a sum of the first and second predetermined offset values.

23. An amplifier as recite in claim 22, in which the discharge means comprises a locking capacitor connected between the first and second supply terminals.

24. An amplifier as recited in claim 23, in which a value of the locking capacitor is at least ten times a value of the output capacitor.

25. An amplifier as recited in claim 23, in which a value of the locking capacitor is at least one hundred times a value of the output capacitor.

26. An amplifier as recite in claim 22, in which the discharge means comprises a Zener diode connected between the first and second supply terminals.

27. An amplifier as recite in claim 22, in which the discharge means comprises a first Zener diode connected between the first supply terminal and the output terminal and a second Zener diode connected between the second supply terminal and the output terminal.

28. An amplifier as recited in claim 22, in which:
a. the first amplification means comprises means for setting a bias current thereof; and
b. the discharge means comprises means for controlling the means for setting the bias current to increase the bias current and thereby discharge the at least one output capacitor when the difference between the supply signal and the output signal is likely to exceed the predetermined offset value.

29. An amplifier as recited in claim 22, in which:
a. the power supply means comprises first and second switches driven by first and second control signals, respectively; and
b. the discharge means comprises
 i. a third switch controlled by a first inverted control signal to discharge the first output capacitor, where the first inverted control signal is the inverse of the first control signal; and
 ii. a fourth switch controlled by a second inverted control signal to discharge the second output capacitor, where the second inverted control signal is the inverse of the second control signal.

30. An amplifier as recited in claim 22, further comprising first control means for generating a first pulse-width modulated control signal based on the first supply signal and the amplified output signal and second control means for generating a second pulse-width modulated control signal based on the second supply signal and the amplified output signal, in which the power supply means comprises first and second switch mode converters controlled by the first and second pulse-width modulated signals to generate the source and sink supply signals such that these supply signals track the amplified output signal.

31. An amplifier as recited in claim 30, further comprising comprising means for generating first and second error signals, where a. the first error signal is indicative of a difference between the amplified output signal and the source supply signal, in which the first control signal comprises a series of pulses the widths of which are increased and decreased according to the first error signal to maintain the difference between the amplified output signal and the source supply signal at a substantially constant first predetermined offset value; and b. the second error signal is indicative of a difference between the amplified output signal and the sink supply signal, in which the second control signal comprises a series of pulses the widths of which are increased and decreased according to the second error signal to maintain the difference between the amplified output signal and the sink supply signal at a substantially constant second predetermined offset value.

32. An amplifier as recited in claim 22, in which the first amplification means comprises first and second MOSFETs arranged in a push-pull configuration.

33. An amplifier as recited in claim 22, in which the power supply means comprises a first group of MOSFETs and a second group of MOSFETs, where the MOSFETs in the first group are arranged in parallel and operated as a switching portion of a first switch mode converter and the MOSFETs in the second group are arranged in parallel and operated as a switching portion of a second switch mode converter.

34. An amplifier as recited in claim 33, in which the first amplification means comprises first and second MOSFETs arranged in a push-pull configuration.

35. An amplifier as recited in claim 22, in which the first amplifier means comprises at least one element having a maximum voltage rating that exceeds the sum of the first and second predetermined offset values by less than fifty percent of the sum of the first and second predetermined offset values.

36. An amplifier as recited in claim 22, further comprising control means for generating first and second control signals based upon which the power supply means generates the first and second supply signals, where all voltages within the control means are referenced to the amplified output signal.

37. An amplifier as recited in claim 22, further comprising control means for generating first and second control signals based upon which the power supply means generates the first and second supply signals, where;

a. the first control signal is generated based on a voltage across the first output capacitor; and b. the second control signal is generated based on a voltage across the second output capacitor.

38. An amplifier as recited in claim 37, in which:

a. the first control signal is generated further based on a current through the first output capacitor; and b. the second control signal is generated further based on a current through the second output capacitor.

39. An amplifier as recited in claim 38, in which the control means comprises:

a. a first portion having a first voltage error amplifier, a first current error amplifier, and a first comparator, where i. the first voltage error amplifier generates a first error signal based on a difference between the amplified output signal and the first supply signal, ii. the first current error amplifier generates a second error signal based on the first error signal and a voltage indicative of the current through the first output capacitor, and iii. the comparator generates the first control signal based on a comparison of the second error signal and a first predetermined voltage waveform; and b. a second portion having a second voltage error amplifier, a second current error amplifier, and a second comparator, where i. the second voltage error amplifier generates a third error signal based on a difference between the amplified output signal and the second supply signal, ii. the second current error amplifier generates a fourth error signal based on the third error signal and a voltage indicative of the current through the second output capacitor, and iii. the comparator generates the second control signal based on a comparison of the fourth error signal and a second predetermined voltage waveform.

40. An audio frequency amplifier as recited in claim 22, in which a clipping level is designed as the magnitude of the maximum and minimum that the amplified output signal can swing without clipping, where the first amplification means comprises at least one component that is voltage rated at no more than the clipping level.

41. An audio frequency amplifier as recited in claim 22, in which a clipping level is designed as the magnitude of the maximum and minimum that the amplified output signal can swing without clipping, where the first amplification means comprises at least one component that is voltage rated at no more than fifty percent of the clipping level.

42. An audio frequency amplifier as recited in claim 22, in which a clipping level is designed as the magnitude of the maximum and minimum that the amplified output signal can swing without clipping, where the first amplification means comprises at least one component that is voltage rated at no more than twenty five percent of the clipping level.

43. An amplifier comprising:

a. first amplification means for amplifying an input signal to obtain an amplified output signal, the first amplification means having first and second supply terminals;

b. power supply means for generating first and second supply signals and applying the first and second supply signals to the first and second supply terminals of the first amplification means, where i. the power supply means so generates the first supply signal that the first supply signal is the greater of (A) a first predetermined offset value or (B) the output signal plus a second predetermined offset value, ii. the power supply means so generates the second supply signal that the second supply signal is the lesser of (A) a third predetermined offset value or (B) the output signal plus a fourth predetermined offset value, and iii. the power supply means comprises first and second output capacitors for filtering out high frequency components of the first and second supply signals; and c. discharge means for discharging the first and second output capacitors to ensure that i. a difference between the first supply signal and the output signal does not exceed the second predetermined offset value when a polarity of the output signal is positive, and i. a difference between the second supply signal and the output signal does not exceed the fourth predetermined offset value when a polarity of the output signal is negative.

44. An amplifier comprising:
a. first amplification means for amplifying an input signal to obtain an amplified output signal, the first amplification means having first and second supply terminals;
b. power supply means for generating first and second supply signals and applying the first and second supply signals to the first and second supply terminals of the first amplification means, where
   i. the power supply means generates first and second supply signals of equal magnitude, the magnitude of the first and second supply signals being the sum of a magnitude of the output signal and a predetermined offset value,
   ii. the power supply means comprises first and second output capacitors for filtering out high frequency components of the first and second supply signals; and
c. discharge means for discharging the first and second output capacitors to ensure that
   i. a difference between the first supply signal and the output signal does not exceed the predetermined offset value when a polarity of the output signal is positive, and
   ii. a difference between the second supply signal and the output signal does not exceed the predetermined offset value when the polarity of the output signal is negative.

45. An amplifier comprising:
a. power supply means for generating positive and negative fixed DC voltages at positive and negative power supply terminals, respectively;
b. first amplification means for amplifying an input signal to obtain an amplified output signal, the first amplification means having first and second supply terminals;
c. second amplification means for generating first and second supply signals and applying the first and second supply signals to the first and second supply terminals of the first amplification means, where the first and second supply signals are each offset from the output signal by a predetermined offset value, the second amplification means comprising:
   i. first filter means comprising a first inductor and a first output capacitor,
   ii. second filter means comprising a second inductor and a second output capacitor,
   iii. first switching means connected between the positive power supply terminal and the first filter means, the first switching means being controlled by a first control signal,
   iv. second switching means connected between the negative power supply terminal and the second filter means, the second switching means being controlled by a second control signal,
   v. a first freewheeling diode connected between an output of the first switching means and the negative power supply terminal of the power supply means, and
   vi. a second freewheeling diode connected between an output of the second switching means and the positive power supply terminal of the power supply means; and
d. discharge means for discharging the first and second output capacitors to ensure that a difference between the first and second supply signals and the output signal does not exceed the predetermined offset value.

46. An amplifier as recited in claim 45, in which the discharge means comprises:
a. third switching means connected in parallel with the first freewheeling diode, the third switching means being controlled by a first inverted control signal, where the first inverted control signal is the inverse of the first control signal; and
b. fourth switching means connected in parallel with the second freewheeling diode, the fourth switching means being controlled by a second inverted control signal, where the second inverted control signal is the inverse of the second control signal.

47. An amplifier as recited in claim 45, in which the discharge means comprises a first Zener diode connected between the first supply terminal and ground and a second Zener diode connected between the second supply terminal and ground.

48. An amplifier as recited in claim 45, in which the discharge means comprises a Zener diode connected between the first supply terminal and the second supply terminal.

49. An amplifier as recited in claim 45, in which the discharge means comprises a locking capacitor connected between the first supply terminal and the second supply terminal.

50. An amplifier as recited in claim 49, in which a value of the locking capacitor is at least ten times that of the first and second output capacitors.

* * * * *